US011428827B2

(12) United States Patent
Ushikura et al.

(10) Patent No.: US 11,428,827 B2
(45) Date of Patent: Aug. 30, 2022

(54) RADIATION DETECTOR, RADIOGRAPHIC IMAGING APPARATUS, AND MANUFACTURING METHOD

(71) Applicant: FUJIFILM CORPORATION, Tokyo (JP)

(72) Inventors: Shinichi Ushikura, Kanagawa (JP); Munetaka Kato, Kanagawa (JP); Keiichi Akamatsu, Kanagawa (JP); Haruyasu Nakatsugawa, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 0 days.

(21) Appl. No.: 17/320,241

(22) Filed: May 14, 2021

(65) Prior Publication Data

US 2021/0333421 A1 Oct. 28, 2021

Related U.S. Application Data

(63) Continuation of application No. PCT/JP2019/045640, filed on Nov. 21, 2019.

(30) Foreign Application Priority Data

Nov. 22, 2018 (JP) .............. JP2018-219700
Feb. 8, 2019 (JP) .............. JP2019-022127

(51) Int. Cl.
*H01L 31/115* (2006.01)
*G01T 1/29* (2006.01)
*G01T 1/161* (2006.01)

(52) U.S. Cl.
CPC .......... *G01T 1/2978* (2013.01); *G01T 1/1612* (2013.01); *H01L 31/115* (2013.01)

(58) Field of Classification Search
CPC ....... G01T 1/2978; G01T 1/1612; G01T 1/20; H01L 31/115; H01L 31/02322; H01L 27/14658
See application file for complete search history.

(56) References Cited

U.S. PATENT DOCUMENTS

2015/0316660 A1  11/2015  Arimoto et al.
2016/0027847 A1  1/2016  Liu
(Continued)

FOREIGN PATENT DOCUMENTS

JP  2009-133837 A  6/2009
JP  2012-220659 A  11/2012
(Continued)

OTHER PUBLICATIONS

International Search Report issued in International Application No. PCT/JP2019/045640 dated Mar. 3, 2020.
(Continued)

*Primary Examiner* — David P Porta
*Assistant Examiner* — Mamadou Faye
(74) *Attorney, Agent, or Firm* — Solaris Intellectual Property Group, PLLC

(57) ABSTRACT

Provided are a radiation detector, a radiographic imaging apparatus, and a manufacturing method that include a TFT substrate in which a plurality of pixels that accumulate electric charges generated depending on light converted from radiation are formed in a pixel region of a first surface of a flexible base material and a terminal region of the first surface is provided with a terminal for electrically connecting a flexible cable; a conversion layer that is provided outside the terminal region on the first surface of the base material to convert the radiation into light; a first reinforcing substrate that is provided on a surface of the conversion layer opposite to a surface on a TFT substrate side and has
(Continued)

a higher stiffness than the base material; and a second reinforcing substrate that is provided on a second surface of the base material opposite to the first surface to cover a surface larger than the first reinforcing substrate, and that are capable of suppressing that a defect occurs in the substrate and have an excellent peeling property in a reworking process.

21 Claims, 25 Drawing Sheets

(56) References Cited

U.S. PATENT DOCUMENTS

2017/0146671 A1* 5/2017 Shigeta .................. G21K 4/00
2018/0313961 A1* 11/2018 Ushikura ............. H01L 27/146

FOREIGN PATENT DOCUMENTS

| JP | 2014-167405 A | 9/2014 |
|----|---------------|--------|
| JP | 2017-529520 A | 10/2017 |
| JP | 2018-036197 A | 3/2018 |
| JP | 2018-179513 A | 11/2018 |
| WO | 2018/173893 A1 | 9/2018 |

OTHER PUBLICATIONS

Written Opinion of the ISA issued in International Application No. PCT/JP2019/045640 dated Mar. 3, 2020.
English language translation of the following: Office action dated Oct. 5, 2021, from the JPO in a Japanese patent application No. 2020-557629 corresponding to the instant patent application.

* cited by examiner

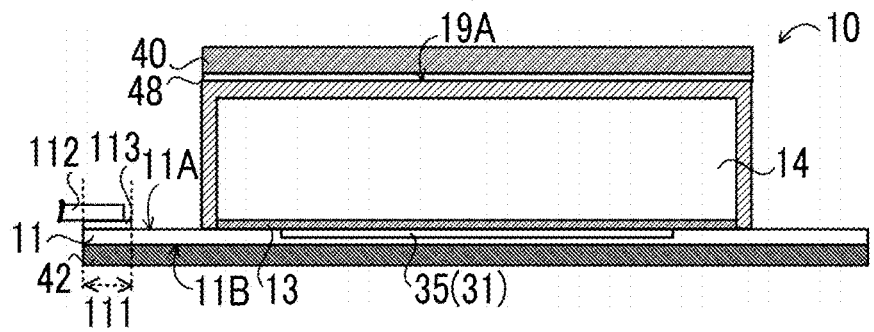
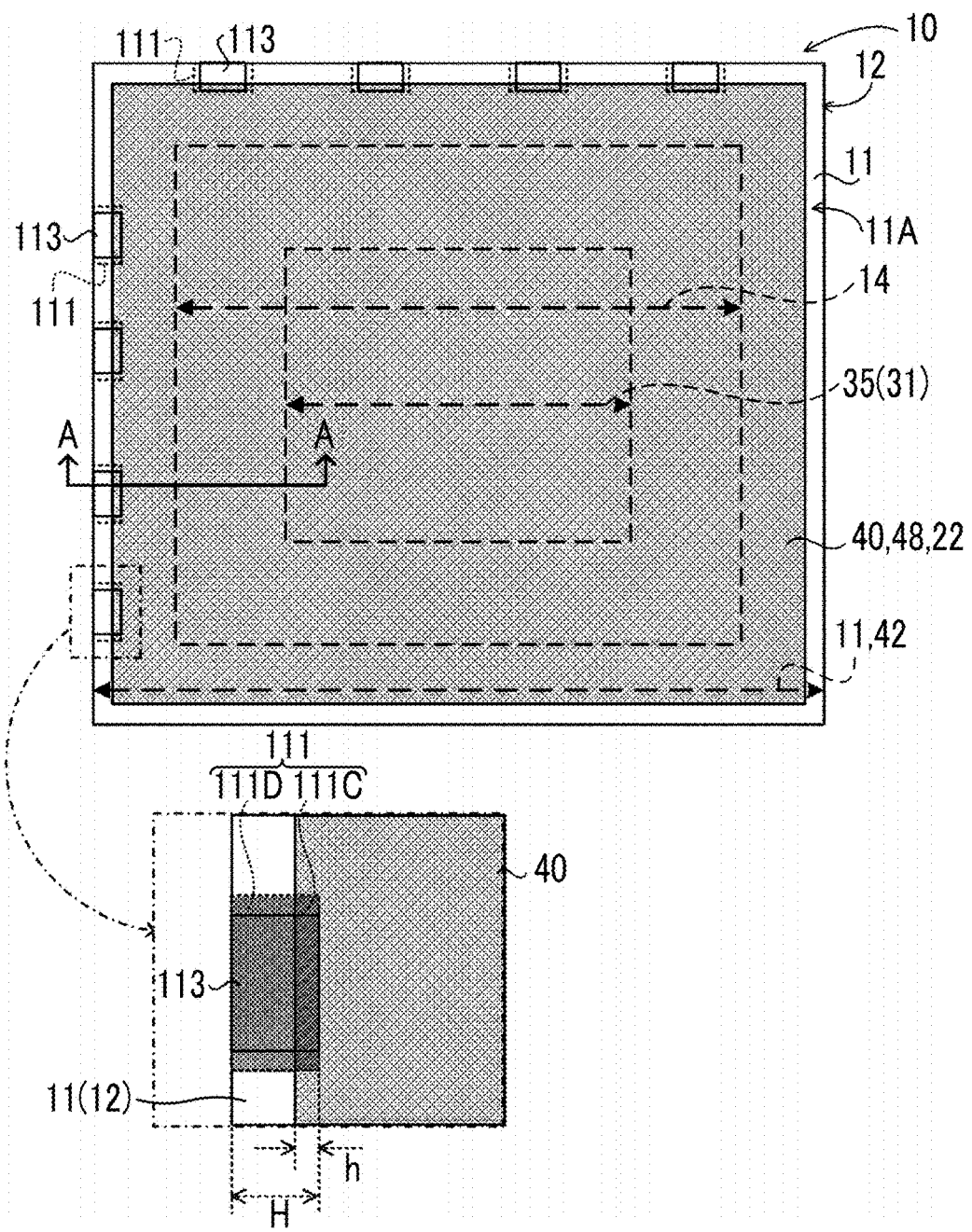

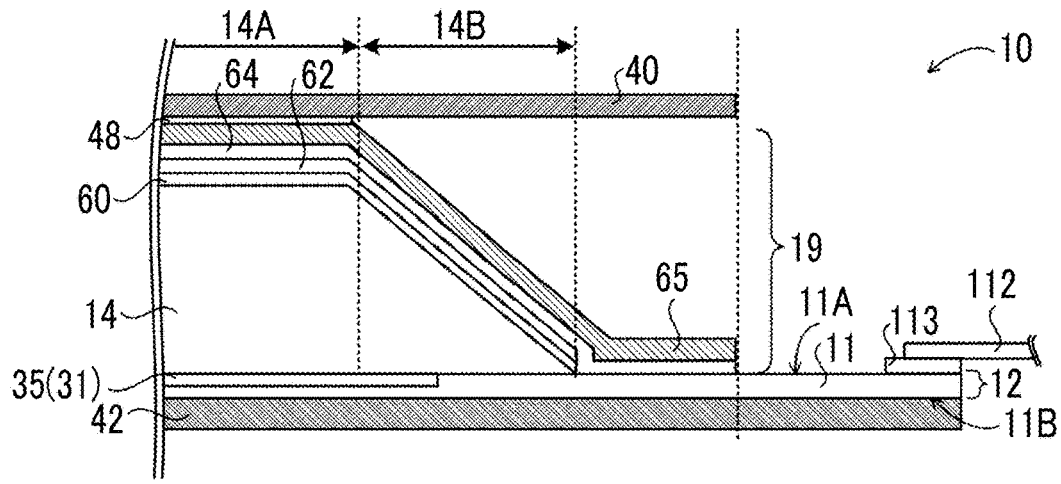
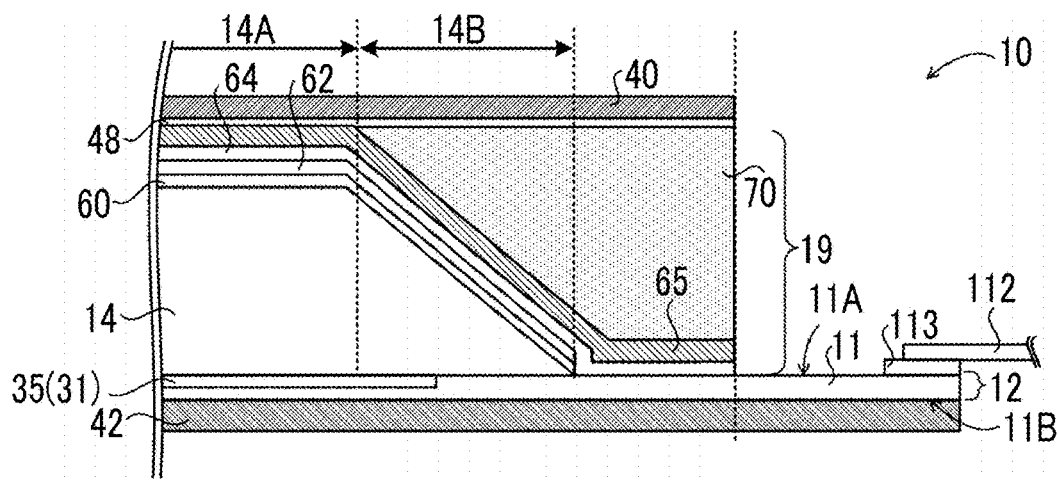
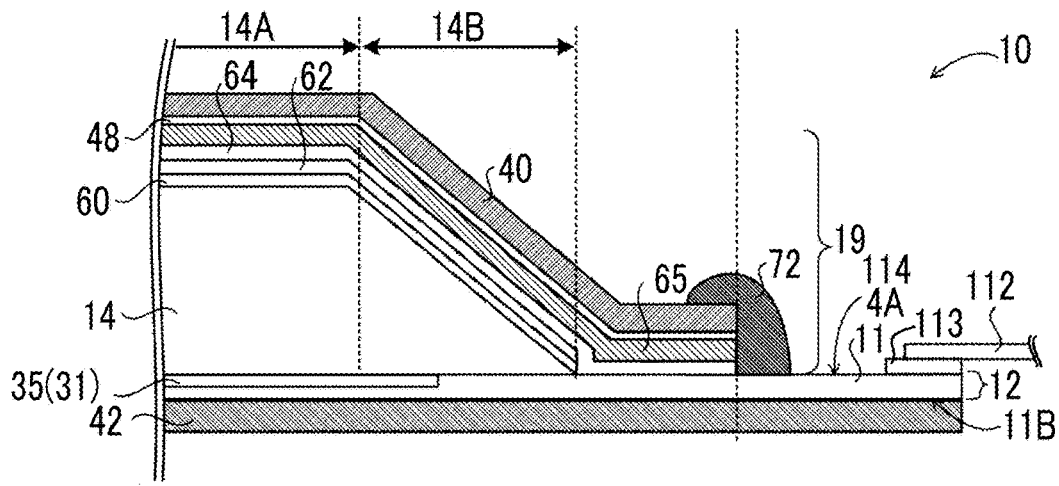

RADIATION DETECTOR, RADIOGRAPHIC IMAGING APPARATUS, AND MANUFACTURING METHOD

CROSS-REFERENCE TO RELATED APPLICATIONS

The present application is a continuation of International Application No. PCT/JP2019/045640, filed on Nov. 21, 2019, which claims priority to Japanese Patent Application No. 2018-219700, filed on Nov. 22, 2018, and Japanese Patent Application No. 2019-022127, filed on Feb. 8, 2019. The above applications are hereby expressly incorporated by reference, in their entireties, into the present application.

BACKGROUND

1. Technical Field

The present disclosure relates to a radiation detector, a radiographic imaging apparatus, and a manufacturing method.

2. Description of the Related Art

In the related art, radiographic imaging apparatuses that perform radiographic imaging for medical diagnosis have been known. A radiation detector for detecting radiation transmitted through a subject and generating a radiographic image is used for such radiographic imaging apparatuses (For example, refer to JP2009-1333837A and JP2012-220569).

As this type of radiation detector, there is one comprising a conversion layer, such as a scintillator, which converts radiation into light, and a substrate in which a plurality of pixels, which accumulate electric charges generated in response to light converted in the conversion layer, are provided in a pixel region of a base material. A flexible base material is known as the base material of the substrate of such a radiation detector, and a cable used for reading out the electric charges accumulated in the pixels is connected to the flexible base material. By using the flexible base material, for example, the weight of the radiographic imaging apparatuses (radiation detector) can be reduced, and a subject may be easily imaged.

SUMMARY

In the middle of a manufacturing process of the radiographic imaging apparatus using the flexible base material, there were concerns that a defect occurs in the substrate of the radiation detector such that the conversion layer may be peeled off from the substrate or the pixels may be damaged due to the influence of deflection of the flexible base material.

Meanwhile, in a technique described in JP2009-133837A, an electromagnetic shield layer that covers a conversion layer is provided on the surface of the conversion layer facing a substrate side. Additionally, in a technique described in JP2012-0220659A, a support body that supports a conversion layer is provided on the surface of the conversion layer facing a substrate side. However, in the techniques described in JP2009-133837A and JP2012-220659A, a case where the base material of the radiation detector is deflected is not taken into consideration, and a case where a defect occurs in the substrate due to the deflection of the base material is also not taken into consideration. For that reason, there is a concern that the defect of the substrate caused by the influence of using the flexible base material cannot be sufficiently suppressed in the electromagnetic shield layer in JP2009-133837A and the support body in JP2012-220659A.

Additionally, there is a case where it is necessary to rework a cable due to poor connection of the cable connected to the base material, or the like. In a state where the reinforcing substrate is provided on the conversion layer side of the substrate, there is a case where the reinforcing substrate is an obstacle when reworking is performed, and a peeling property in a reworking process may deteriorate.

The present disclosure provides a radiation detector, a radiographic imaging apparatus, and a manufacturing method that are capable of suppressing that a defect occurs in the substrate and have an excellent peeling property in the reworking process.

A radiation detector of a first aspect of the present disclosure comprises a substrate in which a plurality of pixels that accumulate electric charges generated in response to light converted from radiation are formed in a pixel region of a first surface of a flexible base material and a terminal region of the first surface is provided with a terminal for electrically connecting a cable; a conversion layer that is provided outside the terminal region on the first surface of the base material to convert the radiation into light; a first reinforcing substrate that is provided on a surface of the conversion layer opposite to a surface on a substrate side and has a higher stiffness than the base material; and a second reinforcing substrate that is provided on a second surface of the base material opposite to the first surface to cover a surface larger than the first reinforcing substrate.

In the radiation detector of a second aspect of the present disclosure based on the radiation detector of the first aspect, the terminal region includes a first region covered with the first reinforcing substrate and a second region not covered with the first reinforcing substrate.

In the radiation detector of a third aspect of the present disclosure based on the radiation detector of the second aspect, the first region is smaller than the second region.

In the radiation detector of a fourth aspect of the present disclosure based on the radiation detector of the second aspect, a length from one end part of the base material on an inner side to the other end part on an outer edge side of the base material in the first region is ¼ or less of a length from one end part on the inner edge side of the base material to the other end part on the outer edge side of the base material in the terminal region.

In the radiation detector of a fifth aspect of the present disclosure based on the radiation detector of the first aspect, the first reinforcing substrate is provided with a cutout part at a position corresponding to the terminal region.

In the radiation detector of a sixth aspect of the present disclosure based on the radiation detector of the first aspect, the second reinforcing substrate has a higher stiffness than the base material.

In the radiation detector according to a seventh aspect of the present disclosure based on the radiation detector according to the first aspect, at least one of the first reinforcing substrate or the second reinforcing substrate is a reinforcing substrate using a material having a bending modulus of elasticity of 1,000 MPa or more and 2,500 MPa or less.

In the radiation detector of an eighth aspect of the present disclosure based on the radiation detector of the first aspect, at least one of the first reinforcing substrate or the second reinforcing substrate contains a material having a yield point.

In the radiation detector of a ninth aspect of the present disclosure based on the radiation detector of the eighth aspect, the material having the yield point is at least one of polycarbonate or polyethylene terephthalate.

In the radiation detector of a tenth aspect of the present disclosure based on the radiation detector of the first aspect, a ratio of a coefficient of thermal expansion of the first reinforcing substrate to a coefficient of thermal expansion of the conversion layer is 0.5 or more and 2 or less.

In the radiation detector of an eleventh aspect of the present disclosure based on the radiation detector of the first aspect, the first reinforcing substrate has a coefficient of thermal expansion of 30 ppm/K or more and 80 ppm/K or less.

In the radiation detector of a twelfth aspect of the present disclosure based on the radiation detector of the first aspect, a size of the second surface of the base material is larger than a size of a surface of the second reinforcing substrate facing the second surface.

In the radiation detector of a thirteenth aspect of the present disclosure based on the radiation detector of the first aspect, the second reinforcing substrate has a plurality of layers laminated in a lamination direction to be laminated on the substrate, and a size of some of the plurality of layers is larger than a size of the second surface.

In the radiation detector of a fourteenth aspect of the present disclosure based on the radiation detector of the first aspect, a size of the second surface of the base material is smaller than a size of a surface of the second reinforcing substrate facing the second surface.

In the radiation detector of a fifteenth aspect of the present disclosure based on the radiation detector of the first aspect, at least a part of an end part of the base material is located outside an end part of the second reinforcing substrate.

The radiation detector of a sixteenth aspect of the present disclosure based the radiation detector of the first aspect further comprises a buffer layer that is provided between the substrate and the conversion layer and buffers a difference between a coefficient of thermal expansion of the conversion layer and a coefficient of thermal expansion of the substrate.

The radiation detector of a seventeenth aspect of the present disclosure is the radiation detector of the first aspect in which the base material satisfies at least one of a heat shrinkage percentage of 0.5% or less at 400° C. or a modulus of elasticity of 1 GPa or more at 500° C., at a thickness of 25 µm.

Additionally, a radiographic imaging apparatus of a eighteenth aspect of the present disclosure comprises the radiation detector according to the first aspect; a control unit that outputs a control signal for reading out the electric charges accumulated in the plurality of pixels; and a circuit unit that is electrically connected to the radiation detector by the cable to read out the electric charges from the plurality of pixels in response to the control signal.

The radiographic imaging apparatus according to a nineteenth aspect of the present disclosure based on the radiographic imaging apparatus according to the eighteenth aspect, further comprising a housing that has an irradiation surface to be irradiated with radiation and houses the radiation detector in a state where the substrate among the substrate and the conversion layer in the radiation detector faces the irradiation surface.

Additionally, a manufacturing method of a twentieth aspect of the present disclosure is a method of manufacturing a radiation detector, the method comprising providing a flexible base material on a support body and forming a substrate in which a plurality of pixels that accumulate electric charges generated in response to light converted from radiation are provided in a pixel region of a first surface of the base material; forming a conversion layer that converts the radiation into light, outside a terminal region of the first surface of the base material; providing a first reinforcing substrate having a higher stiffness than the base material on a surface of the conversion layer opposite to a surface facing a substrate side; peeling off the substrate provided with the conversion layer and the first reinforcing substrate off from the support body; and providing a second reinforcing substrate covering a surface larger than the first reinforcing substrate on a second surface of the substrate peeled off from the support body opposite to the first surface of the base material.

According to the present disclosure, it is possible to suppress that a defect occurs in the substrate, and the peeling property in the reworking process is excellent.

BRIEF DESCRIPTION OF THE DRAWINGS

Exemplary embodiments according to the technique of the present disclosure will be described in detail based on the following figures, wherein:

FIG. 6E is a view illustrating an example of a step following the step illustrated in FIG. 6D.

FIG. 7 is a plan view of an example of a radiation detector of a second embodiment as seen from the side on which a conversion layer is provided.

FIG. 21 is a cross-sectional view illustrating an example of a configuration of a radiation detector according to an embodiment of the disclosed technique.

FIG. 22 is a cross-sectional view illustrating an example of a configuration of a radiation detector according to an embodiment of the disclosed technique.

FIG. 23 is a cross-sectional view illustrating an example of a configuration of a radiation detector according to an embodiment of the disclosed technique.

DETAILED DESCRIPTION

Figure 1:
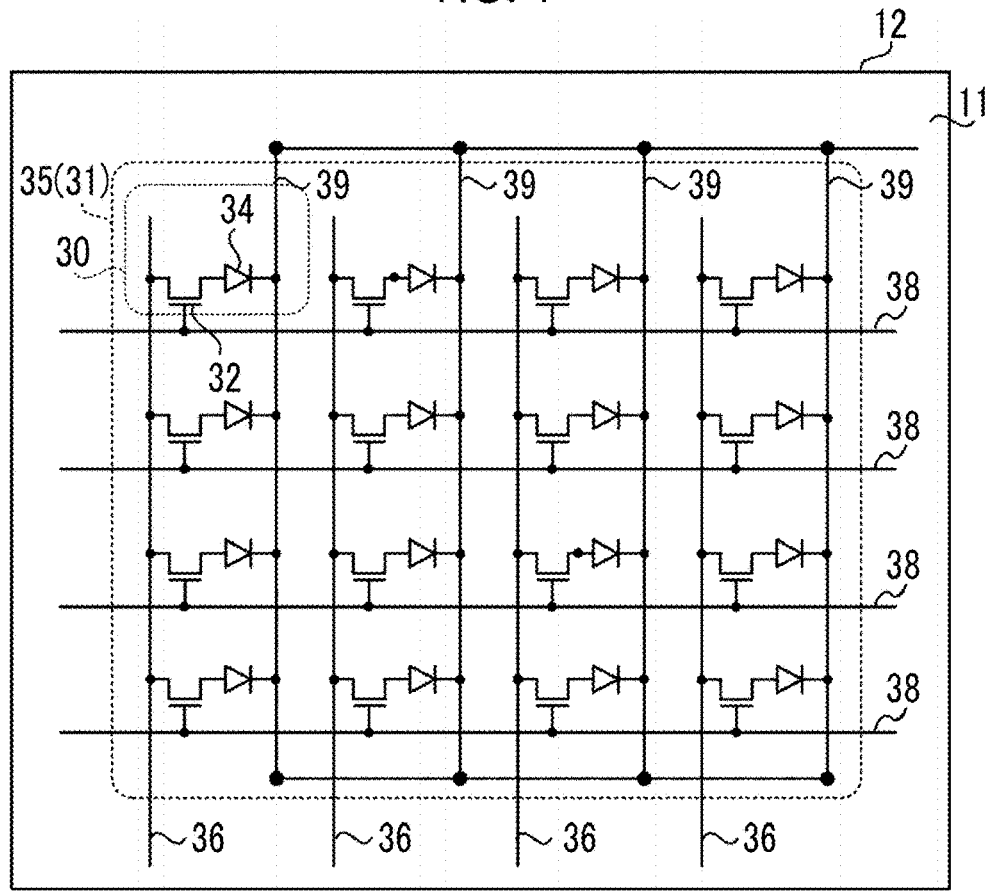
FIG. 1 is a configuration diagram illustrating an example of a configuration of a thin film transistor (TFT) substrate in a radiation detector according to a first embodiment.

Hereinafter, embodiments of the present invention will be described in detail with reference to the drawings. In addition, the present embodiments do not limit the present invention.

First Embodiment

A radiation detector of the present embodiment has a function of detecting radiation transmitted through a subject to output image information representing a radiographic image of the subject. The radiation detector of the present embodiment comprises a thin film transistor (TFT) substrate, and a conversion layer that converts radiation into light (refer to a TFT substrate 12 and a conversion layer 14 of a radiation detector 10 in FIG. 4).

First, an example of the configuration of the TFT substrate 12 in the radiation detector of the present embodiment will be described with reference to FIG. 1. In addition, the TFT substrate 12 of the present embodiment is a substrate in which a pixel array 31 including a plurality of pixels 30 is formed in a pixel region 35 of a base material 11. Therefore, in the following description, the expression "the pixel region 35" is used as the same meaning as "the pixel array 31". The TFT substrate 12 of the present embodiment is an example of a substrate of the disclosed technique.

Each of the pixels 30 includes a sensor unit 34 and a switching element 32. The sensor unit 34 generates and accumulates electric charges in response to the light con- verted by the conversion layer. The switching element 32 reads out the electric charges accumulated in the sensor unit 34. In the present embodiment, as an example, a thin film transistor (TFT) is used as the switching element 32. For that reason, in the following description, the switching element 32 is referred to as a "TFT 32".

The plurality of pixels 30 are two-dimensionally disposed in one direction (a scanning wiring direction corresponding to a transverse direction of FIG. 1, hereinafter referred to as a "row direction"), and an intersection direction (a signal wiring direction corresponding to a longitudinal direction of FIG. 1, hereinafter referred as a "column direction") inter- secting the row direction in the pixel region 35 of the TFT substrate 12. Although an array of the pixels 30 is illustrated in a simplified manner in FIG. 1, for example, 1024×1024 pixels 30 are disposed in the row direction and the column direction.

Additionally, a plurality of scanning wiring lines 38 for controlling switching states (ON and OFF) of the TFTs 32, and a plurality of signal wiring lines 36, which are provided for respective columns of the pixels 30 and from which electric charges accumulated in the sensor units 34 are read out, are provided in a mutually intersecting manner in the radiation detector 10. Each of the plurality of scanning wiring lines 38 is connected to a drive unit 103 (refer to FIG. 5) outside the radiation detector 10 via a flexible cable 112 (refer to FIGS. 3 and 5), and thereby, a control signal, which is output from the drive unit 103 to control the switching state of the TFT 32, flow to each scanning wiring line 38. Additionally, each of the plurality of signal wiring lines 36 is connected to a signal processing unit 104 (refer to FIG. 5) outside the radiation detector 10 via the flexible cable 112 (refer to FIGS. 3 and 5), and thereby, an electric charge read from each pixel 30 is output to the signal processing unit 104.

Additionally, common wiring lines 39 are provided in a wiring direction of the signal wiring lines 36 at the sensor units 34 of the respective pixels 30 in order to apply bias voltages to the respective pixels 30. Bias voltages are applied to the respective pixels 30 from a bias power source by connecting the common wiring lines 39 to the bias power source outside the radiation detector 10 via terminals (not illustrated) provided in the TFT substrate 12.

Figure 2:
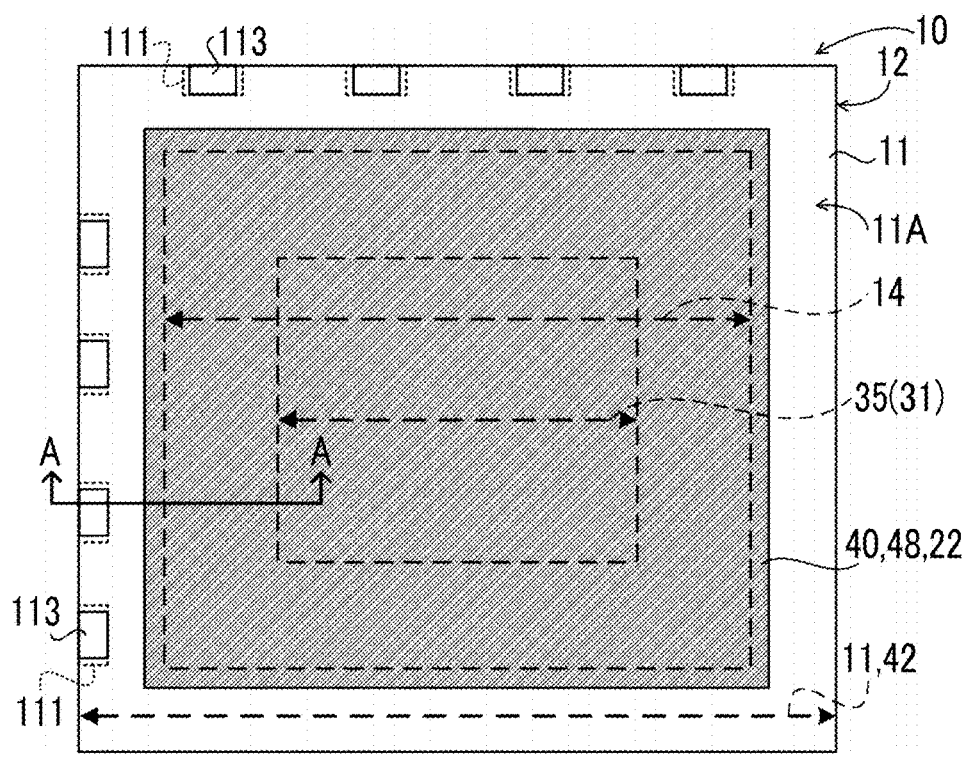
FIG. 2 is a plan view of an example of the radiation detector of the first embodiment as seen from the side on which a conversion layer is provided.
Figure 3:
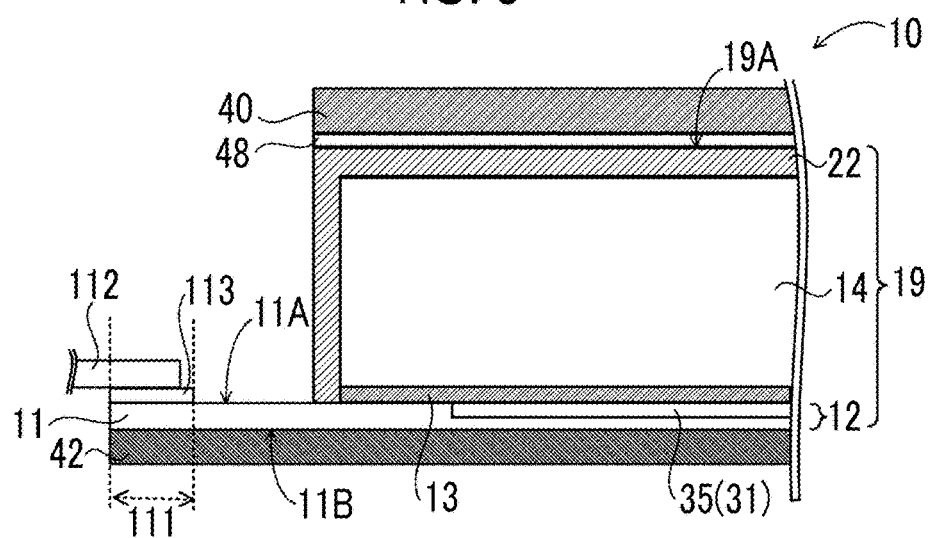
FIG. 3 is a cross-sectional view taken along line A-A of the radiation detector illustrated in FIG. 2.

Moreover, the radiation detector 10 of the present embodiment will be described in detail. FIG. 2 is an example of a plan view of the radiation detector 10 according to the present embodiment as seen from a first surface 11A side of the base material 11. Additionally, FIG. 3 is a cross-sectional view taken along line A-A of the radiation detector 10 in FIG. 2.

The first surface 11A of the base material 11 is provided with a pixel region 35 provided with the above-described pixels 30 and a terminal region 111.

The base material 11 is a resin sheet that has flexibility and includes, for example, a plastic such as a polyimide (PI). The thickness of the base material 11 may be a thickness such that desired flexibility is obtained in response to the hardness of a material, the size of the TFT substrate 12 (the area of the first surface 11A or a second surface 11B), and the like. In a case where a rectangular base material 11 is a single body, an example having flexibility indicates one in which the base material 11 hangs down (is lower than the height of a fixed side) 2 mm or more due to the gravity of the base material 11 resulting from its own weight at a position 10 cm away from the fixed side with one side of the base material 11 fixed. As a specific example in a case where the base material 11 is the resin sheet, the thickness thereof may be 5 µm to 125 µm, and the thickness thereof may be more preferably 20 µm to 50 µm.

In addition, the base material 11 has characteristics capable of withstanding the manufacture of the pixels 30 and has characteristics capable of withstanding the manufacture of amorphous silicon TFT (a-Si TFT) in the present embodiment. As such characteristics of the base material 11, it is preferable that the coefficient of thermal expansion (CTE) at 300° C. to 400° C. is about the same as the coefficient of thermal expansion of amorphous silicon (a-Si) wafer (for example, ±5 ppm/K). Specifically, the coefficient of thermal expansion of the base material 11 at 30° C. to 400° C. is preferably 20 ppm/K or less. Additionally, as the heat shrinkage percentage of the base material 11, it is preferable that the heat shrinkage percentage at 400° C. is 0.5% or less with the thickness being 25 µm. Additionally, it is preferable that the modulus of elasticity of the base material 11 does not have a transition point that general PI has, in a temperature range of 300° C. to 400° C., and the modulus of elasticity at 500° C. is 1 GPa or more.

Figure 4A:
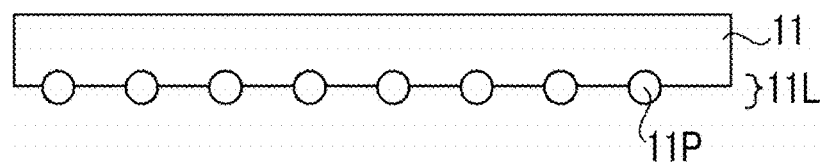
FIG. 4A is a cross-sectional view for explaining an example of a base material.
Figure 4B:
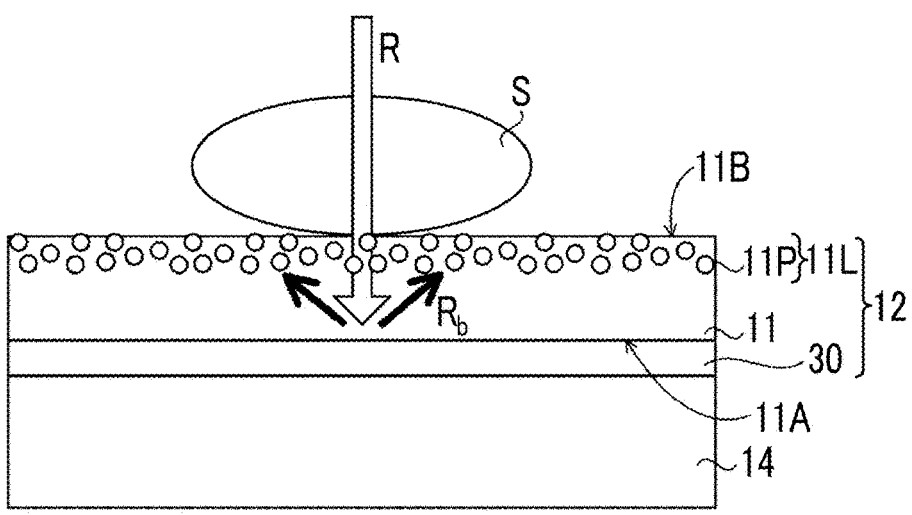
FIG. 4B is an explanatory view for explaining backscattered rays generated in the base material having a fine particle layer due to radiation transmitted through a subject.

Additionally, as illustrated in FIGS. 4A and 4B, it is preferable that the base material 11 of the present embodiment has a fine particle layer 11L containing inorganic fine particles 11P f which the average particle diameter is 0.05 µm or more or 2.5 µm or less. In addition, FIG. 4B illustrates an example in a case where the radiation detector 10 of the present embodiment is applied to an irradiation side sampling (ISS) type radiation detector in which radiation R is radiated from the TFT substrate 12 side.

Figure 4C:
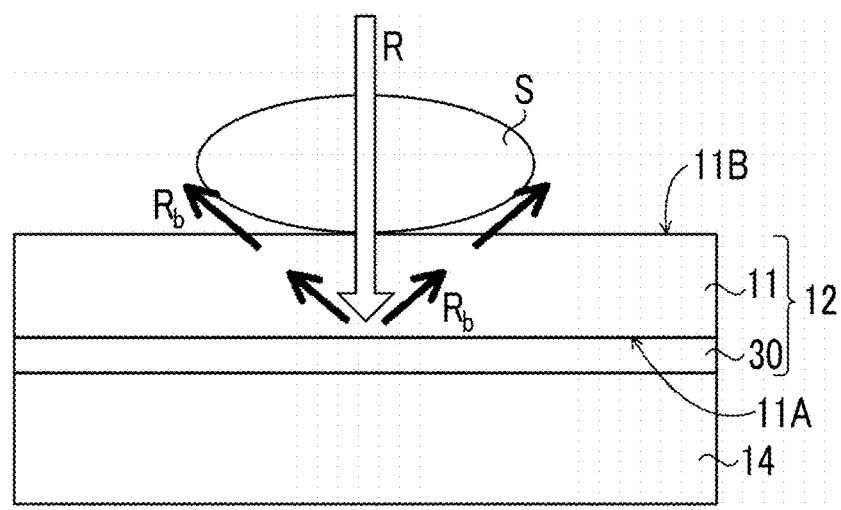
FIG. 4C is an explanatory view for explaining backscattered rays generated in the base material having no fine particle layer due to the radiation transmitted through the subject.

As illustrated in FIGS. 4B and 4C, in the base material 11, backscattered rays Rb are generated by the radiation R transmitted through a subject S. In a case where the base material 11 is made of a resin such as PI, the base material 11 is an organic substance. Therefore, the backscattered rays Rb of atoms such as C, H, O, and N constituting the organic substance and having relatively small atomic numbers increase due to the Compton effect.

As illustrated in FIG. 4B, in a case where the base material 11 has the fine particle layer 11L containing the fine particles 11P that absorb the backscattered rays Rb generated in the base material 11, compared to a case where the base material 11 does not have the fine particle layer 11L (refer to FIG. 4C), the backscattered rays Rb, which are transmitted through the base material 11 and scattered backward, are suppressed, which is preferable.

As such fine particles 11P, an inorganic substance including atoms, which has a small amount of the backscattered rays Rb generated by itself and absorb the backscattered rays Rb while absorbing less radiation R transmitted through the subject S, is preferable. In addition, there is a trade-off relationship between the suppression of the backscattered rays Rb and the transmissivity of the radiation R. From the viewpoint of suppressing backscattered rays Rb, it is preferable that the fine particles 11P contain elements having an atomic number larger than C, H, O, N, and the like constituting the resin of the base material 11. On the other hand, the larger the atomic number, the higher the ability to absorb the backscattered rays Rb. However, when the atomic number exceeds 30, the amount of the radiation R absorbed increases and the dose of the radiation R reaching the conversion layer 14 decreases remarkably, which is not preferable. For that reason, as the fine particles 11P, in the case of a resinous base material 11, it is preferable to use an inorganic substance of which the atomic number is larger than the atoms constituting the organic substance that is the base material 11 and the atomic number is 30 or less. Specific examples of such fine particles 11P include $SiO_2$ that is an oxide of Si having an atomic number of 14, MgO that is an oxide of Mg having an atomic number of 12, $Al_2O_3$ that is an oxide of Al having an atomic number of 13, $TiO_2$ that is an oxide of Ti having an atomic number of 22, and the like.

A specific example of the resin sheet having such characteristics is XENOMAX (registered trademark).

In addition, the above thicknesses in the present embodiment were measured using a micrometer. The coefficient of thermal expansion was measured according to JIS K7197: 1991. In addition, the measurement was performed by cutting out test pieces from a main surface of the base material 11 while changing the angle by 15 degrees, measuring the coefficient of thermal expansion of each of the cut-out test pieces, and setting the highest value as the coefficient of thermal expansion of the base material 11. The coefficient of thermal expansion is measured at intervals of 10° C. between −50° C. and 450° C. in a machine direction (MD) and a transverse direction (TD), and (ppm/° C.) is converted to (ppm/K). For the measurement of the coefficient of thermal expansion, the TMA4000S apparatus made by MAC Science Co., Ltd. is used, sample length is 10 mm, sample width is 2 mm, initial load is 34.5 g/mm$^2$, temperature rising rate is 5° C./min, and the atmosphere is in argon. The modulus of elasticity was measured according to JIS K7171:2016. In addition, the measurement was performed by cutting out test pieces from the main surface of the base material 11 while changing the angle by 15 degrees, performing a tensile test for each of the cut-out test pieces, and setting the highest value as the modulus of elasticity of the base material 11.

In addition, there is a case where irregularities may occur on the surface of the base material 11 due to the fine particles 11P contained in the fine particle layer 11L. There is a case where it is difficult to form the pixels 30 in a state where the irregularities have occurred on the surface of the base material 11 in this way. For that reason, as illustrated in FIG. 4B, it is preferable that the base material 11 has the fine particle layer 11L on the second surface 11B opposite to the first surface 11A on which the pixels 30 are formed. In other words, the base material 11 preferably has the fine particle layer 11L on the second surface 11B opposite to the first surface 11A on which the conversion layer 14 is provided.

Additionally, in order to sufficiently absorb the backscattered rays Rb generated in the base material 11, it is preferable to have the fine particle layer 11L on the surface of the base material 11 close to the subject S. As illustrated in FIG. 4B, in the ISS type radiation detector 10, it is preferable to have the fine particle layer 11L on the second surface 11B.

In this way, in the ISS type radiation detector 10, the base material 11 has the fine particle layer 11L on the second surface 11B, so that the pixels 30 can be accurately formed and the backscattered rays Rb can be effectively suppressed.

In addition, the base material 11 having desired flexibility is not limited to resinous materials such as the resin sheet. For example, the base material 11 may be a glass substrate or the like having a relatively small thickness. As a specific example of a case where the base material 11 is the glass substrate, generally, in a size of about 43 cm on a side, the glass substrate has flexibility as long as the thickness is 0.3 mm or less. Therefore, any desired glass substrate may be used as long as the thickness is 0.3 mm or less.

As illustrated in FIGS. 2 and 3, the conversion layer 14 is provided on the pixel region 35 of the present embodiment. The conversion layer 14 is provided on a partial region of the first surface 11A of the base material 11 including the pixel region 35. In this way, the conversion layer 14 of the present embodiment is not provided on the region of an outer peripheral part on the first surface 11A of the base material 11. In addition, here, the term "on" in the structure of the radiation detector 10 means "on" in a positional relationship with reference to the TFT substrate 12 side. For example, the conversion layer 14 is provided on the TFT substrate 12.

In the present embodiment, a scintillator including CsI (cesium iodide) is used as an example of the conversion layer 14. It is preferable that such a scintillator includes, for example, CsI:Tl (cesium iodide to which thallium is added) or CsI:Na (cesium iodide to which sodium is added) having an emission spectrum of 400 nm to 700 nm at the time of X-ray radiation. In addition, the emission peak wavelength in a visible light region of CsI:Tl is 565 nm.

In the radiation detector 10 of the present embodiment, the conversion layer 14 is directly formed on the TFT substrate 12 as strip-shaped columnar crystals (not illustrated) by vapor-phase deposition methods, such as a vacuum vapor deposition method, a sputtering method, and a chemical vapor deposition (CVD) method. For example, in a case where CsI:Tl is used as the conversion layer 14, a vacuum vapor deposition method is used as a method of forming the conversion layer 14. In the vacuum vapor deposition method, CsI:Tl is heated and gasified by heating means, such as a resistance heating-type crucible in an environment with a vacuum degree of 0.01 Pa to 10 Pa, and CsI:Tl is deposited on the TFT substrate 12 with the temperature of the TFT substrate 12 as the room temperature (20° C.) to 300° C. As the thickness of the conversion layer 14, 100 μm to 800 μm is preferable.

In the present embodiment, as illustrated in FIG. 3 as an example, a buffer layer 13 is provided between the TFT substrate 12 and the conversion layer 14. The buffer layer 13 has a function of buffering a difference between the coefficient of thermal expansion of the conversion layer 14 and the coefficient of thermal expansion of the base material 11. In addition, unlike the radiation detector 10 of the present embodiment, a configuration may be adopted in which the buffer layer 13 is not provided. However, as the difference between the coefficient of thermal expansion of the conversion layer 14 and the coefficient of thermal expansion of the base material 11 is larger, it is preferable to provide the buffer layer 13. For example, in a case where the above XENOMAX (registered trademark) is used for the base material 11, the difference from the coefficient of thermal expansion of the conversion layer 14 is larger than the coefficient of thermal expansion of other materials. Therefore, it is preferable to provide the buffer layer 13 as in the radiation detector 10 illustrated in FIG. 3. As the buffer layer 13, a PI membrane, a parylene (registered trademark) membrane, or the like is used.

The protective layer 22 has a function of protecting the conversion layer 14 from moisture, such as humidity. Examples of the material of the protective layer 22 include organic films, and specifically single films or laminated films made of polyethylene terephthalate (PET), polyphenylene sulfide (PPS), biaxially oriented polypropylene film (OPP), polyethylene naphthalate (PEN), PI, and the like. Additionally, as the protective layer 22, a laminated film of a resin film and a metal film may be used. Examples of the laminated film of the resin film and the metal film include an Alpet (registered trademark) sheet in which aluminum is laminated by causing an aluminum foil to adhere to an insulating sheet (film) such as PET.

A first reinforcing substrate 40 is provided by a pressure sensitive adhesive layer 48 on a first surface 19A, which is the surface, on the conversion layer 14 side, of a laminate 19 in which the TFT substrate 12, the buffer layer 13, the conversion layer 14, and the protective layer 22 are laminated.

The first reinforcing substrate 40 has a higher bending stiffness than the base material 11, and a dimensional change (deformation) due to a force applied in a direction perpendicular to the surface facing the conversion layer 14 is smaller than a dimensional change due to a force applied in a direction perpendicular to the first surface 11A of the base material 11. Additionally, the thickness of the first reinforcing substrate 40 of the present embodiment is larger than the thickness of the base material 11. In addition, the bending stiffness referred to here means the difficulty of bending and that the higher the bending stiffness, the more difficult it is to bend.

Specifically, a material having a bending modulus of elasticity of 150 MPa or more and 2,500 MPa or less is preferably used for the first reinforcing substrate 40 of the present embodiment. A method of measuring the bending modulus of elasticity is based on, for example, JIS K 7171:2016 Standard. From the viewpoint of suppressing the deflection of the base material 11, the first reinforcing substrate 40 preferably has a higher bending stiffness than the base material 11. In addition, in a case where the bending modulus of elasticity is low, the bending stiffness is also low. In order to obtain a desired bending stiffness, the thickness of the first reinforcing substrate 40 should be made large, and the thickness of the entire radiation detector 10 increases. Considering the above-described material of the first reinforcing substrate 40, the thickness of the first reinforcing substrate 40 tends to be relatively large in a case where a bending stiffness exceeding 140,000 Pacm$^4$ is to be obtained. For that reason, in view of obtaining appropriate stiffness and considering the thickness of the entire radiation detector 10, the material used for the first reinforcing substrate 40 preferably has a bending modulus of elasticity of 150 MPa or more and 2,500 MPa or less. Additionally, the bending stiffness of the first reinforcing substrate 40 is preferably 540 Pacm$^4$ or more and 140,000 Pacm$^4$ or less.

Additionally, it is preferable that the coefficient of thermal expansion of the first reinforcing substrate 40 of the present embodiment is closer to the coefficient of thermal expansion of the material of the conversion layer 14. The ratio of the coefficient of thermal expansion of the first reinforcing substrate 40 to the coefficient of thermal expansion of the conversion layer 14 (the coefficient of thermal expansion of the first reinforcing substrate 40/the coefficient of thermal expansion of the conversion layer 14) is preferably 0.5 or more and 2 or less. The coefficient of thermal expansion of such a first reinforcing substrate 40 is preferably 30 ppm/K or more and 80 ppm/K or less. For example, in a case where the conversion layer 14 has CsI:Tl as a material, the coefficient of thermal expansion of the conversion layer 14 is 50 ppm/K. In this case, examples of materials relatively close to the conversion layer 14 include polyvinyl chloride (PVC) having a coefficient of thermal expansion of 60 ppm/K to 80 ppm/K, acrylic having a coefficient of thermal expansion of 70 ppm/K to 80 ppm/K, PET having a coefficient of thermal expansion of 65 ppm/K to 70 ppm/K, polycarbonate (PC) having a coefficient of thermal expansion of 65 ppm/K, Teflon (registered trademark) having a coefficient of thermal expansion of 45 ppm/K to 70 ppm/K, and the like.

Moreover, considering the above-described bending modulus of elasticity, the material of the first reinforcing substrate 40 is more preferably a material containing at least one of PET or PC.

From the viewpoint of elasticity, the first reinforcing substrate 40 preferably contains a material having a yield point. In addition, in the present embodiment, the "yield point" means a phenomenon in which the stress rapidly decreases once in a case where the material is pulled, means that the strain is increased without increasing the stress on a curve representing a relationship between the stress and the strain, and indicates the peak of a stress-strain curve in a case where a tensile strength test is performed on the material. Resins having the yield point generally include resins that are hard and strongly sticky, and resins that are soft and strongly sticky and have medium strength. Examples of the hard and strongly sticky resins include PC and the like. Additionally, examples of the resins that are soft and strongly sticky and have medium strength include polypropylene and the like.

The first reinforcing substrate 40 of the present embodiment is a substrate having plastic as a material. In a case where the plastic used as the material for the first reinforcing substrate is preferably a thermoplastic resin for the above-described reasons, and include at least one of PC, PET, styrol, acrylic, polyacetase, nylon, polypropylene, acrylonitrile butadiene styrene (ABS), engineering plastics, or polyphenylene ether. In addition, the first reinforcing substrate 40 is preferably at least one of polypropylene, ABS, engineering plastics, PET, or polyphenylene ether among these, is more preferably at least one of styrol, acrylics, polyacetase, or nylon, and is even more preferably at least one of PC or PET.

Additionally, as illustrated in FIGS. 2 and 3, in the radiation detector 10 of the present embodiment, a second reinforcing substrate 42 is provided on the second surface 11B of the base material 11. In addition, a pressure sensitive adhesive layer for providing the second reinforcing substrate 42, a protective film having a moistureproof function, or the like may be provided between the second surface 11B of the base material 11 and the second reinforcing substrate 42.

Similar to the first reinforcing substrate 40, the second reinforcing substrate 42 has a higher stiffness than the base material 11, and a dimensional change (deformation) due to a force applied in a direction perpendicular to a surface facing the second surface 11B is smaller than a dimensional change due to the force applied in a direction perpendicular to the first surface 11A in the base material 11. Additionally, the thickness of the second reinforcing substrate 42 of the present embodiment is larger than the thickness of the base material 11 and smaller than the thickness of the first reinforcing substrate 40. For example, in a case where XENOMAX (registered trademark) is used as the base material 11, the thickness of the first reinforcing substrate 40 is preferably about 0.1 mm, and the thickness of the second reinforcing substrate 42 is preferably about 0.2 mm to 0.25 mm.

In addition, the second reinforcing substrate 42 preferably has the same characteristics as the first reinforcing substrate 40. As the material of such a second reinforcing substrate 42 of the present embodiment, the thermoplastic resin is preferable, and the same material as the material of the first reinforcing substrate 40 can be used. However, different materials may be used for the first reinforcing substrate 40 and the second reinforcing substrate 42. In addition, unlike the present embodiment, the characteristics and the like may be made different between the second reinforcing substrate 42 and the first reinforcing substrate 40. For example, the stiffness of the first reinforcing substrate 40 may be lower than the stiffness of the second reinforcing substrate 42 or may be about the same as the stiffness of the base material 11. Even when the stiffness of the second reinforcing substrate 42 is about the same as the stiffness of the base material 11, the thickness of the entire radiation detector 10 is increased by providing the second reinforcing substrate 42. Therefore, the stiffness of the entire radiation detector 10 is secured.

Additionally, as illustrated in FIGS. 2 and 3, the second reinforcing substrate 42 is provided on the entire second surface 11B of the base material 11, and the size of the second reinforcing substrate 42 is larger than the size of the first reinforcing substrate 40. That is, the area with which the second reinforcing substrate 42 covers the base material 11 is larger than the area with which the first reinforcing substrate 40 covers the laminate 19. The first reinforcing substrate 40 is not provided in the terminal region 111 but the second reinforcing substrate 42 is also provided at a position corresponding to the terminal region 111.

Additionally, as illustrated in FIGS. 2 and 3, the terminal region 111 of the base material 11 is provided with a terminal 113 to which the flexible cable 112 is connected. The terminal region 111 in the present embodiment includes at least a region where the terminal 113 is provided. The area of the terminal region 111 is equal to or larger than the area of the terminal 113. The range of the terminal region 111 is determined in response to on the ease of reworking the flexible cable 112. Specifically, the range of the terminal region 111 (the area of the terminal region 111) is determined in response to the respective areas of the flexible cable 112 and the terminal 113, the connection deviation between the flexible cable 112 and the terminal 113 in a case where the flexible cable 112 is reworked, the method of the reworking, and the like. In addition, removing a cable or component electrically connected to the base material 11 (TFT substrate 12) to reconnect a new cable or component due to a defect or a positional deviation is referred to as the reworking. For example, an anisotropic conductive film or the like is used for the terminal 113.

In addition, in the following description, in a case where the flexible cable 112 is connected to the terminal 113 of the terminal region 111, the flexible cable 112 is simply connected to the terminal region 111. Additionally, in the present embodiment, the connection related to a component referred to as a "cable" including the flexible cable 112 means an electrical connection unless otherwise specified. In addition, the flexible cable 112 includes a signal line (not illustrated) made of a conductor, and the signal line is connected to the terminal 113, and thereby electrically connected to the terminal 113. In the following, the term "cable" refers to a flexible cable (having flexibility).

Figure 5:
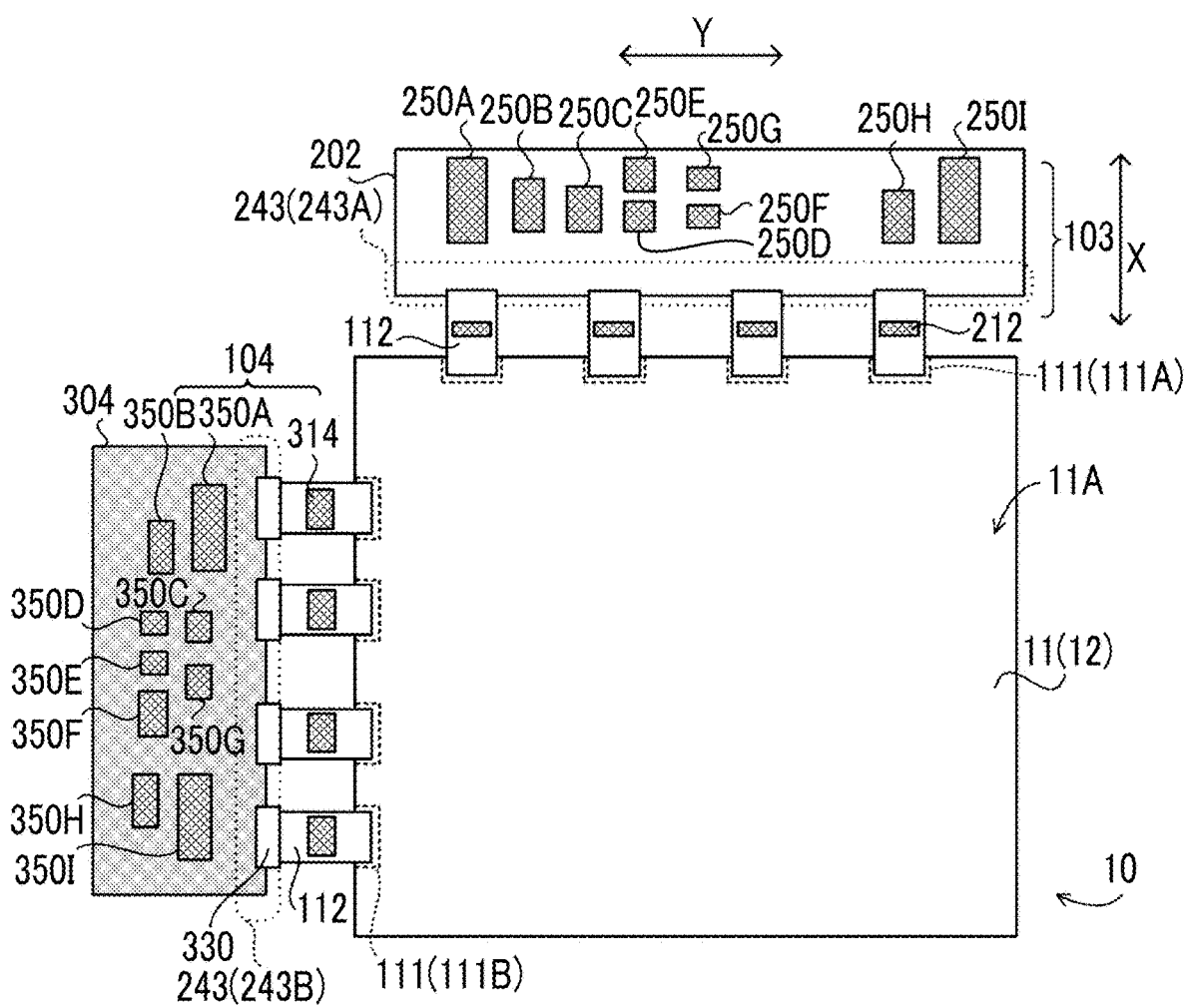
FIG. 5 is a plan view of the example of the radiation detector of the first embodiment as seen from a first surface side of a TFT substrate.

As described above, the flexible cable 112 is connected to at least one of the drive unit 103 or the signal processing unit 104 (refer to FIG. 5 for both). FIG. 5 illustrates a plan view of an example of a state in which the drive unit 103 and the signal processing unit 104 are connected to the radiation detector 10 of the present embodiment by the flexible cable 112 as seen from the first surface 11A side of the base material 11. The drive unit 103 and the signal processing unit 104 of the present embodiment are examples of a circuit unit of the present disclosure.

As in the example illustrated in FIG. 5, one end of each of a plurality of (four in FIG. 5) the flexible cables 112 is thermocompression-bonded to the terminal 113 (not illustrated in FIG. 5) in the terminal region 111 (111A). The flexible cable 112 has a function of connecting the drive unit 103 and the scanning wiring lines 38 (refer to FIG. 1). A plurality of signal lines (not illustrated) included in the flexible cable 112 are connected to the scanning wiring lines 38 (refer to FIG. 1) of the TFT substrate 12 via the terminal region 111 (111A).

On the other hand, the other end of the flexible cable 112 is thermocompression-bonded to a connection region 243 (243A) provided in an outer peripheral region of a driving substrate 202. The plurality of signal lines (not illustrated) included in the flexible cable 112 are connected to drive components 250 that are a circuit, an element, and the like mounted on the driving substrate 202 via the connection region 243.

FIG. 5 illustrates, as an example, a state in which nine drive components 250 (250A to 250I) are mounted on the driving substrate 202. As illustrated in FIG. 5, the drive components 250 of the present embodiment are disposed in an intersection direction X that is a direction intersecting a deflection direction Y that is a direction along a side corresponding to the terminal region 111 (111A) of the base material 11. For example, in a case where the drive components 250 each have a long side and a short side, the drive components 250 are disposed in a state in which the long side extends in the intersection direction X.

The driving substrate 202 of the present embodiment is a flexible printed circuit board (PCB), which is a so-called flexible substrate. The drive components 250 mounted on the driving substrate 202 are components mainly used for processing digital signals (in the present embodiment, referred to as "digital components"). Specific examples of the drive components 250 include a digital buffer, a bypass capacitor, a pull-up/pull-down resistor, a damping resistor, an electro magnetic compatibility (EMC) countermeasure chip component, and the like. In addition, the driving substrate 202 may not necessarily be a flexible substrate, and may be a non-flexible rigid substrate, which will be described below.

Digital components tend to have a relatively smaller area (size) than analog components to be described below. Additionally, the digital components tend to be less susceptible to electrical interference, in other words, noise than the analog components. For that reason, in the present embodiment, in a case where the TFT substrate 12 is deflected, the side of a substrate that is deflected with the deflection of the TFT substrate 12 is the driving substrate 202 on which the drive components 250 are mounted.

Additionally, a drive circuit unit 212 is mounted on the flexible cable 112 connected to the driving substrate 202. The drive circuit unit 212 is connected to the plurality of signal lines (not illustrated) included in the flexible cable 112.

In the present embodiment, the drive unit 103 is realized by the drive components 250 mounted on the driving substrate 202, and the drive circuit unit 212. The drive circuit unit 212 is an integrated circuit (IC) including a circuit different from the drive components 250 mounted on the driving substrate 202 among various circuits and elements that realize the drive unit 103.

In this way, in the radiation detector 10 of the present embodiment, the TFT substrate 12 and the driving substrate 202 are electrically connected to each other by the flexible cable 112, and thereby, the drive unit 103 and each of the scanning wiring lines 38 are connected to each other.

Meanwhile, one end part of each of the plurality of (four in FIG. 5) flexible cables 112 is thermocompression-bonded to the terminal region 111 (111B) of the base material 11. The plurality of signal lines (not illustrated) included in the flexible cable 112 are connected to the signal wiring lines 36 (refer to FIG. 1) via the terminal region 111 (111B). The flexible cable 112 has a function of connecting the signal processing unit 104 and the signal wiring lines 36 (refer to FIG. 1) to each other.

Meanwhile, the other end part of the flexible cable 112 is electrically connected to a connector 330 provided in the connection region 243 (243B) of a signal processing substrate 304. The plurality of signal lines (not illustrated) included in the flexible cable 112 are connected to signal processing components 350 that are a circuit, an element, and the like mounted on the signal processing substrate 304 via the connector 330. For example, examples of the connector 330 include a zero insertion force (ZIF) structure connector and a Non-ZIF structure connector. FIG. 5 illustrates, as an example, a state in which nine signal processing components 350 (350A to 350I) are mounted on the signal processing substrate 304. As illustrated in FIG. 5, the signal processing components 350 of the present embodiment are disposed in the intersection direction X that is a direction along a side of the base material 11 provided with the terminal region 111 (111B) of the base material 11. For example, in a case where the signal processing components 350 each have a long side and a short side, the signal processing components 350 are disposed in a state in which the long side extends in the intersection direction X.

In addition, the signal processing substrate 304 of the present embodiment may not necessarily be a flexible substrate, and may be a non-flexible PCB substrate or a so-called rigid substrate. In a case where the rigid substrate is used as the signal processing substrate 304, the thickness of the signal processing substrate 304 is larger than the thickness of the driving substrate 202. Additionally, the signal processing substrate 304 has a higher stiffness than the driving substrate 202.

The signal processing components 350 mounted on the signal processing substrate 304 are components mainly used for processing analog signals (in the present embodiment, referred to as "analog components"). Specific examples of the signal processing components 350 include an operational amplifier, an analog-to-digital converter (ADC), a digital-to-analog converter (DAC), a power supply IC, and the like. Additionally, the signal processing components 350 of the present embodiment also include a coil around a power supply having a relatively large component size, a large-capacity smoothing capacitor, and the like.

As described above, the analog components tend to have a relatively larger area (size) than the digital components. Additionally, the analog components tend to be more susceptible to electrical interference, in other words, noise, than the digital components. For that reason, in the present embodiment, even in a case where the TFT substrate 12 is deflected, the side of the substrate that is not deflected (is not affected by the deflection) is the signal processing substrate 304 on which the signal processing components 350 are mounted.

Additionally, a signal processing circuit unit 314 is mounted on the flexible cable 112 connected to the signal processing substrate 304. The signal processing circuit unit 314 is connected to a plurality of signal lines (not illustrated) included in the flexible cable 112B.

In the present embodiment, the signal processing unit 104 is realized by the signal processing components 350 mounted on the signal processing substrate 304, and the signal processing circuit unit 314. The signal processing circuit unit 314 is an IC including a circuit different from the signal processing components 350 mounted on the signal processing substrate 304 among various circuits and elements that realize the signal processing unit 104.

In this way, in the radiation detector 10 of the present embodiment, the TFT substrate 12 and the signal processing substrate 304 are electrically connected to each other by the flexible cable 112, and thereby the signal processing unit 104 and each of the signal wiring lines 36 are connected to each other.

An example of a method of manufacturing the radiation detector 10 of the present embodiment includes the following method. An example of the method of manufacturing the radiation detector 10 of the present embodiment will be described with reference to FIGS. 6A and 6E.

In advance, one in which the pressure sensitive adhesive layer 48 is applied to the first reinforcing substrate 40 having a desired size adapted to the radiation detector 10 is prepared.

Figure 6A:
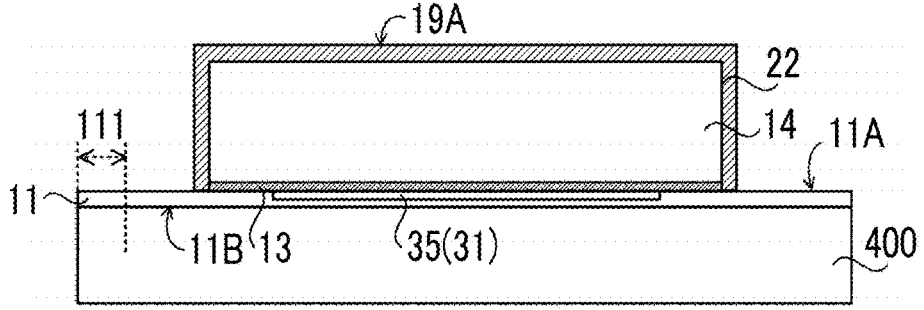
FIG. 6A is a view illustrating an example of a step of a method of manufacturing the radiation detector of the first embodiment.

Meanwhile, as illustrated in FIG. 6A, the base material 11 is formed on a support body 400, such as a glass substrate that is thicker than the base material 11, via a peeling layer (not illustrated). In a case where the base material 11 is formed by a lamination method, a sheet to be the base material 11 is bonded onto the support body 400. The surface of the base material 11 corresponding to the second surface 11B is the support body 400 side and is in contact with the peeling layer (not illustrated).

Moreover, the plurality of pixels 30 are formed in the pixel region 35 of the base material 11. In addition, in the present embodiment, as an example, the plurality of pixels 30 are formed on the pixel region 35 of the base material 11 via an undercoat layer (not illustrated) made of SiN or the like.

Moreover, the conversion layer 14 is formed on the pixel region 35. In the present embodiment, first, the buffer layer 13 is formed in a region where the conversion layer 14 is provided, on the first surface 11A of the base material 11. Thereafter, the CsI conversion layer 14 is formed as a columnar crystal directly on the TFT substrate 12 and more specifically on the buffer layer 13 by vapor-phase deposition methods such as a vacuum vapor deposition method, a sputtering method, and a chemical vapor deposition (CVD) method. In this case, the side of the conversion layer 14 in contact with the pixels 30 is a growth-direction base point side of the columnar crystal.

In addition, in a case where the CsI conversion layer 14 is provided directly on the TFT substrate 12 by the vapor-phase deposition method in this way, for example, a reflective layer (not illustrated) having a function of reflecting the light converted in the conversion layer 14 may be provided on the surface of the conversion layer 14 opposite to the side in contact with the TFT substrate 12. The reflective layer may be provided directly on the conversion layer 14 or may be provided via an adhesion layer or the like. As a material of the reflective layer, it is preferable to use an organic material, and it is preferable to use, for example, at least one of white PET, $TiO_2$, $Al_2O_3$, foamed white PET, a polyester-based high-reflection sheet, specular reflection aluminum, or the like. Particularly, it is preferable to use the white PET as the material from a viewpoint of reflectance. In addition, the polyester-based high-reflection sheet is a sheet (film) having a multilayer structure in which a plurality of thin polyester sheets are laminated.

Additionally, in a case where a CsI scintillator is used as the conversion layer 14, the conversion layer 14 can be formed on the TFT substrate 12 by a method different from the method of the present embodiment. For example, the conversion layer 14 may be formed on the TFT substrate 12 by preparing one in which CsI is vapor-deposited on an aluminum plate or the like by a vapor-phase deposition method and bonding a side of the CsI, which is not in contact with the aluminum plate, and the pixels 30 of the TFT substrate 12 to each other with a pressure sensitive adhesive sheet or the like. In this case, it is preferable that one in which the entire conversion layer 14 also including the aluminum plate is covered with a protective film is bonded to the pixel regions 35 of the TFT substrate 12. In addition, in this case, the side of the pixel region 35 in contact with the conversion layer 14 is a distal end side in the growth direction of the columnar crystal.

Additionally, unlike the radiation detector 10 of the present embodiment, GOS ($Gd_2O_2S$:Tb)) or the like may be used as the conversion layer 14 instead of CsI. In this case, for example, the conversion layer 14 can be formed on the TFT substrate 12 by preparing one in which a sheet having GOS dispersed in a binder such as resin is bonded to a support body formed of white PET or the like with a pressure sensitive adhesive layer or the like, and bonding a side of the GOS on which the support body is not bonded, and the pixel region 35 of the TFT substrate 12 to each other with the pressure sensitive adhesive sheet or the like. In addition, the conversion efficiency from radiation to visible light is higher in a case where CsI is used for the conversion layer 14 than in a case where GOS is used.

Figure 6B:
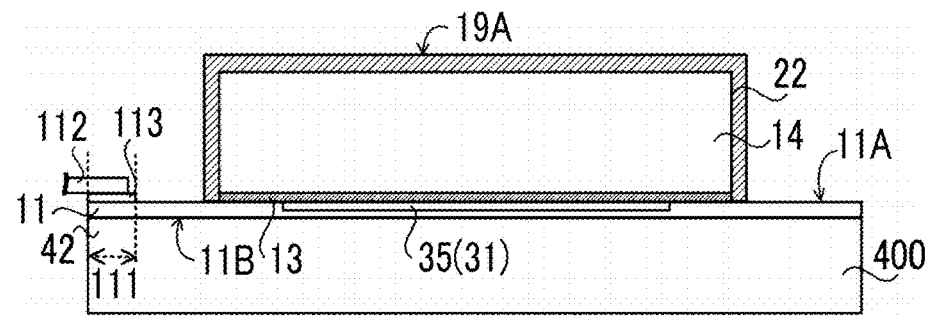
FIG. 6B is a view illustrating an example of a step following the step illustrated in FIG. 6A.

Moreover, as illustrated in FIG. 6B, the flexible cable 112 is thermocompression-bonded to the terminal 113 of the terminal regions 111 of the base material 11, and the plurality of signal lines (not illustrated) included in the flexible cable 112 and the terminal region 111 of the base material 11 are electrically connected to each other.

Moreover, the flexible cable 112 is thermocompression-bonded to the connection region 243 (243A) of the driving substrate 202, and the plurality of signal lines (not illustrated) included in the flexible cable 112 and the drive components 250 mounted on the driving substrate 202 are electrically connected to each other and brought into a state illustrated in FIG. 5.

Figure 6C:
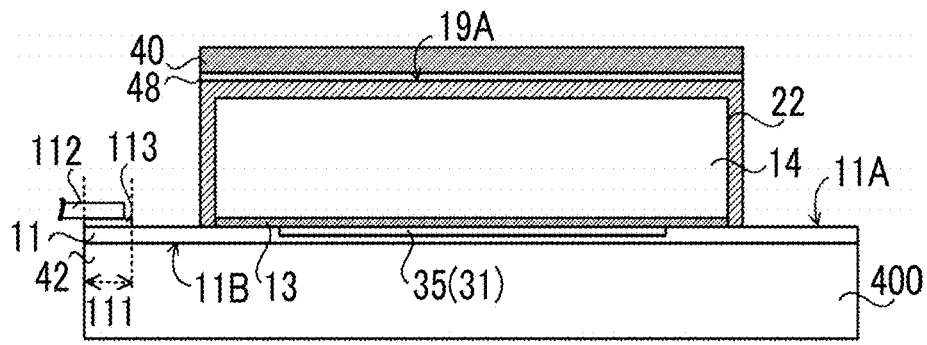
FIG. 6C is a view illustrating an example of a step following the step illustrated in FIG. 6B.

Then, as illustrated in FIG. 6C, the first reinforcing substrate 40, which has been prepared in advance, is bonded to the TFT substrate 12 on which the conversion layer 14 is formed and the flexible cable 112 is connected, thereby sealing the conversion layer 14. In addition, in a case where the above bonding is performed, the bonding is performed under the atmospheric pressure or under reduced pressure (under vacuum). However, in order to suppress entry of air or the like while being bonded to each other, it is preferable to perform the bonding under reduced pressure.

Figure 6D:
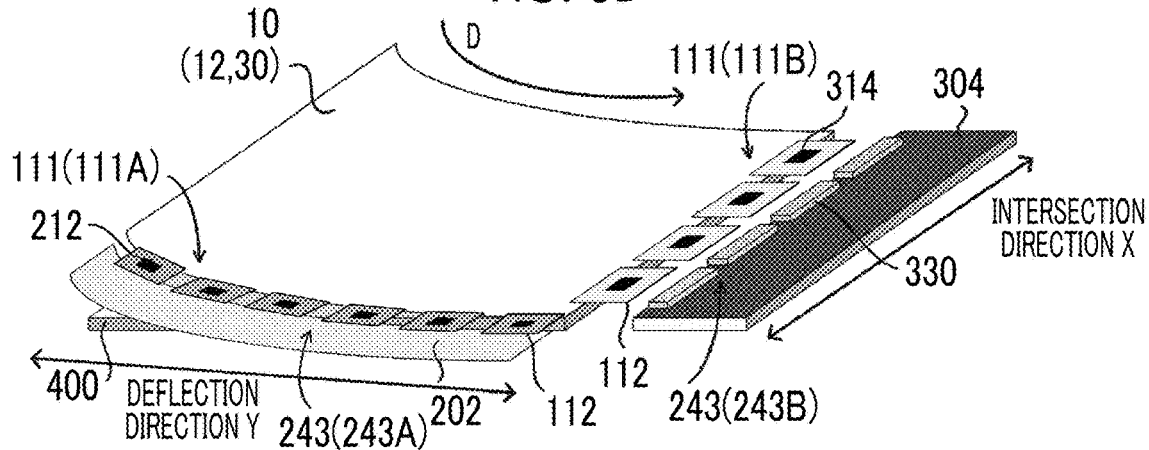
FIG. 6D is a view illustrating an example of a step following the step illustrated in FIG. 6C.

Thereafter, the radiation detector 10 is peeled off from the support body 400 as illustrated in FIG. 6D. In a case where the peeling is performed by mechanical peeling, in the example illustrated in FIG. 6D, the side of the base material 11 of the TFT substrate 12 facing the side to which the flexible cable 112 is connected is set as the starting point of the peeling. The mechanical peeling is performed by peeling the TFT substrate 12 in a direction of arrow D illustrated in FIG. 6D off from the support body 400 gradually from the side serving as the starting point toward the side to which the flexible cable 112 is connected, and the radiation detector 10 in a state where the flexible cable 112 is connected is obtained.

In addition, the side serving as the starting point of the peeling is preferably a side that intersects the longest side in a case where the TFT substrate 12 is viewed in a plan view. In other words, the side extending in the deflection direction Y in which the deflection is caused by the peeling is preferably the longest side in the TFT substrate 12. In the present embodiment, a side to which the driving substrate 202 is connected by the flexible cable 112 is longer than a side to which the signal processing substrate 304 is connected by the flexible cable 112. For that reason, the starting point of the peeling is used as a side facing a side where the terminal region 111 (111B) is provided.

In the present embodiment, after the TFT substrate 12 is further peeled off from the support body 400, the flexible cable 112 of the radiation detector 10 and the connector 330 of the signal processing substrate 304 are electrically connected to each other.

Moreover, as illustrated in FIG. 6E, the radiation detector 10 of the present embodiment is manufactured by bonding the second reinforcing substrate 42 provided with the pressure sensitive adhesive layer such as a double-sided tape to the second surface 11B of the base material 11.

In addition, the present embodiment is not limited to this, and for example, the timing for connecting the flexible cable 112 to the terminal region 111 may be after the first reinforcing substrate 40 is provided on the TFT substrate 12. In addition, for example, the mechanical peeling may be performed after the flexible cable 112 of the radiation detector 10 and the connector 330 of the signal processing substrate 304 are electrically connected to each other.

In performing the above mechanical peeling, in the radiographic imaging apparatus 1 of the present embodiment, as illustrated in FIG. 6D, the driving substrate 202 is a flexible substrate. Therefore, the driving substrate 202 is also deflected in response to the deflection of the TFT substrate 12.

Here, in a case where the TFT substrate 12 is peeled off from the support body 400, the TFT substrate 12 is easily deflected because the base material 11 has flexibility. In a case where the TFT substrate 12 is largely deflected, there is a concern that a defect may occur in the TFT substrate 12. For example, there is a concern that the conversion layer 14 may be peeled off from the TFT substrate 12, and particularly, an end part of the conversion layer 14 may be easily peeled off from the TFT substrate 12. Additionally, for example, as a result of the TFT substrate 12 being largely deflected, there is a concern that the pixels 30 may be damaged.

In contrast, in the radiation detector 10 of the present embodiment, the first reinforcing substrate 40 having a higher stiffness than the base material 11 is provided on the first surface 11A of the base material 11. For that reason, according to the radiation detector 10 of the present embodiment, in a case where the TFT substrate 12 is peeled off from the support body 400, it is possible to suppress that the TFT substrate 12 is largely deflected and it is possible to suppress that a defect occurs in the TFT substrate 12.

Additionally, the present invention is not limited to a case where the TFT substrate 12 is peeled off from the support body 400. Even in a case where the radiation detector 10 is handled as a single body during a manufacturing process of the radiographic imaging apparatus 1, there is a concern that a defect may occur in the TFT substrate 12 similarly to the above due to the deflection of the TFT substrate 12. In contrast, in the radiation detector 10 of the present embodiment, the first reinforcing substrate 40 is provided on the first surface 11A of the base material 11, and the second reinforcing substrate 42 is provided on the second surface 11B of the base material 11. For that reason, according to the radiation detector 10 of the present embodiment, even in a case where the radiation detector 10 is handled as a single body, it is possible to suppress that the TFT substrate 12 is largely deflected, and it is possible to suppress that a defect occurs in the TFT substrate 12.

Additionally, in the radiation detector 10 of the present embodiment, there is a concern that the flexible cable 112 may be peeled off from the terminal region 111 of the base material 11 or the connection deviation may be caused. Particularly, in a case where the TFT substrate 12 is deflected in order to peel the TFT substrate 12 from the support body 400 after the driving substrate 202 is connected to the flexible cable 112, the flexible cable 112 is peeled off from the terminal region 111 of the base material 11 or the connection deviation is easily caused. Additionally, the present invention is not limited to a case where the TFT substrate 12 is peeled off from the support body 400. Even in a case where the radiation detector 10 is handled as a single body during the manufacturing process of the radiographic imaging apparatus 1, there is a concern that the conversion layer 14 may be peeled off from the TFT substrate 12 due to the deflection of the TFT substrate 12. Additionally, similarly, there is a concern that the flexible cable 112 may be peeled off from the terminal region 111 of the base material 11 or the connection deviation may be caused. In a case where the flexible cable 112 is peeled off from the terminal region 111 of the base material 11 or the connection deviation is caused, it is necessary to rework the flexible cable 112 to the terminal region 111.

In contrast, in the radiation detector 10 of the present embodiment, as described above, the size of the first reinforcing substrate 40 is smaller than the size of the second reinforcing substrate 42 and the first reinforcing substrate 40 does not cover the terminal region 111. For that reason, in the radiation detector 10 of the present embodiment, in a case where the flexible cable 112 is reworked to the terminal region 111, the reworking can be performed without being blocked by the first reinforcing substrate 40. Therefore, the radiation detector 10 of the present embodiment has an excellent peeling property in the reworking process. In addition, in the radiation detector 10, the first reinforcing substrate 40 does not cover the terminal region 111. However, since the second reinforcing substrate 42 extends to the portion of the terminal region 111, the stiffness in the portion of the terminal region 111 can be secured.

Second Embodiment

Next, a second embodiment will be described. FIG. 7 is an example of a plan view of the radiation detector 10 according to the present embodiment as seen from the first surface 11A side of the base material 11. Additionally, FIG. 8 is a cross-sectional view taken along line A-A of the radiation detector 10 in FIG. 7.

Figure 8:
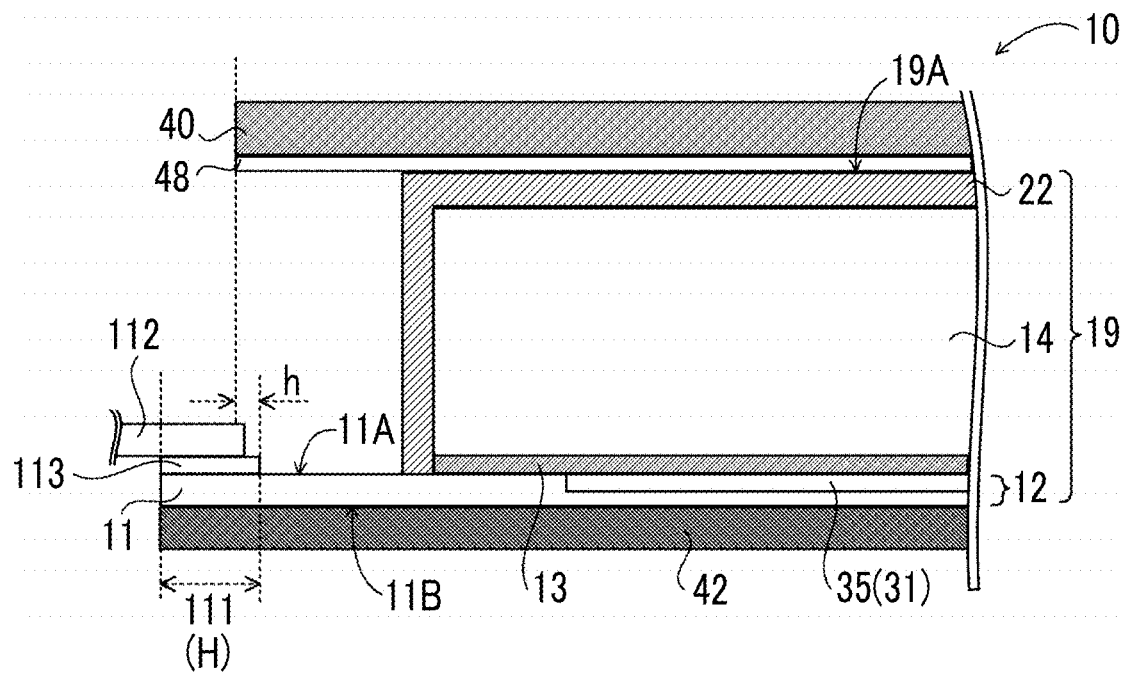
FIG. 8 is a cross-sectional view taken along line A-A of the radiation detector illustrated in FIG. 7.

As illustrated in FIGS. 7 and 8, the radiation detector 10 of the present embodiment is different from the radiation detector 10 of the first embodiment in that the first reinforcing substrate 40 covers a partial region of the terminal region 111 (refer to FIGS. 2 and 3).

It is more preferable that the size of the first reinforcing substrate 40, specifically, the area for covering the TFT substrate 12 (base material 11) is larger in terms of securing the stiffness. However, when the entire terminal region 111 is covered, as described above, the first reinforcing substrate 40 is an obstacle and the peeling property in the reworking process of the flexible cable 112 may deteriorate. Thus, in the radiation detector 10 of the present embodiment, the first reinforcing substrate 40 covers a partial region of the terminal region 111. Specifically, as illustrated in FIGS. 7 and 8, the terminal region 111 has a first region 111C covered with the first reinforcing substrate 40 and a second region 111D not covered with the first reinforcing substrate 40.

As the size (area) of the first region 111C is larger, in other words, the portion of the terminal region 111 covered with the first reinforcing substrate 40 is larger, the concern that the peeling property in the reworking process may deteriorate is higher. In a case where the peeling property in the reworking process is considered, the size of the first region 111C is preferably smaller than the size of the second region 111D. Additionally, it is more preferable that a length h from one end part on an inner side of the base material 11 to the other end part on an outer edge side of the base material 11 in the first region 111C is ¼ or less (h≤¼×H) of a length H from one end part on the inner side of the base material 11 to the other end part on the outer edge side of the base material 11 in the terminal region 111.

In this way, also in the radiation detector 10 of the present embodiment, it is possible to secure the stiffness of the radiation detector 10 and suppress the occurrence of a defect in the TFT substrate 12 without deteriorating the peeling property in the reworking process.

Third Embodiment

Figure 9:
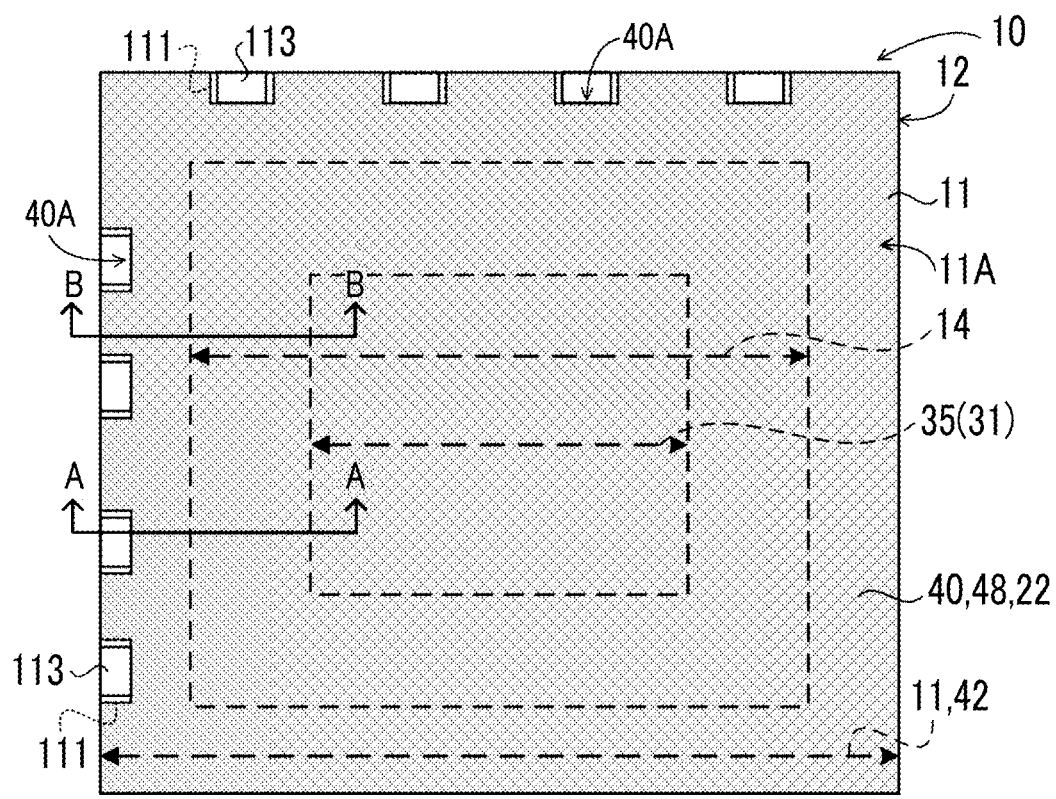
FIG. 9 is a plan view of an example of a radiation detector of a third embodiment as seen from the side on which a conversion layer is provided.

Next, a third embodiment will be described. FIG. 9 is an example of a plan view of the radiation detector 10 according to the present embodiment as seen from the first surface 11A side of the base material 11. Additionally, FIG. 10A is a cross-sectional view taken along line A-A of the radiation detector 10 in FIG. 9, and FIG. 10B is a cross-sectional view taken along line B-B of the radiation detector 10 in FIG. 9.

Figure 10A:
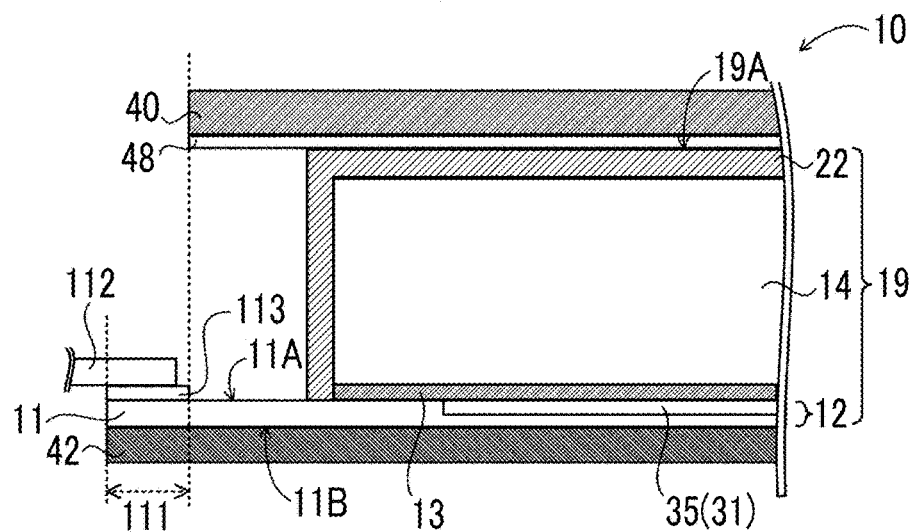
FIG. 10A is a cross-sectional view taken along line A-A of the radiation detector illustrated in FIG. 9.
Figure 10B:
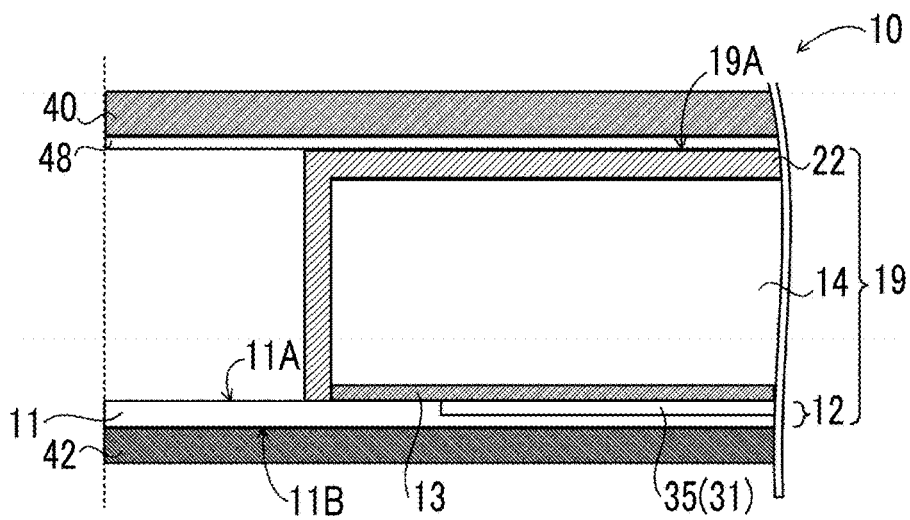
FIG. 10B is a cross-sectional view taken along line B-B of the radiation detector illustrated in FIG. 9.

As illustrated in FIGS. 9, 10A, and 10B, the radiation detector 10 of the present embodiment is different from the radiation detector 10 of the first embodiment (refer to FIGS. 2 and 3) in that the first reinforcing substrate 40 covers the entire region other than the terminal region 111 of the base material 11 (TFT substrate 12). As illustrated in FIGS. 9 and 10A, the first reinforcing substrate 40 is provided with a cutout part 40A at a position corresponding to the terminal region 111, and does not cover a region corresponding to the terminal region 111. Meanwhile, as illustrated in FIGS. 9 and 10B, the first reinforcing substrate 40 covers a portion up to the end part (outer edge) of the base material 11 (TFT substrate 12) in a region where the terminal region 111 is not provided.

In this way, in the radiation detector 10 of the present embodiment, by providing the cutout part 40A of the first reinforcing substrate 40 in the region corresponding to the terminal region 111, a region between a terminal region 111 and a terminal region 111 on the side of the base material 11 where terminal regions 111 are lined up is also covered with the first reinforcing substrate 40. For that reason, since the area of the first reinforcing substrate 40 covering the TFT substrate 12 (base material 11) is larger, higher stiffness can be secured. Additionally, since the terminal region 111 is not covered with the first reinforcing substrate 40, the peeling property in the reworking process of the flexible cable 112 does not deteriorate.

In this way, also in the radiation detector 10 of the present embodiment, it is possible to secure the stiffness of the radiation detector 10 and suppress the occurrence of a defect in the TFT substrate 12 without deteriorating the peeling property in the reworking process.

As described above, the radiation detector 10 of each of the above embodiments includes the TFT substrate 12, the conversion layer 14, the first reinforcing substrate 40, and the second reinforcing substrate 42. In the TFT substrate 12, the plurality of pixels 30 that accumulate electric charges generated in response to the light converted from the radiation R are formed in the pixel region 35 of the first surface 11A of the flexible base material 11, and the terminal region 111 of the first surface 11A is provided with the terminal 113 for electrically connecting the flexible cable 112. The conversion layer 14 is provided outside the terminal region 111 on the first surface 11A of the base material 11 and converts the radiation R into light. The first reinforcing substrate 40 is provided on the surface of the conversion layer 14 opposite to a surface on the TFT substrate 12 side and has a higher stiffness than the base material 11. The second reinforcing substrate 42 is provided on the second surface 11B opposite to the first surface 11A of the base material 11 and covers a surface larger than the first reinforcing substrate 40.

In the radiation detector 10 of each of the above embodiments, the TFT substrate 12 is sandwiched between the first reinforcing substrate 40 having a higher stiffness than the base material 11 and the second reinforcing substrate 42 covering a surface larger than the first reinforcing substrate 40. Therefore, the deflection of the TFT substrate 12 (base material 11) can be suppressed, and the stiffness of the radiation detector 10 can be secured. For that reason, according to the radiation detector 10, it is possible to suppress that a defect occurs in the TFT substrate 12 due to the deflection of the TFT substrate 12.

Additionally, in the radiation detector 10 of each of the above embodiments, the first reinforcing substrate 40 covers a surface smaller than the second reinforcing substrate 42. Therefore, it is possible to suppress the terminal region 111 is covered with the first reinforcing substrate 40. For that reason, according to the radiation detector 10, it is possible to suppress that the peeling property in the reworking process of the flexible cable 112 or the like deteriorates.

Therefore, according to the radiation detector 10 of each of the above embodiments, it is possible to suppress that a defect occurs in the TFT substrate 12, and the peeling property in the reworking process is excellent.

Figure 11A:
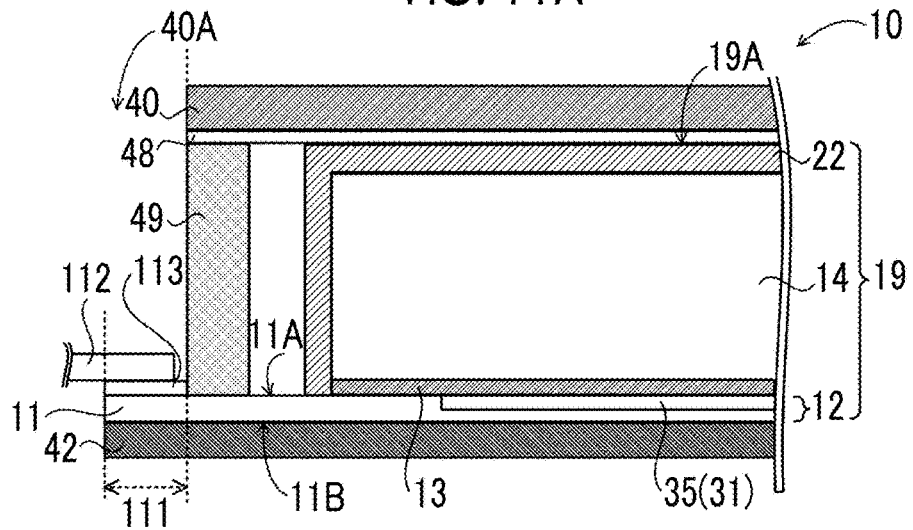
FIG. 11A is a cross-sectional view taken along line A-A of an example in a case where a spacer is provided in the radiation detector of the third embodiment.
Figure 11B:
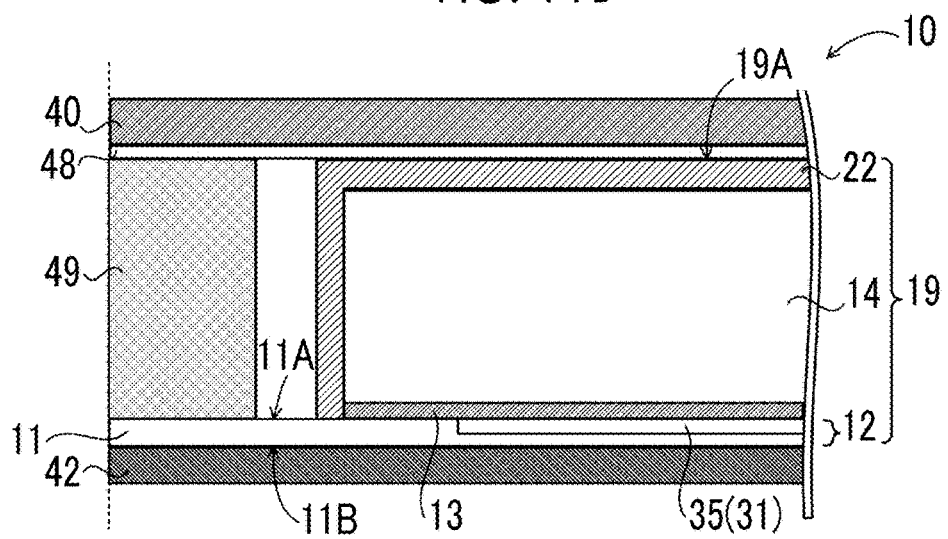
FIG. 11B is a cross-sectional view taken along line B-B of the example in a case where the spacer is provided in the radiation detector of the third embodiment.

In addition, the radiation detector 10 according to the present disclosure is not limited to the forms described in the above respective embodiments. For example, a spacer or the like that supports the end part of the first reinforcing substrate 40 or the like may be provided. FIGS. 11A and 11B illustrate cross-sectional views of an example of the radiation detector 10 of the third embodiment in a case where a spacer 49 is provided. FIG. 11A corresponds to a region (a cross-sectional view taken along line A-A in FIG. 9) in which the terminal region 111 is provided and the cutout part 40A is provided in the first reinforcing substrate 40. Additionally, FIG. 11B corresponds to a region (a cross-sectional view taken along line B-B in FIG. 9) in which the first reinforcing substrate 40 is provided up to the end part of the TFT substrate 12 (base material 11). By providing the spacer 49 that supports the end part of the first reinforcing substrate 40 in this way, it is possible to suppress that the end part of the first reinforcing substrate 40 is deflected. Additionally, since a side surface of the conversion layer 14 can be sealed by the spacer 49, the moistureproofness is improved and the deterioration of the conversion layer 14 is suppressed.

Similar to the first reinforcing substrate 40, when the spacer 49 also covers the terminal region 111, the peeling property in the reworking process deteriorates. For that reason, as illustrated in FIG. 11A, in a case where the spacer 49 that supports the first reinforcing substrate 40 is provided, it is preferable that the terminal region 111 is not covered with the spacer 49. In other words, it is preferable that the spacer 49 is not provided on the terminal region 111. For example, even in a case where the first reinforcing substrate 40 extends above the terminal region 111 as in the radiation detector 10 of the second embodiment, it is preferable that the spacer 49 is not provided above the terminal region 111.

Figure 12:
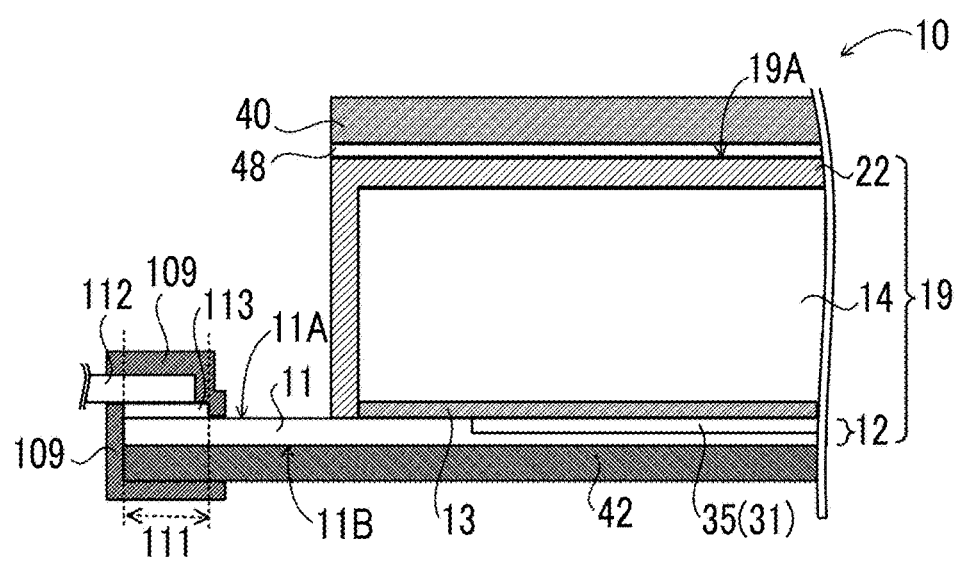
FIG. 12 is a cross-sectional view illustrating another example of the radiation detector of the embodiment.

Additionally, for example, as illustrated in FIG. 12, the radiation detector 10 preferably covers the edge part of the flexible cable 112 with a moistureproof insulating film 109. In the example illustrated in FIG. 12, the moistureproof insulating film 109 covers the entire region of the base material 11 corresponding to the terminal region 111 from above the flexible cable 112 in a state where the flexible cable 112 is connected to the terminal 113. As the moistureproof insulating film 109, for example, Tuffy (registered trademark), which is a moistureproof insulating material for flat panel display (FPD), can be used.

Additionally, in the radiation detector 10 of each of the above embodiments, a form in which the TFT substrate 12 (base material 11) and the second reinforcing substrate 42 have the same size has been described. However, the TFT substrate 12 and the second reinforcing substrate 42 may have different sizes.

For example, in a case where the radiation detector 10 is applied to the radiographic imaging apparatus 1, the radiation detector 10 may be fixedly used in a housing 120 (refer to FIGS. 16 and 17) for housing the radiation detector 10. In such a case, for example, as in the example illustrated in FIG. 13A, the second reinforcing substrate 42 may be made larger than the TFT substrate 12 to provide a flap or the like, and a portion such as the flap is used to fix the radiation detector 10. For example, a form may be adopted in which a hole is provided in the flap portion of the second reinforcing substrate 42, and the flap portion is fixed to the housing 120 (refer to FIGS. 16 and 17) by using a screw penetrating the hole.

Figure 13A:
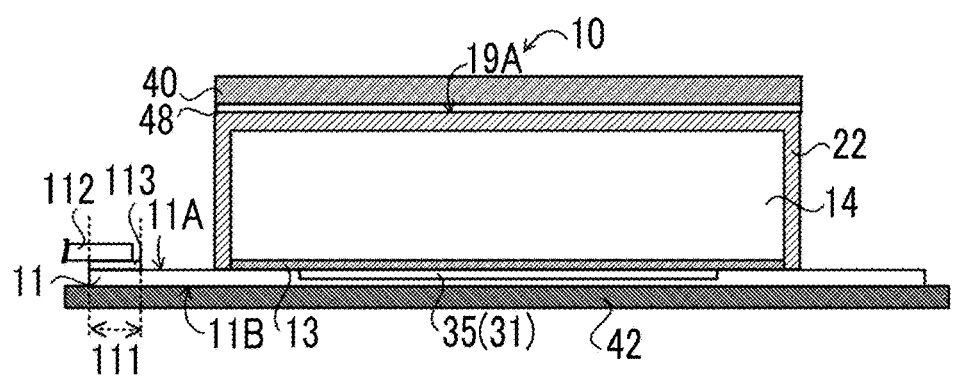
FIG. 13A is a cross-sectional view illustrating an example of a form in which the size of a second reinforcing substrate is different in the radiation detector of the embodiment.
Figure 13B:
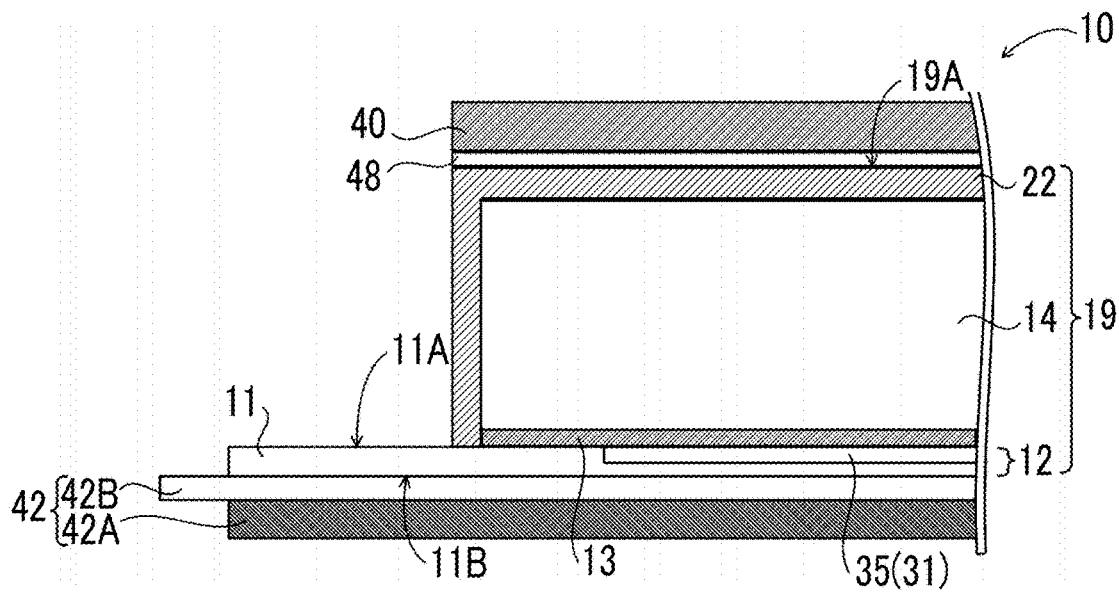
FIG. 13B is a cross-sectional view illustrating an example in which the second reinforcing substrate is constituted of a plurality of layers in the radiation detector of the embodiment.

In addition, the form in which the second reinforcing substrate 42 is made larger than the TFT substrate 12 is not limited to the form illustrated in FIG. 13A. A form may be adopted in which the second reinforcing substrate 42 may be constituted of a plurality of laminated layers and some of the layers is larger than the TFT substrate 12. For example, as illustrated in FIG. 13B, the second reinforcing substrate 42 may have a two-layer structure of a first layer 42A having about the same size as the TFT substrate 12 (base material 11) and a second layer 42B larger than the TFT substrate 12. The first layer 42A and the second layer 42B are bonded to each other with, for example, a double-sided tape, a pressure sensitive adhesive layer, or the like (not illustrated). The first layer 42A is preferably formed of, for example, the same material as the above-described second reinforcing substrate 42 and has the same properties as the second reinforcing substrate 42. Additionally, the second layer 42B is bonded to the second surface 11B of the base material 11 with a double-sided tape, a pressure sensitive adhesive layer, or the like (not illustrated). As the second layer 42B, for example, Alpet (registered trademark) can be applied. Additionally, in a case where the second reinforcing substrate 42 is constituted of the plurality of layers, a form may be adopted in which the first layer 42A is bonded to the second surface 11B of the base material 11 as illustrated in FIG. 13C, contrary to the form illustrated in FIG. 13B.

As described above, in a case where the radiation detector 10 is fixed to the housing 120 (refer to FIGS. 16 and 17) or the like by using the flap or the like provided on the second reinforcing substrate 42, there is a case where the flap portion is fixed in a bent state. As the thickness of the bent portion is smaller, the flap portion of the second reinforcing substrate 42 is more easily bent, and only the flap portion can be bent without affecting a main body of the radiation detector 10. For that reason, in a case the flap portion or the like is bent, a form is preferable in which the second reinforcing substrate 42 is constituted of the plurality of laminated layers as in the example illustrated in FIGS. 13B and 13C and some of the layers are larger than the TFT substrate 12.

Figure 13C:
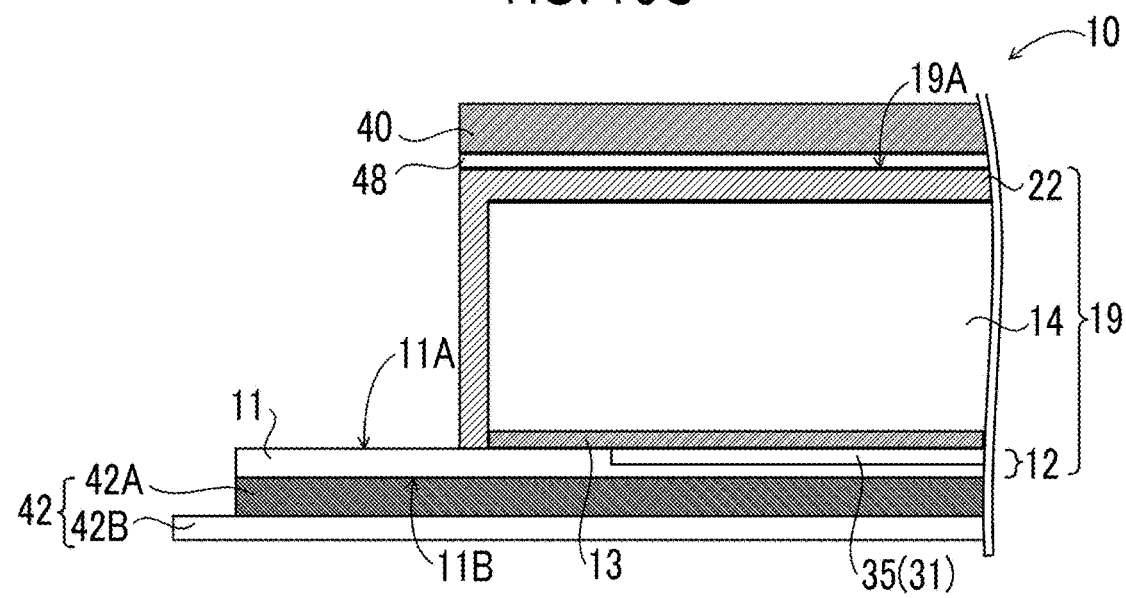
FIG. 13C is a cross-sectional view illustrating another example in which the second reinforcing substrate is constituted of a plurality of layers in the radiation detector of the embodiment.
Figure 14:
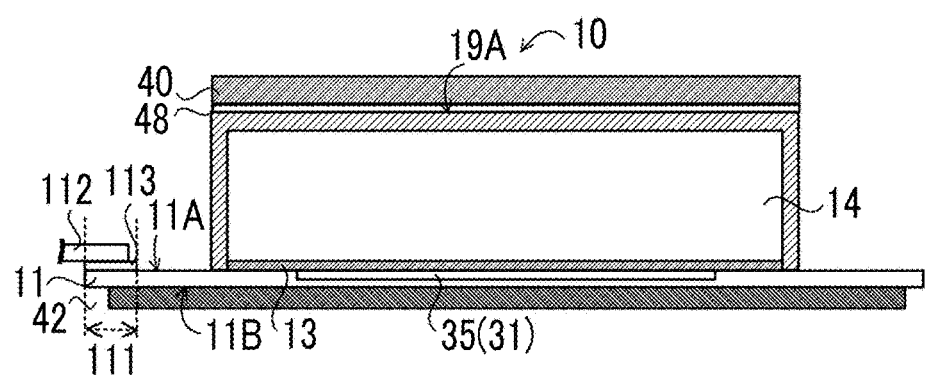
FIG. 14 is a cross-sectional view illustrating another example of a form in which the size of the second reinforcing substrate is different in the radiation detector of the embodiment.

Additionally, as in the example illustrated in FIG. 14, the second reinforcing substrate 42 may be smaller than the TFT substrate 12, contrary to the radiation detector 10 of FIGS. 13A to 13C. Since the end part of the TFT substrate 12 is located outside the end part of the second reinforcing substrate 42, for example, in a case where assembling is performed such that the radiation detector 10 is housed in the housing 120 (refer to FIGS. 16 and 17), the position of the end part of the TFT substrate 12 can be easily confirmed. Therefore, positioning accuracy can be improved. In addition, not limited to the form illustrated in FIG. 14, as long as at least a part of the end part of the TFT substrate 12 (base material 11) is located outside the second reinforcing substrate 42, the same effects can be obtained, which is preferable.

Figure 15:
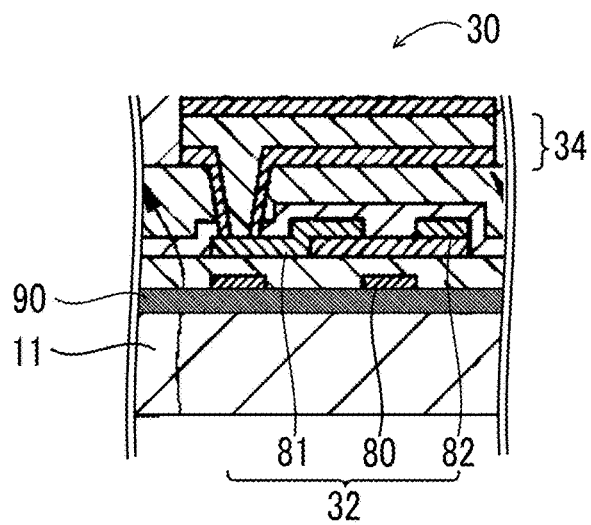
FIG. 15 is a cross-sectional view of one pixel portion of another example of the radiation detector of the embodiment.

Additionally, as in the example illustrated in FIG. 15, it is preferable that a layer 90 made of an inorganic material is provided between the base material 11 and a pixel 30, particularly a gate electrode 80 of the TFT 32 of the pixel 30. Examples of the inorganic material in the case of the example illustrated in FIG. 15 include SiNx, SiOx, and the like. A drain electrode 81 of the TFT 32 and a source electrode 82 are formed in the same layer, and the gate electrode 80 is formed between a layer on which the drain electrode 81 and the source electrode 82 are formed and the base material 11. Additionally, the layer 90 made of the inorganic material is provided between the base material 11 and the gate electrode 80.

Additionally, in the above respective embodiments, as illustrated in FIG. 1, an aspect in which the pixels 30 are two-dimensionally arranged in a matrix has been described. However, the invention is not limited to the aspect, and for example, the pixels 30 may be one-dimensionally arranged or may be arranged in a honeycomb shape. Additionally, the shape of the pixels 30 is also not limited, and may be a rectangular shape, or may be a polygonal shape, such as a hexagonal shape. Moreover, it goes without saying that the shape of the pixel array 31 (pixel region 35) is also not limited.

Additionally, the shape or the like of the conversion layer 14 is not limited to the above respective embodiments. In the above respective embodiments, an aspect in which the shape of the conversion layer 14 is a rectangular shape similar to the shape of the pixel array 31 (pixel region 35) has been described. However, the shape of the conversion layer 14 may not be the same shape as the pixel array 31 (pixel region 35). Additionally, the shape of the pixel array 31 (pixel region 35) may not be a rectangular shape but may be, for example, other polygonal shapes or a circular shape.

In addition, in the above-described method of manufacturing the radiation detector 10, the step of peeling the TFT substrate 12 off from the support body 400 by the mechanical peeling has been described. However, the peeling method is not limited to the described form. For example, a form of performing so-called laser peeling of peeling the TFT substrate 12 by radiating a laser beam from the surface of the support body 400 opposite to the side on which the TFT substrate 12 is formed may be adopted. Even in this case, according to the radiation detector 10, in a case where the radiation detector 10 is handled as a single body after the TFT substrate 12 is peeled off from the support body 400, it is possible to suppress that the conversion layer 14 is peeled off from the TFT substrate 12.

In addition, the radiation detectors 10 of the above respective embodiments may be applied to an irradiation side sampling (ISS) type radiographic imaging apparatus or may be applied to a penetration side sampling (PSS) type radiographic imaging apparatus in which radiation R is radiated from the conversion layer 14 side.

Figure 16:
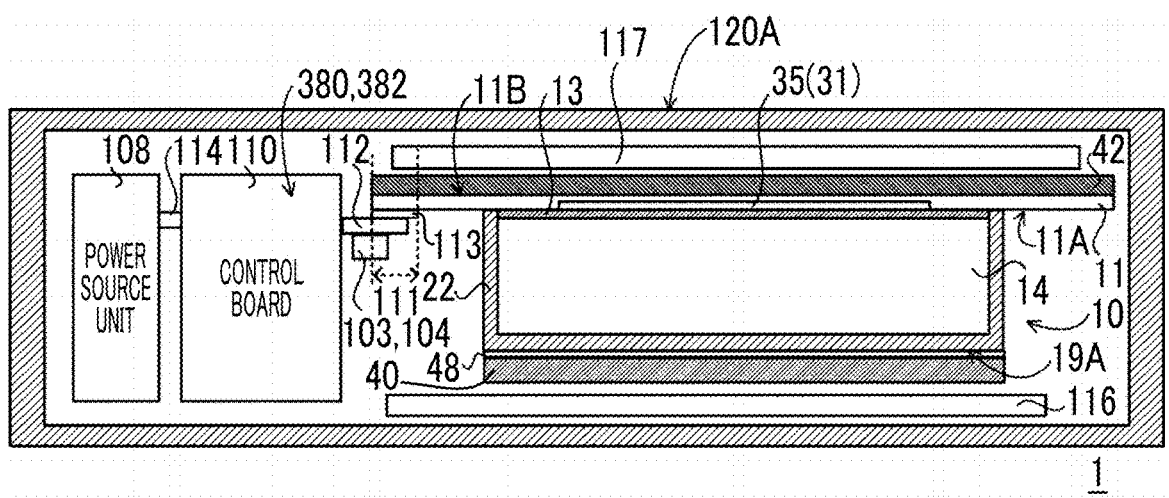
FIG. 16 is a cross-sectional view illustrating a cross section of an example of a radiographic imaging apparatus to which the radiation detector of the embodiment is applied.

A cross-sectional view of an example in a state where the radiation detector 10 of the first embodiment is applied to the ISS type radiographic imaging apparatus 1 is illustrated in FIG. 16.

As illustrated in FIG. 16, the radiation detector 10, the power source unit 108, and a control board 110 are provided side by side in a direction intersecting an incidence direction of radiation within the housing 120. The radiation detector 10 is provided in a state where a side where the conversion layer 14 of the pixel array 31 is not provided faces an imaging surface 120A side of the housing 120 that is irradiated with radiation transmitted through the subject. The imaging surface 120A of the present embodiment is an example of the irradiation surface of the present disclosure.

The control board 110 is a board in which an image memory 380 for storing image data according to the electric charges read from the pixels 30 of the pixel array 31, and a control unit 382 for controlling reading or the like of the electric charges from the pixels 30, and the like are formed. The control board 110 is electrically connected to the pixels 30 of the pixel array 31 by the flexible cable 112 including a plurality of signal wiring lines. In addition, in the radiographic imaging apparatus 1 illustrated in FIG. 16, the control board 110 is a so-called chip on film (COF) in which the drive unit 103 for controlling the switching states of the TFTs 32 of the pixels 30 under the control of the control unit 382, and the signal processing unit 104 for creating and outputting image data according to the electric charges read from the pixels 30 are provided on the flexible cable 112. In addition, the present embodiment is not limited to this, and at least one of the drive unit 103 or the signal processing unit 104 may be formed on the control board 110.

Additionally, the control board 110 is connected to the power source unit 108, which supplies electrical power to the image memory 380, the control unit 382, and the like that are formed in the control board 110, by a power source line 114.

The housing 120 is preferably lightweight, has a low absorbance of radiation R, particularly X-rays, and has a high stiffness, and is preferably made of a material having a sufficiently high modulus of elasticity. As the material of the housing 120, it is preferable to use a material having a bending modulus of elasticity of 10,000 MPa or more. As the material of the housing 120, carbon or carbon fiber reinforced plastics (CFRP) having a bending modulus of elasticity of about 20,000 to 60,000 MPa can be suitably used.

In the capturing of a radiographic image by the radiographic imaging apparatus 1, a load from a subject is applied to the imaging surface 120A of the housing 120. In a case where the stiffness of the housing 120 is insufficient, there are concerns that a defect may occur such that the TFT substrate 12 is deflected due to the load from the subject and the pixels 16 are damaged. By housing the radiation detector 10 inside the housing 120 made of a material having a bending modulus of elasticity of 10,000 MPa or more, it is possible to suppress the deflection of the TFT substrate 12 due to the load from the subject.

A sheet 116 is further provided on a side from which the radiation transmitted through the radiation detector 10 is emitted, within the housing 120 of the radiographic imaging apparatus 1 illustrated in FIG. 16. The sheet 116 is, for example, a copper sheet. The copper sheet does not easily generate secondary radiation due to incident radiation, and therefore, has a function of preventing scattering backward, that is, the conversion layer 14 side. In addition, it is preferable that the sheet 116 covers at least an entire surface of the conversion layer 14 from which radiation is emitted, and covers the entire conversion layer 14.

Additionally, a protective layer 117 is further provided on a side (imaging surface 120A side) on which radiation is incident, within the housing 120 of the radiographic imaging apparatus 1 illustrated in FIG. 16. As the protective layer 117, moistureproof films, such as an ALPET (registered trademark) sheet obtained, a Parylene (registered trademark) film, and an insulating sheet (film), such as polyethylene terephthalate, can be applied. The protective layer 117 has a moistureproof function and an antistatic function with respect to the pixel array 31. For that reason, it is preferable that the protective layer 117 covers at least the entire surface of the pixel array 31 on the side on which radiation is incident, and it is preferable to cover the entire surface of the TFT substrate 12 on the side on which radiation is incident.

In addition, although FIG. 16 illustrates a form in which both the power source unit 108 and the control board 110 are provided on one side of the radiation detector 10, specifically, on one side of a rectangular pixel array 31, a position where the power source unit 108 and the control board 110 are provided is not limited to the form illustrated in FIG. 16. For example, the power source unit 108 and the control board 110 may be provided so as to be respectively distributed onto two facing sides of the pixel array 31 or may be provided so as to be respectively distributed onto two adjacent sides.

Figure 17:
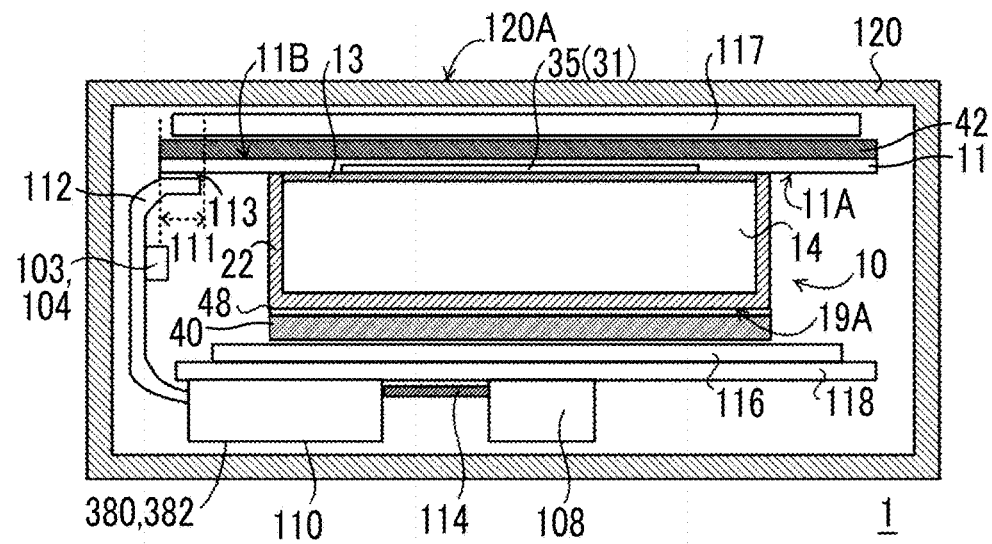
FIG. 17 is a cross-sectional view illustrating a cross section of another example of the radiographic imaging apparatus to which the radiation detector of the embodiment is applied.

Additionally, a cross-sectional view of another example in a state where the radiation detector 10 of the first embodiment is applied to the ISS type radiographic imaging apparatus 1 is illustrated in FIG. 17.

As illustrated in FIG. 17, the power source unit 108 and the control board 110 are provided side by side in the direction intersecting the incidence direction of radiation within the housing 120, and the radiation detector 10, the power source unit 108, and the control board 110 are provided side by side in the incidence direction of radiation.

Additionally, in the radiographic imaging apparatus 1 illustrated in FIG. 17, a base 118 that supports the radiation detector 10 and the control board 110 is provided between the control board 110 and the power source unit 108, and the sheet 116. For example, carbon or the like is used for the base 118.

Other Embodiments

First, another embodiment of the first reinforcing substrate 40 will be described with reference to FIGS. 18 to 44. In addition, in a case where the conversion layer 14 is formed by the vapor-phase deposition method, as illustrated in FIGS. 18 to 39, the conversion layer 14 of the present embodiment is formed with an inclination such that the thickness thereof gradually decreases toward an outer edge thereof. In the following, a central region of the conversion layer 14 where the thickness in a case where manufacturing errors and measurement errors are neglected can be considered to be substantially constant is referred to as a central part 14A. Additionally, an outer peripheral region of the conversion layer 14 having a thickness of, for example, 90% or less of the average thickness of the central part 14A of the conversion layer 14 is referred to as a peripheral edge part 14B. That is, the conversion layer 14 has an inclined surface that is inclined with respect to the TFT substrate 12 at the peripheral edge part 14B.

As illustrated in FIGS. 18 to 39, a pressure sensitive adhesive layer 60, a reflective layer 62, an adhesive layer 64, a protective layer 65, and the pressure sensitive adhesive layer 48 may be provided between the conversion layer 14 and the first reinforcing substrate 40.

The pressure sensitive adhesive layer 60 covers the entire surface of the conversion layer 14 including the central part 14A and the peripheral edge part 14B of the conversion layer 14. The pressure sensitive adhesive layer 60 has a function of fixing the reflective layer 62 to the conversion layer 14. The pressure sensitive adhesive layer 60 preferably has optical transmittance. As materials of the pressure sensitive adhesive layer 60, for example, an acrylic pressure sensitive adhesive, a hot melt pressure sensitive adhesive, and a silicone adhesive can be used. Examples of the acrylic pressure sensitive adhesive include urethane acrylate, acrylic resin acrylate, epoxy acrylate, and the like. Examples of the hot-melt pressure sensitive adhesive include thermoplastics, such as ethylene-vinyl acetate copolymer resin (EVA), ethylene-acrylate copolymer resin (EAA), ethylene-ethyl acrylate copolymer resin (EEA), and ethylene-methyl methacrylate copolymer (EMMA). The thickness of the pressure sensitive adhesive layer 60 is preferably 2 μm or more and 7 μm or less. By setting the thickness of the pressure sensitive adhesive layer 60 to 2 μm or more, the effect of fixing the reflective layer 62 on the conversion layer 14 can be sufficiently exhibited. Moreover, the risk of forming an air layer between the conversion layer 14 and the reflective layer 62 can be suppressed. When an air layer is formed between the conversion layer 14 and the reflective layer 62, there is a concern that multiple reflections may be caused in which the light emitted from the conversion layer 14 repeats reflections between the air layer and the conversion layer 14 and between the air layer and the reflective layer 62. Additionally, by setting the thickness of the pressure sensitive adhesive layer 60 to 7 μm or less, it is possible to suppress a decrease in modulation transfer function (MTF) and detective quantum efficiency (DQE).

The reflective layer 62 covers the entire surface of the pressure sensitive adhesive layer 60. The reflective layer 62 has a function of reflecting the light converted by the conversion layer 14. The reflective layer 62 is preferably made of an organic material. As the materials of the reflective layer 62, for example, white PET, $TiO_2$, $Al_2O_3$, foamed white PET, polyester-based high-reflection sheet, specular reflection aluminum, and the like can be used. The thickness of the reflective layer 62 is preferably 10 μm or more and 40 μm or less.

The adhesive layer 64 covers the entire surface of the reflective layer 62. The end part of the adhesive layer 64 extends to the surface of the TFT substrate 12. That is, the adhesive layer 64 adheres to the TFT substrate 12 at the end part thereof. The adhesive layer 64 has a function of fixing the reflective layer 62 and the protective layer 65 to the conversion layer 14. As the material of the adhesive layer 64, the same material as the material of the pressure sensitive adhesive layer 60 can be used, but the adhesive force of the adhesive layer 64 is preferably larger than the adhesive force of the pressure sensitive adhesive layer 60.

The protective layer 65 has a function equivalent to the protective layer 22 in the radiation detector 10 of each of the above-described embodiments and covers the entire surface of the adhesive layer 64. That is, the protective layer 65 is provided so as to cover the entire conversion layer 14 and covers a part of the TFT substrate 12 with the end part thereof. The protective layer 65 functions as a moistureproof film that prevents moisture from entering the conversion layer 14. As the material of the protective layer 65, for example, an organic film containing an organic material such as PET, PPS, OPP, PEN, or PI can be used. Additionally, as the protective layer 65, an Alpet (registered trademark) sheet may be used.

The first reinforcing substrate 40 is provided on the surface of the protective layer 65 via the pressure sensitive adhesive layer 48. As the material of the pressure sensitive adhesive layer 48, for example, it is possible to use the same material as the material of the pressure sensitive adhesive layer 60 and the pressure sensitive adhesive layer 48.

Figure 18:
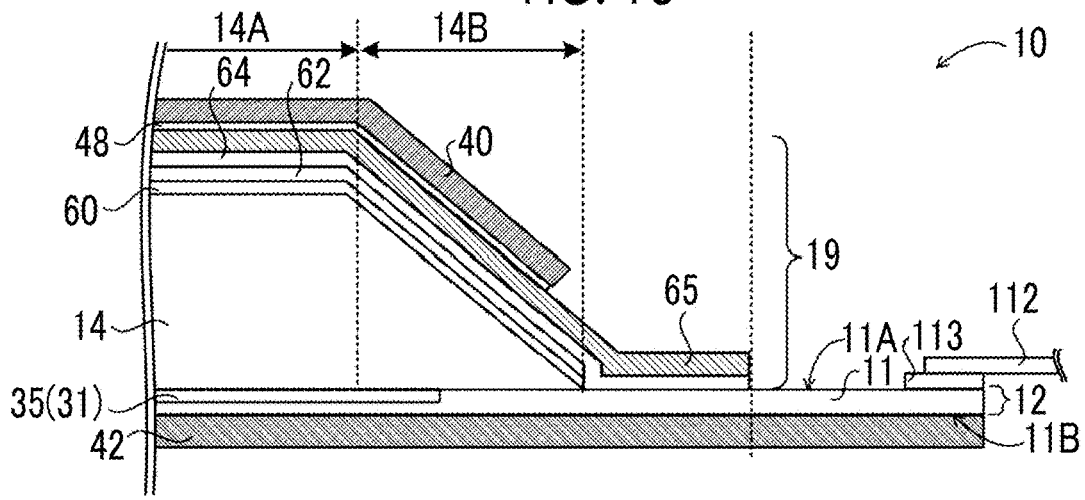
FIG. 18 is a cross-sectional view illustrating an example of a configuration of a radiation detector according to an embodiment of the disclosed technique.

In the example illustrated in FIG. 18, the first reinforcing substrate 40 extends to regions corresponding to the central part 14A and the peripheral edge part 14B of the conversion layer 14, and an outer peripheral part of the first reinforcing substrate 40 is bent along the inclination at the peripheral edge part 14B of the conversion layer 14. The first reinforcing substrate 40 adheres to the protective layer 65 via the pressure sensitive adhesive layer 48 in both a region corresponding to the central part 14A of the conversion layer 14 and a region corresponding to the peripheral edge part 14B of the conversion layer 14. In the example illustrated in FIG. 18, the end part of the first reinforcing substrate 40 is disposed in the region corresponding to the peripheral edge part 14B of the conversion layer 14.

Figure 19:
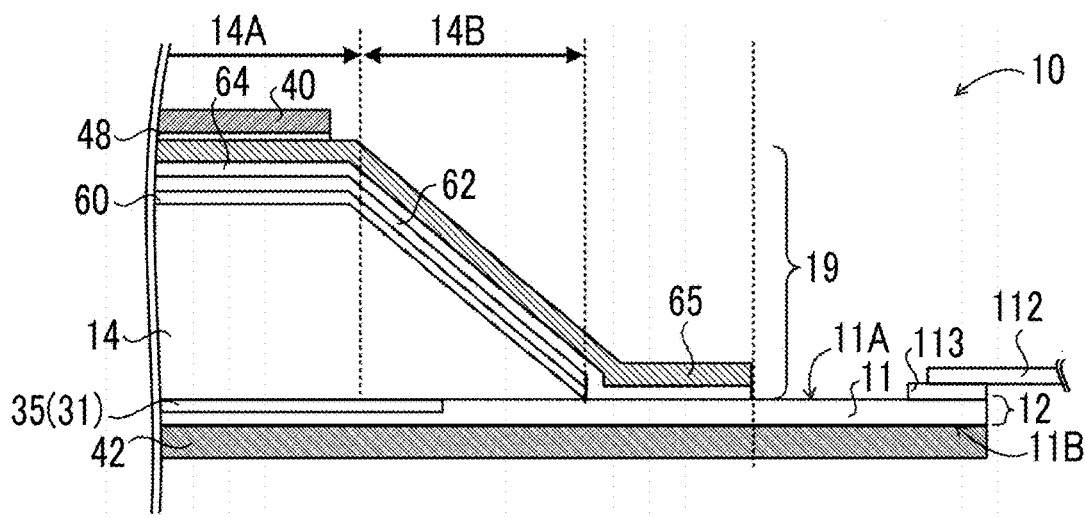
FIG. 19 is a cross-sectional view illustrating an example of a configuration of a radiation detector according to an embodiment of the disclosed technique.

As illustrated in FIG. 19, the first reinforcing substrate 40 may be provided only in the region corresponding to the central part 14A of the conversion layer 14. In this case, the first reinforcing substrate 40 adheres to the protective layer 65 via the pressure sensitive adhesive layer 48 in the region corresponding to the central part 14A of the conversion layer 14.

Figure 20:
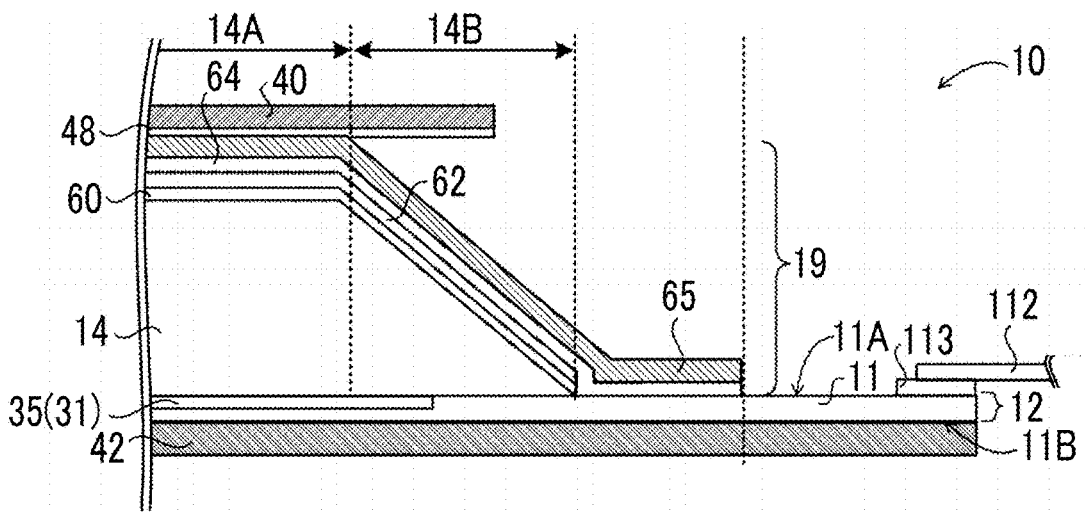
FIG. 20 is a cross-sectional view illustrating an example of a configuration of a radiation detector according to an embodiment of the disclosed technique.

As illustrated in FIG. 20, in a case where the first reinforcing substrate 40 extends to regions corresponding to the central part 14A and the peripheral edge part 14B of the conversion layer 14, the first reinforcing substrate 40 may not have a bent part extending along the inclination at an outer peripheral part of the conversion layer 142. In this case, the first reinforcing substrate 40 adheres to the protective layer 65 via pressure sensitive adhesive layer 48 in the region corresponding to the central part 14A of the conversion layer 14. In the region corresponding to the peripheral edge part 14B of the conversion layer 14, a space corresponding to the inclination of the peripheral edge part 14B of the conversion layer 14 is formed between the conversion layer 14 (protective layer 65) and the first reinforcing substrate 40.

Here, the flexible cable 112 is connected to the terminal 113 provided in a connection region of an outer peripheral part of the TFT substrate 12. The TFT substrate 12 is connected to a control board (the control board 110, refer to FIG. 51 or the like) via the flexible cable 112. In a case where deflection has occurred in the TFT substrate 12, the flexible cable 112 may be peeled off from the TFT substrate 12 or positional deviation may be caused. In this case, the work of resuming the connection between the flexible cable 112 and the TFT substrate 12 is required. The work of resuming the connection between the flexible cable 112 and the TFT substrate 12 is referred to as the reworking as described above. As illustrated in FIGS. 18 to 20, by disposing the end part of the first reinforcing substrate 40 inside the end part of the conversion layer 14, the reworking can be easily performed compared to a case where the first reinforcing substrate 40 extends to the vicinity of the connection region.

As illustrated in FIGS. 21 to 24B, the first reinforcing substrate 40 may be provided such that the end part thereof is disposed outside the end part of the conversion layer 14 and is aligned with the end parts of the adhesive layer 64 and the protective layer 65 extending onto the TFT substrate 12. In addition, it is not necessary that the position of the end part of the first reinforcing substrate 40 and the positions of the end parts of the adhesive layer 64 and the protective layer 65 completely coincide with each other.

In the example illustrated in FIG. 21, the first reinforcing substrate 40 adheres to the protective layer 65 via the pressure sensitive adhesive layer 48 in the region corresponding to the central part 14A of the conversion layer 14. Additionally, a space corresponding to the inclination of the peripheral edge part 14B of the conversion layer 14 is formed between the conversion layer 14 (protective layer 65) and the first reinforcing substrate 40 in the region corresponding to the peripheral edge part 14B of the conversion layer 14 and a region further outside thereof.

In the example illustrated in FIG. 22, a filler 70 is provided in a space formed between the conversion layer 14 (protective layer 65) and the first reinforcing substrate 40 in the region corresponding to the peripheral edge part 14B of the conversion layer 14 and the region further outside thereof. The material of the filler 70 is not particularly limited, and for example, a resin can be used. In addition, in the example illustrated in FIG. 22, in order to fix the first reinforcing substrate 40 to the filler 70, the pressure sensitive adhesive layer 48 is provided in the entire region between the first reinforcing substrate 40 and the filler 70.

The method of forming the filler 70 is not particularly limited. For example, the pressure sensitive adhesive layer 48 and the first reinforcing substrate 40 are sequentially formed on the conversion layer 14 covered with the pressure sensitive adhesive layer 60, the reflective layer 62, the adhesive layer 64, and the protective layer 65, and then the filler 70 having fluidity may be injected into the space formed between the conversion layer 14 (protective layer 65) and the first reinforcing substrate 40 to harden the filler 70. Additionally, for example, after the conversion layer 14, the pressure sensitive adhesive layer 60, the reflective layer 62, the adhesive layer 64, and the protective layer 65 are sequentially formed on the TFT substrate 12, the filler 70 may be formed, and the pressure sensitive adhesive layer 48 and the first reinforcing substrate 40 may be sequentially formed in a state where the conversion layer 14 covered with the pressure sensitive adhesive layer 60, the reflective layer 62, the adhesive layer 64, and the protective layer 65 and the filler 70 are covered.

By filling the space formed between the conversion layer 14 (protective layer 65) and the first reinforcing substrate 40 with the filler 70 in this way, it is possible to suppress the peeling of the first reinforcing substrate 40 from the conversion layer 14 (protective layer 65) compared to the form illustrated in FIG. 21. Moreover, since the conversion layer 14 has a structure of being fixed to the TFT substrate 12 by both the first reinforcing substrate 40 and the filler 70, it is possible to suppress the peeling of the conversion layer 14 from the TFT substrate 12.

In the example illustrated in FIG. 23, the outer peripheral part of the first reinforcing substrate 40 is bent along the inclination of the peripheral edge part 14B of the conversion layer 14, and the adhesive layer 64 and the protective layer 65 also cover a portion covering the TFT substrate 12. Additionally, the end part of the first reinforcing substrate 40 is aligned with the end parts of the adhesive layer 64 and the protective layer 65. In addition, it is not necessary that the position of the end part of the first reinforcing substrate 40 and the positions of the end parts of the adhesive layer 64 and the protective layer 65 completely coincide with each other.

The end parts of the first reinforcing substrate 40, the pressure sensitive adhesive layer 48, the protective layer 65, and the adhesive layer 64 are sealed with a sealing member 72. The sealing member 72 is preferably provided in a region that extends from the surface of the TFT substrate 12 to the surface of the first reinforcing substrate 40 and does not cover the pixel region 35. A resin can be used as the material of the sealing member 72, and a thermoplastic resin is particularly preferable. Specifically, acrylic glue, urethane glue, or the like can be used as the sealing member 72. The first reinforcing substrate 40 has a higher stiffness than the protective layer 65, and a restoring force that tries to eliminate bending acts on a bent part of the first reinforcing substrate 40. Accordingly, there is a concern that the protective layer 65 may be peeled off. By sealing the end parts of the first reinforcing substrate 40, the pressure sensitive adhesive layer 48, the protective layer 65, and the adhesive layer 64 with the sealing member 72, it is possible to suppress the peeling of the protective layer 65.

Figure 24A:
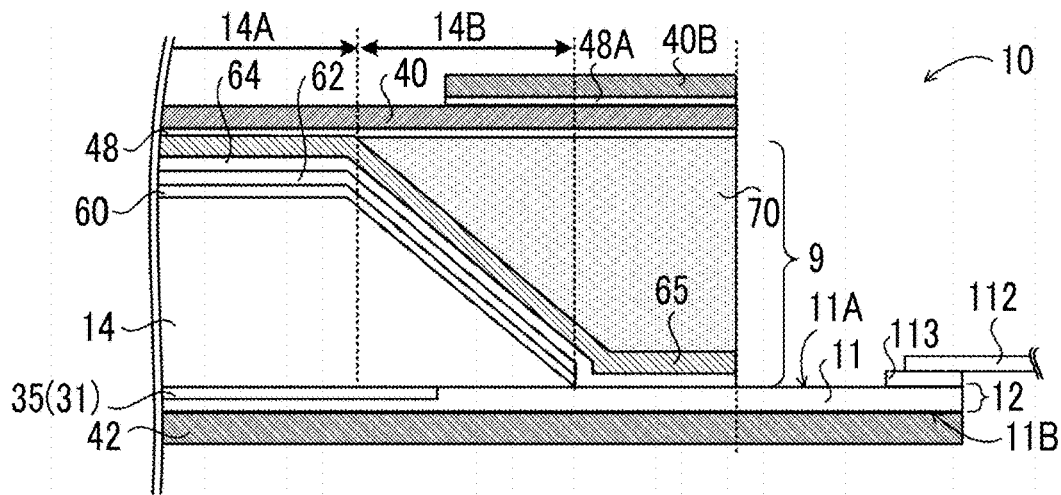
FIG. 24A is a cross-sectional view illustrating an example of a configuration of a radiation detector according to an embodiment of the disclosed technique.
Figure 24B:
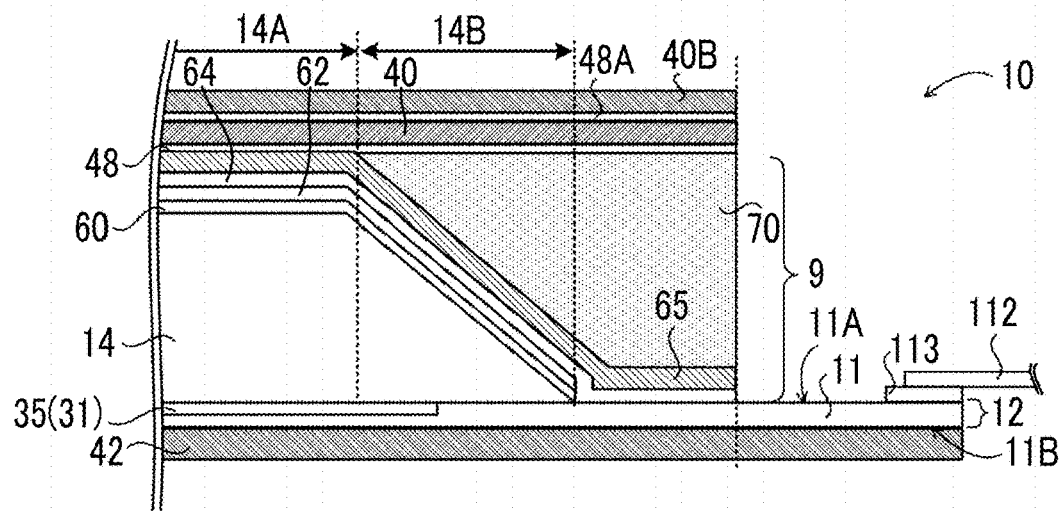
FIG. 24B is a cross-sectional view illustrating an example of a configuration of a radiation detector according to an embodiment of the disclosed technique.

FIGS. 24A and 24B illustrate a form in which still another first reinforcing substrate 40B is laminated on the surface of the first reinforcing substrate 40 in a region corresponding to the end part of the conversion layer 14. In the example illustrated in FIG. 24A, similarly to the form illustrated in FIG. 22, the filler 70 is provided in the space formed between the conversion layer 14 (protective layer 65) and the first reinforcing substrate 40 in the region corresponding to the peripheral edge part 14B of the conversion layer 14 and the region further outside thereof. Additionally, still another first reinforcing substrate 40B is laminated on the surface of the first reinforcing substrate 40 via the pressure sensitive adhesive layer 48A in the region corresponding to the end part of the conversion layer 14. More specifically, the first reinforcing substrate 40B is provided in a region straddling the end part (outer edge, edge) of the conversion layer 14. The first reinforcing substrate 40B may be made of the same material as the first reinforcing substrate 40.

FIG. 24B is an example of the radiation detector 10 having the form illustrated in FIG. 24A in which the first reinforcing substrate 40B extends from the end part of the conversion layer 14 to the central part 14A thereof. In addition, the first reinforcing substrate 40B illustrated in FIG. 24B is provided over the entire surface of the first reinforcing substrate 40. In a case where the material of the first reinforcing substrate 40B is a material such as carbon that absorbs less radiation, it is possible to suppress that the radiation R reaching the conversion layer 14 decreases because the radiation R is absorbed by the first reinforcing substrate 40B in any of the PSS type and the ISS type. In addition, in any case of FIGS. 24A and 24B, the bending modulus of elasticity of the first reinforcing substrate 40B is preferably larger than the bending modulus of elasticity of each of the first reinforcing substrate 40 and the second reinforcing substrate 42. A preferable specific example of the bending modulus of elasticity of the first reinforcing substrate 40B is 8,000 MPa or more.

In the radiation detector 10, the amount of deflection of the TFT substrate 12 is relatively large at the end part of the conversion layer 14. In the radiation detector 10 illustrated in FIGS. 24A and 24B, the effect of suppressing the deflection of the TFT substrate 12 at the end part of the conversion layer 14 can be promoted by forming a laminated structure with the first reinforcing substrates 40 and 40B in the region corresponding to the end part of the conversion layer 14.

As illustrated in FIGS. 21 to 24B, even in a case where the end part of the first reinforcing substrate 40 is disposed outside the end part of the conversion layer 14 and is provided in the state of being aligned with the end parts of the adhesive layer 64 and the protective layer 65, the reworking can be easily performed compared to a case where the first reinforcing substrate 40 extends to the vicinity of the connection region.

Additionally, as illustrated in FIGS. 25 to 28B, the end part of the first reinforcing substrate 40 may be provided to be located outside the end parts of the adhesive layer 64 and the protective layer 65 extending onto the TFT substrate 12 and inside the end part of the TFT substrate 12.

Figure 25:
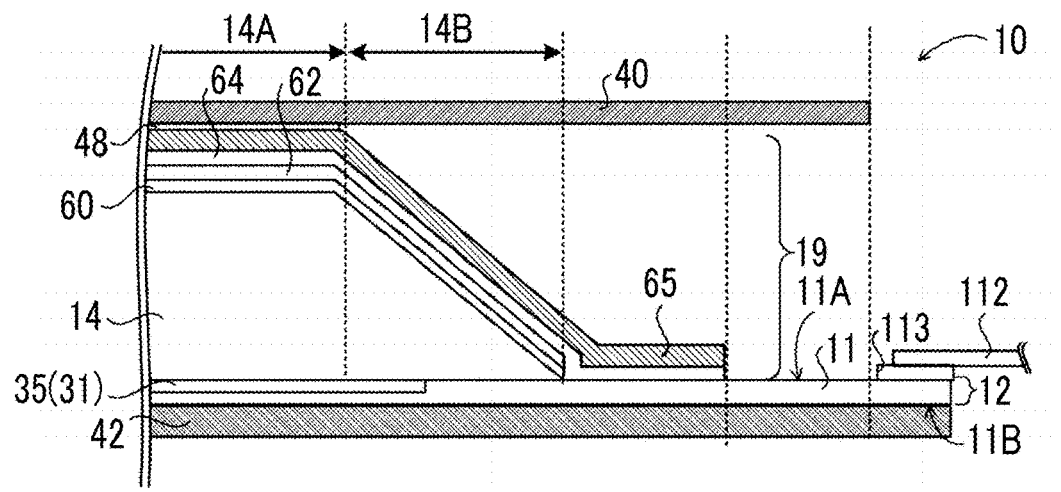
FIG. 25 is a cross-sectional view illustrating an example of a configuration of a radiation detector according to an embodiment of the disclosed technique.

In the example illustrated in FIG. 25, the first reinforcing substrate 40 adheres to the protective layer 65 via the pressure sensitive adhesive layer 48 in the region corresponding to the central part 14A of the conversion layer 14, and a space corresponding to the inclination of the peripheral edge part 14B of the conversion layer 14 is formed between the conversion layer 14 (protective layer 65) and the first reinforcing substrate 40 and between the TFT substrate 12 and the first reinforcing substrate 40, in the region corresponding to the peripheral edge part 14B of the conversion layer 14 and the region further outside thereof.

Figure 26:
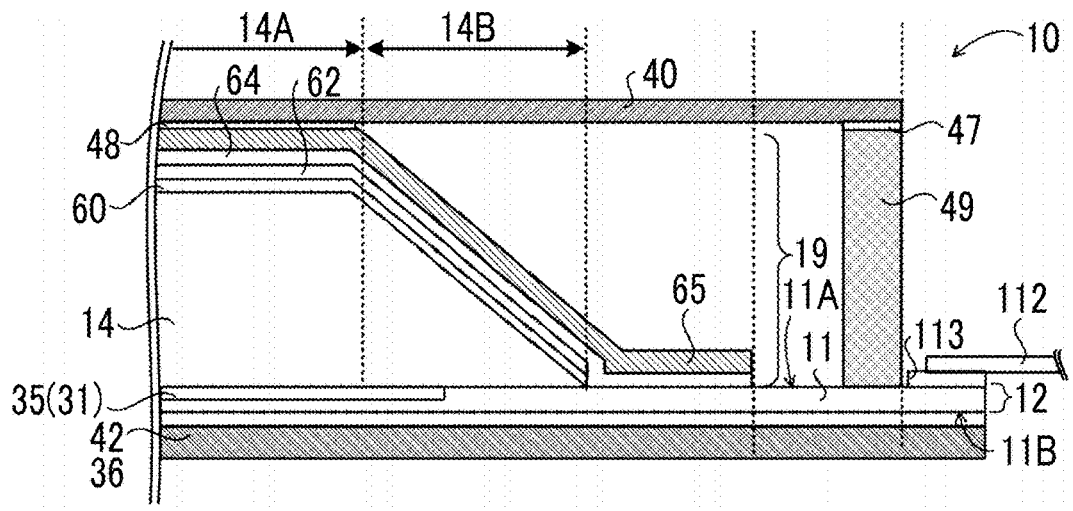
FIG. 26 is a cross-sectional view illustrating an example of a configuration of a radiation detector according to an embodiment of the disclosed technique.

In the example illustrated in FIG. 26, the end part of the first reinforcing substrate 40 is supported by the spacer 49. That is, one end of the spacer 49 is connected to the first surface 11A of the base material 11 of the TFT substrate 12, and the other end of the spacer 49 is connected to the end part of the first reinforcing substrate 40 via the adhesive layer 47. By supporting the end part of the first reinforcing substrate 40 extending while forming the space with the TFT substrate 12 by the spacer 49, it is possible to suppress the peeling of the first reinforcing substrate 40. Additionally, the deflection suppressing effect of the first reinforcing substrate 40 can be applied to the vicinity of the end part of the TFT substrate 12. In addition, instead of providing the spacer 49 or in addition to providing the spacer 49, in imitation of the example illustrated in FIG. 22, a filler may be filled into the space formed between the conversion layer 14 (protective layer 65) and the first reinforcing substrate 40 and between the TFT substrate 12 and the first reinforcing substrate 40.

Figure 27:
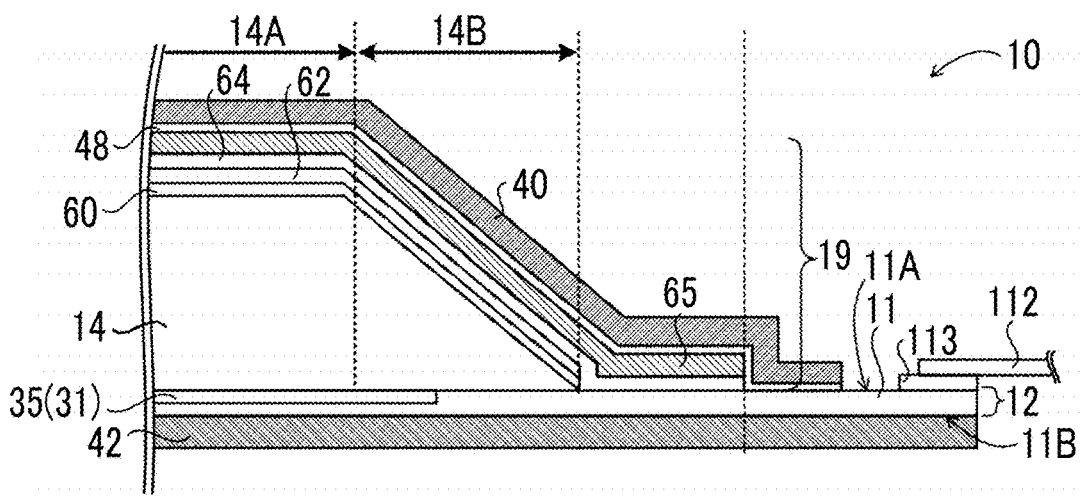
FIG. 27 is a cross-sectional view illustrating an example of a configuration of a radiation detector according to an embodiment of the disclosed technique.

In the example illustrated in FIG. 27, the outer peripheral part of the first reinforcing substrate 40 is bent along the inclination of the peripheral edge part 14B of the conversion layer 14, and the adhesive layer 64 and the protective layer 65 also cover a portion covering the TFT substrate 12 and the TFT substrate 12 outside thereof. That is, the end parts of the adhesive layer 64 and the protective layer 65 are sealed with the first reinforcing substrate 40. The portion of the first reinforcing substrate 40 extending onto the TFT substrate 12 adheres to the TFT substrate 12 via the pressure sensitive adhesive layer 48. By covering the end parts of the adhesive layer 64 and the protective layer 65 with the first reinforcing substrate 40 in this way, it is possible to suppress the peeling of the protective layer 65. In addition, in imitation of the example described in FIG. 23, the end part of the first reinforcing substrate 40 may be sealed by using the sealing member 72.

Figure 28A:
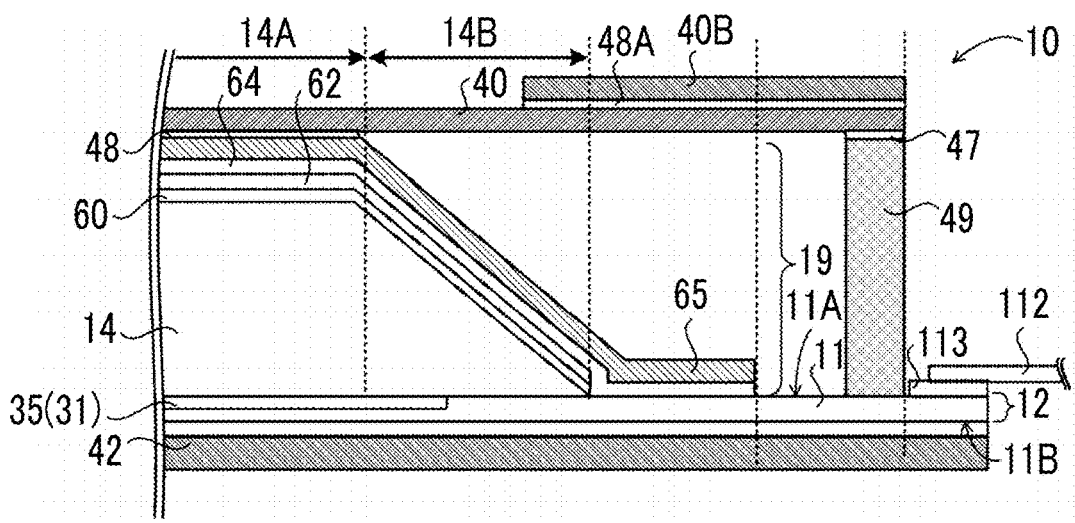
FIG. 28A is a cross-sectional view illustrating an example of a configuration of a radiation detector according to an embodiment of the disclosed technique.
Figure 28B:
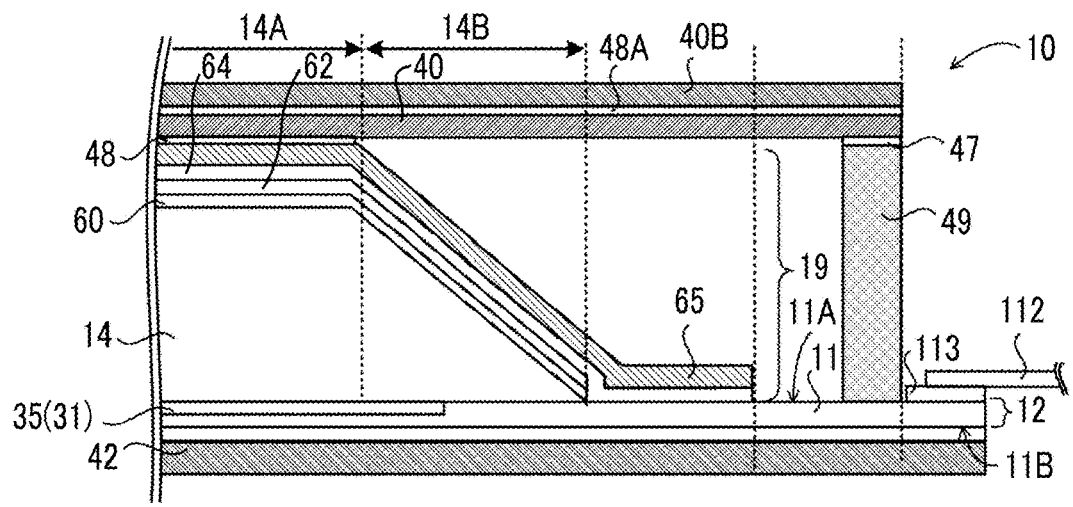
FIG. 28B is a cross-sectional view illustrating an example of a configuration of a radiation detector according to an embodiment of the disclosed technique.

FIGS. 28A and 28B illustrate a form in which still another first reinforcing substrate 40B is laminated on the surface of the first reinforcing substrate 40 in the region corresponding to the end part of the conversion layer 14. In the example illustrated in FIG. 28A, still another first reinforcing substrate 40B is laminated via the pressure sensitive adhesive layer 48A in the region, on the surface of the first reinforcing substrate 40, corresponding to the end part of the conversion layer 14 in the form in which the end part of the first reinforcing substrate 40 is supported by the spacer 49. More specifically, the first reinforcing substrate 40B is provided in a region straddling the end part (outer edge, edge) of the conversion layer 14. The first reinforcing substrate 40B may be made of the same material as the first reinforcing substrate 40.

FIG. 28B is an example of the radiation detector 10 having the form illustrated in FIG. 28A in which the first reinforcing substrate 40B extends from the end part of the conversion layer 14 to the central part 14A thereof. In addition, the first reinforcing substrate 40B illustrated in FIG. 28B is provided over the entire surface of the first reinforcing substrate 40. In a case where the material of the first reinforcing substrate 40B is a material such as carbon that absorbs less radiation, it is possible to suppress that the radiation R reaching the conversion layer 14 decreases because the radiation R is absorbed by the first reinforcing substrate 40B in any of the PSS type and the ISS type. In addition, in any case of FIGS. 28A and 28B, the bending modulus of elasticity of the first reinforcing substrate 40B is preferably larger than the bending modulus of elasticity of each of the first reinforcing substrate 40 and the second reinforcing substrate 42. A preferable specific example of the bending modulus of elasticity of the first reinforcing substrate 40B is 8,000 MPa or more.

In the radiation detector 10, the amount of deflection of the TFT substrate 12 at the end part of the conversion layer 14 is relatively large. In the radiation detector 10 illustrated in FIGS. 28A and 28B, the effect of suppressing the deflection of the TFT substrate 12 at the end part of the conversion layer 14 can be promoted by forming a laminated structure with the first reinforcing substrates 40 and 40B in the region corresponding to the end part of the conversion layer 14. In addition, instead of providing the spacer 49 and in imitation of the example illustrated in FIG. 22, a filler 70 may be filled into the space formed between the conversion layer 14 (protective layer 65) and the first reinforcing substrate 40 and between the TFT substrate 12 and the first reinforcing substrate 40.

In addition, as illustrated in FIGS. 29 to 33B, the first reinforcing substrate 40 may be provided such that the end part thereof is aligned with the end parts of the TFT substrate 12 except for the region corresponding to the terminal region 111 of the TFT substrate 12. In addition, it is not necessary that the position of the end part of the first reinforcing substrate 40 and the position of the end part of the TFT substrate 12 completely coincide with each other.

Figure 29:
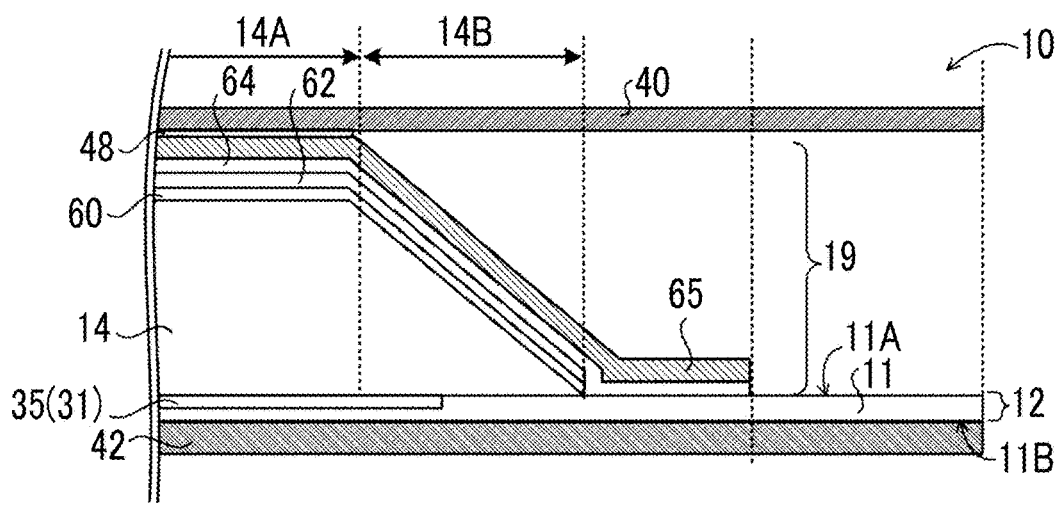
FIG. 29 is a cross-sectional view illustrating an example of a configuration of a radiation detector according to an embodiment of the disclosed technique.

In the example illustrated in FIG. 29, the first reinforcing substrate 40 adheres to the protective layer 65 via the pressure sensitive adhesive layer 48 in the region corresponding to the central part 14A of the conversion layer 14. A space corresponding to the inclination of the peripheral edge part 14B of the conversion layer 14 is formed between the conversion layer 14 (protective layer 65) and the first reinforcing substrate 40 and between the TFT substrate 12 and the first reinforcing substrate 40 in the region corresponding to the peripheral edge part 14B of the conversion layer 14 and the region further outside thereof.

Figure 30:
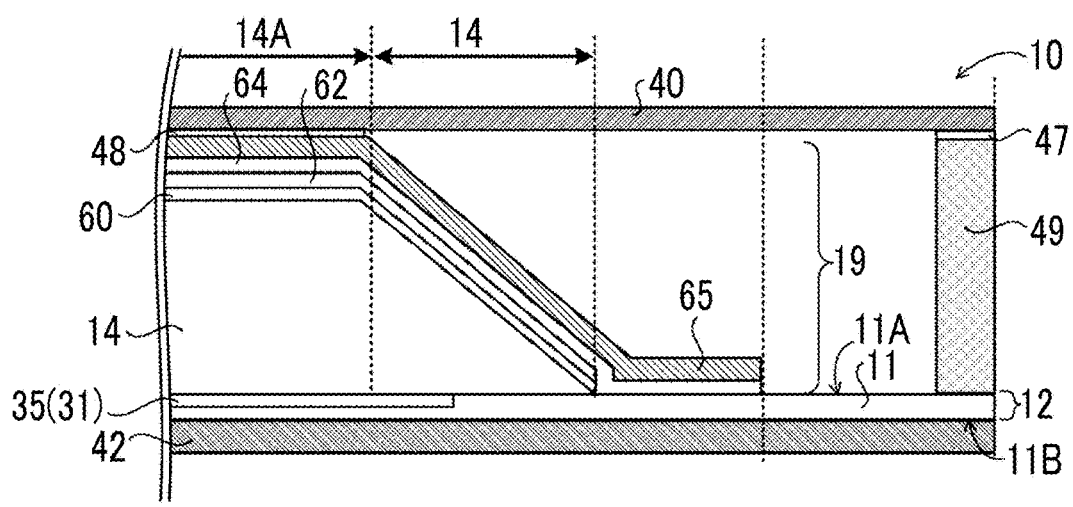
FIG. 30 is a cross-sectional view illustrating an example of a configuration of a radiation detector according to an embodiment of the disclosed technique.

In the example illustrated in FIG. 30, the end part of the first reinforcing substrate 40 is supported by the spacer 49. That is, one end of the spacer 49 is connected to the flexible cable 112 provided at the end part of the TFT substrate 12, and the other end of the spacer 49 is connected to the end part of the first reinforcing substrate 40 via the adhesive layer 47. By supporting the end part of the first reinforcing substrate 40 extending while forming the space with the TFT substrate 12 by the spacer 49, it is possible to suppress the peeling of the first reinforcing substrate 40. Additionally, the deflection suppressing effect of the first reinforcing substrate 40 can be applied to the vicinity of the end part of the TFT substrate 12.

Figure 31:
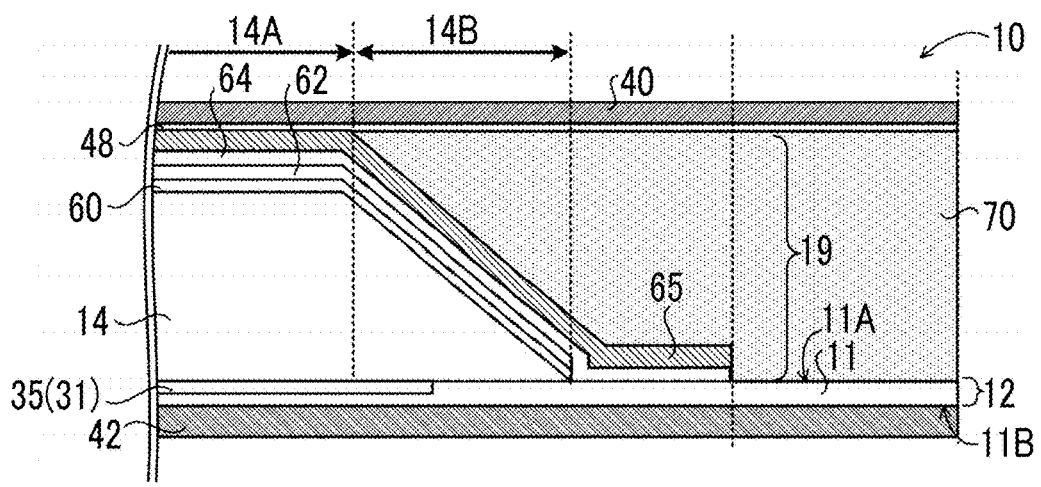
FIG. 31 is a cross-sectional view illustrating an example of a configuration of a radiation detector according to an embodiment of the disclosed technique.

In the example illustrated in FIG. 31, the filler 70 may be filled into the space formed between the conversion layer 14 (protective layer 65) and the first reinforcing substrate 40 and between the TFT substrate 12 and the first reinforcing substrate 40. In the present embodiment, a connection part between the flexible cable 112 and the terminal 113 is covered with the filler 70. By filling the space formed between the conversion layer 14 (protective layer 65) and the first reinforcing substrate 40 and between the TFT substrate 12 and the first reinforcing substrate 40 with the filler 70 in this way, it is possible to suppress the peeling of the first reinforcing substrate 40 from the conversion layer 14 (protective layer 65) compared to the form illustrated in FIG. 29. Moreover, since the conversion layer 14 has a structure of being fixed to the TFT substrate 12 by both the first reinforcing substrate 40 and the filler 70, it is possible to suppress the peeling of the conversion layer 14 from the TFT substrate 12. Additionally, since the connection part between the flexible cable 112 and the terminal 113 is covered with the filler 70, it is possible to suppress the peeling of the flexible cable 112.

Figure 32:
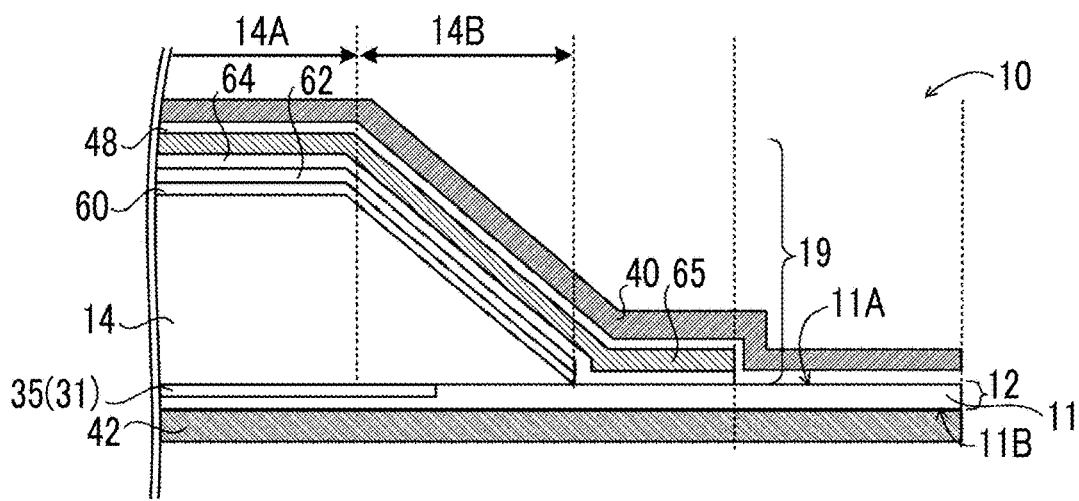
FIG. 32 is a cross-sectional view illustrating an example of a configuration of a radiation detector according to an embodiment of the disclosed technique.

In the example illustrated in FIG. 32, the outer peripheral part of the first reinforcing substrate 40 is bent in a state where the outer peripheral part extends along the inclination of the peripheral edge part 14B of the conversion layer 14, and the adhesive layer 64 and the protective layer 65 also cover the portion covering the TFT substrate 12, the substrate outside thereof, and the connection part between the terminal 113 and the flexible cable 112. The portions of the first reinforcing substrate 40 extending onto the TFT substrate 12 and the flexible cable 112 respectively adhere to the TFT substrate 12 and the flexible cable 112 via the pressure sensitive adhesive layer 48. Since the connection part between the flexible cable 112 and the terminal 113 is deflected and covered with the first reinforcing substrate 40, it is possible to suppress the peeling of the flexible cable 112. Additionally, since it is assumed that the control board on which electronic components are mounted is connected to the other end of the flexible cable 112, there is a concern that the TFT substrate 12 may be relatively largely deflected at the connection part between the flexible cable 112 and the terminal 113. By covering the connection part between the flexible cable 112 and the terminal 113 with the first reinforcing substrate 40, it is possible to suppress the deflection of the TFT substrate 12 in the portion.

Figure 33A:
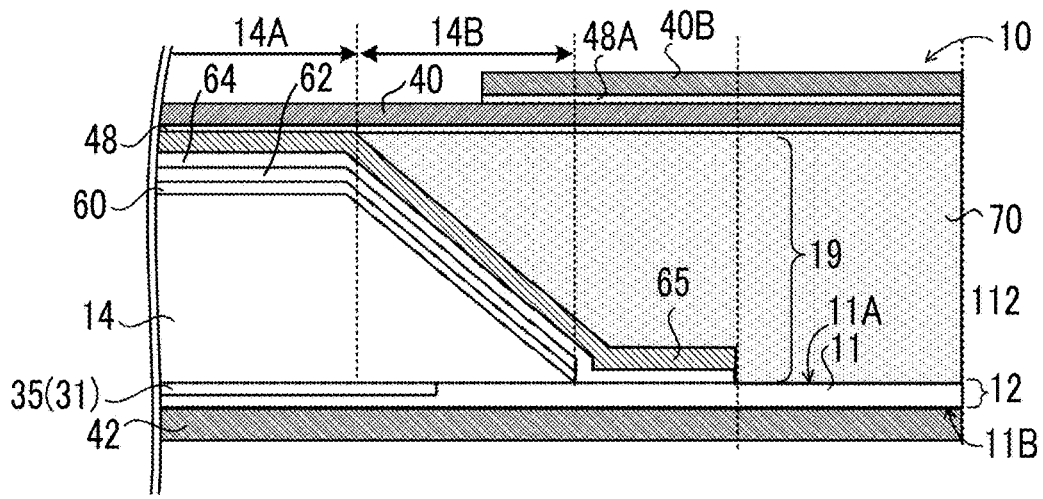
FIG. 33A is a cross-sectional view illustrating an example of a configuration of a radiation detector according to an embodiment of the disclosed technique.
Figure 33B:
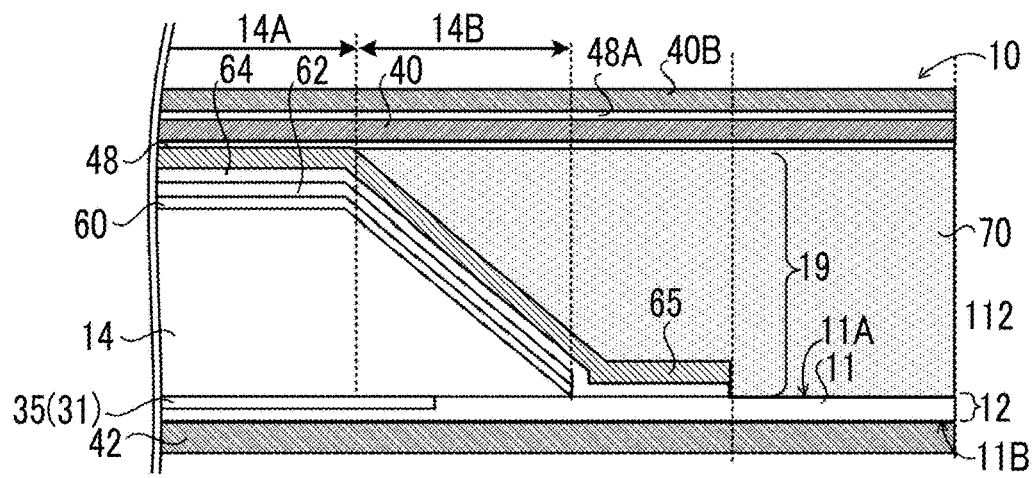
FIG. 33B is a cross-sectional view illustrating an example of a configuration of a radiation detector according to an embodiment of the disclosed technique.

FIGS. 33A and 33B illustrate a form in which still another first reinforcing substrate 40B is laminated on the surface of the first reinforcing substrate 40 in the region corresponding to the end part of the conversion layer 14. In the example illustrated in FIG. 33A, the filler 70 may be filled into the space formed between the conversion layer 14 (protective layer 65) and the first reinforcing substrate 40 and between the TFT substrate 12 and the first reinforcing substrate 40. Additionally, still another first reinforcing substrate 40B is laminated on the surface of the first reinforcing substrate 40 via the pressure sensitive adhesive layer 48A in the region corresponding to the end part of the conversion layer 14. More specifically, the first reinforcing substrate 40B is provided in a region straddling the end part (outer edge, edge) of the conversion layer 14. The first reinforcing substrate 40B may be made of the same material as the first reinforcing substrate 40.

FIG. 33B is an example of the radiation detector 10 having the form illustrated in FIG. 33A in which the first reinforcing substrate 40B extends from the end part of the conversion layer 14 to the central part 14A thereof. In addition, the first reinforcing substrate 40B illustrated in FIG. 33B is provided over the entire surface of the first reinforcing substrate 40. In a case where the material of the first reinforcing substrate 40B is a material such as carbon that absorbs less radiation, it is possible to suppress that the radiation R reaching the conversion layer 14 decreases because the radiation R is absorbed by the first reinforcing substrate 40B in any of the PSS type and the ISS type. In addition, in any case of FIGS. 33A and 33B, the bending modulus of elasticity of the first reinforcing substrate 40B is preferably larger than the bending modulus of elasticity of each of the first reinforcing substrate 40 and the second reinforcing substrate 42. A preferable specific example of the bending modulus of elasticity of the first reinforcing substrate 40B is 8,000 MPa or more.

In the radiation detector 10, the amount of deflection of the TFT substrate 12 is relatively large at the end part of the conversion layer 14. In the radiation detector 10 illustrated in FIGS. 33A and 33B, the effect of suppressing the deflection of the TFT substrate 12 at the end part of the conversion layer 14 can be promoted by forming a laminated structure with the first reinforcing substrates 40 and 40B in the region corresponding to the end part of the conversion layer 14.

Additionally, as illustrated in FIGS. 34 to 38B, the first reinforcing substrate 40 may be provided in a state where the end part thereof is located outside the end part of the TFT substrate 12.

Figure 34:
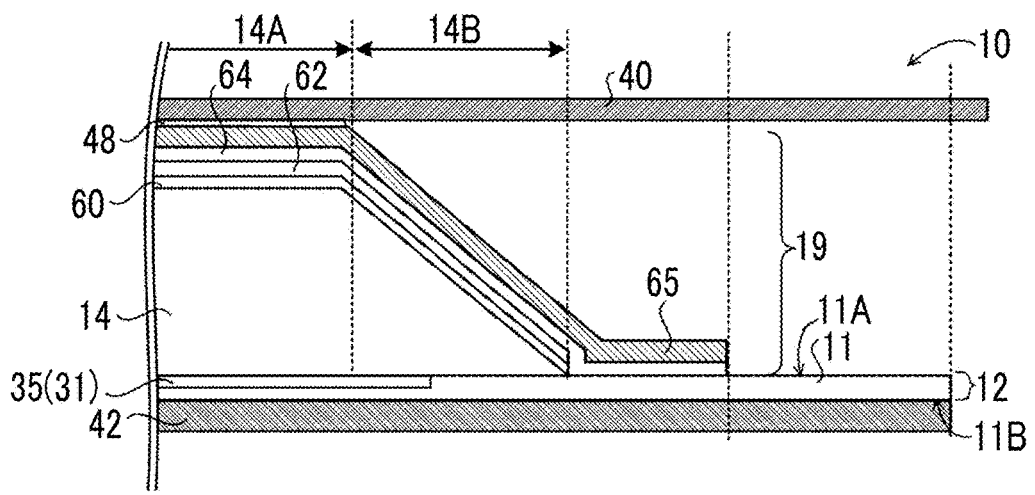
FIG. 34 is a cross-sectional view illustrating an example of a configuration of a radiation detector according to an embodiment of the disclosed technique.

In the example illustrated in FIG. 34, the first reinforcing substrate 40 adheres to the protective layer 65 via the pressure sensitive adhesive layer 48 in the region corresponding to the central part 14A of the conversion layer 14, and a space corresponding to the inclination of the peripheral edge part 14B of the conversion layer 14 is formed between the conversion layer 14 (protective layer 65) and the first reinforcing substrate 40 and between the TFT substrate 12 and the first reinforcing substrate 40, in the region corresponding to the peripheral edge part 14B of the conversion layer 14 and the region further outside thereof.

Figure 35:
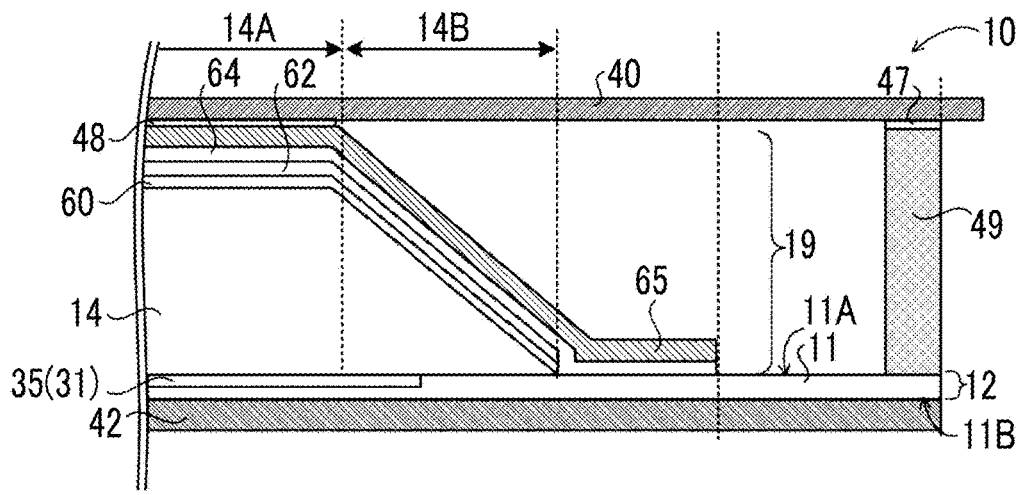
FIG. 35 is a cross-sectional view illustrating an example of a configuration of a radiation detector according to an embodiment of the disclosed technique.

In the example illustrated in FIG. 35, the end part of the first reinforcing substrate 40 is supported by the spacer 49. That is, one end of the spacer 49 is connected to the flexible cable 112 provided at the end part of the TFT substrate 12, and the other end of the spacer 49 is connected to the end part of the first reinforcing substrate 40 via the adhesive layer 47. By supporting the end part of the first reinforcing substrate 40 extending while forming the space with the TFT substrate 12 by the spacer 49, it is possible to suppress the peeling of the first reinforcing substrate 40. Additionally, the deflection suppressing effect of the first reinforcing substrate 40 can be applied to the vicinity of the end part of the TFT substrate 12.

Figure 36:
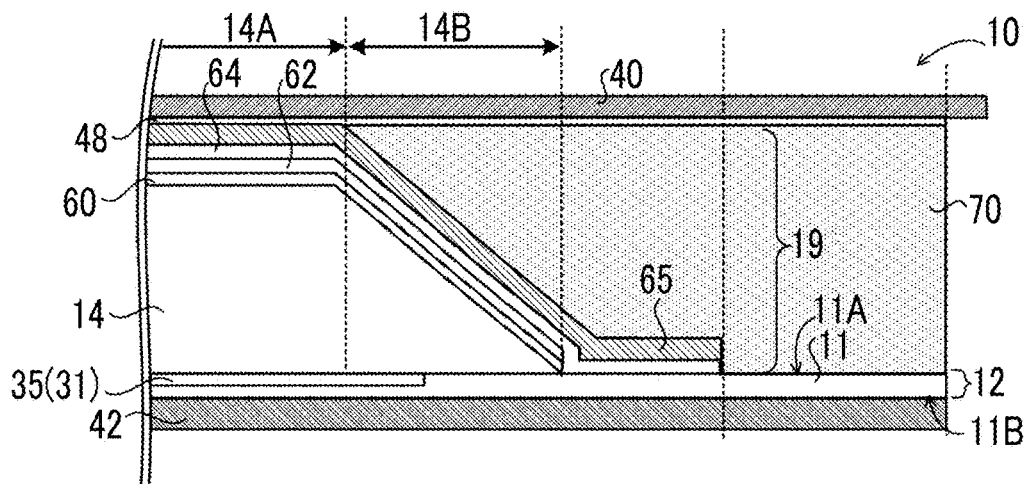
FIG. 36 is a cross-sectional view illustrating an example of a configuration of a radiation detector according to an embodiment of the disclosed technique.

In the example illustrated in FIG. 36, the filler 70 may be filled into the space formed between the conversion layer 14 (protective layer 65) and the first reinforcing substrate 40 and between the TFT substrate 12 and the first reinforcing substrate 40. In the present embodiment, a connection part between the flexible cable 112 and the terminal 113 is covered with the filler 70. By filling the space formed between the conversion layer 14 (protective layer 65) and the first reinforcing substrate 40 and between the TFT substrate 12 and the first reinforcing substrate 40 with the filler 70 in this way, it is possible to suppress the peeling of the first reinforcing substrate 40 from the conversion layer 14 (protective layer 65) compared to the form illustrated in FIG. 34. Moreover, since the conversion layer 14 has a structure of being fixed to the TFT substrate 12 by both the first reinforcing substrate 40 and the filler 70, it is possible to suppress the peeling of the conversion layer 14 from the TFT substrate 12. Additionally, since the connection part between the flexible cable 112 and the terminal 113 is covered with the filler 70, it is possible to suppress the peeling of the flexible cable 112.

Figure 37:
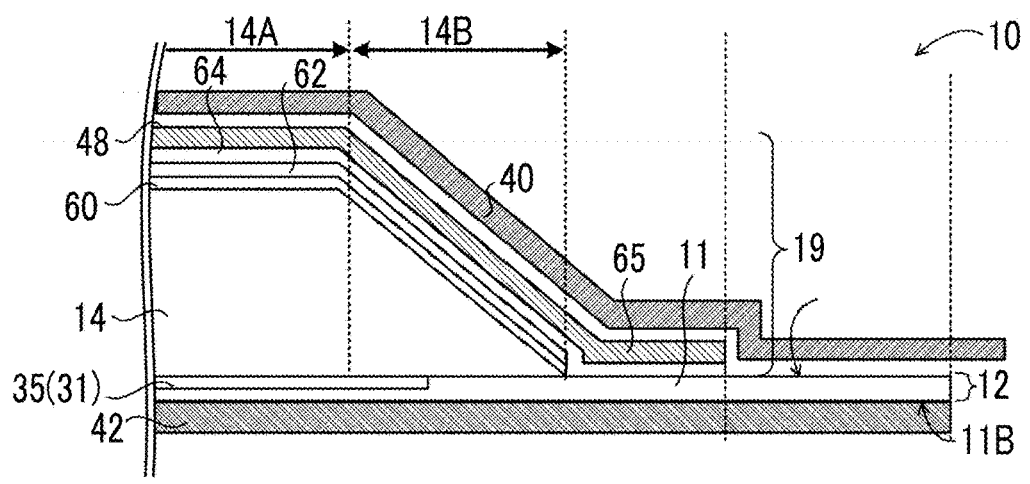
FIG. 37 is a cross-sectional view illustrating an example of a configuration of a radiation detector according to an embodiment of the disclosed technique.

In the example illustrated in FIG. 37, the outer peripheral part of the first reinforcing substrate 40 is bent in a state where the outer peripheral part extends along the inclination of the peripheral edge part 14B of the conversion layer 14, and the adhesive layer 64 and the protective layer 65 also cover the portion covering the TFT substrate 12, the substrate outside thereof, and the connection part between the terminal 113 and the flexible cable 112. The portions of the first reinforcing substrate 40 extending onto the TFT substrate 12 and the flexible cable 112 respectively adhere to the TFT substrate 12 and the flexible cable 112 via the pressure sensitive adhesive layer 48. Since the connection part between the flexible cable 112 and the terminal 113 is covered with the first reinforcing substrate 40, it is possible to suppress the peeling of the flexible cable 112. Additionally, since it is assumed that the control board on which electronic components are mounted is connected to the other end of the flexible cable 112, there is a concern that the TFT substrate 12 may be relatively largely deflected at the connection part between the flexible cable 112 and the terminal 113. By covering the connection part between the flexible cable 112 and the terminal 113 with the first reinforcing substrate 40, it is possible to suppress the deflection of the TFT substrate 12 in the portion.

Figure 38A:
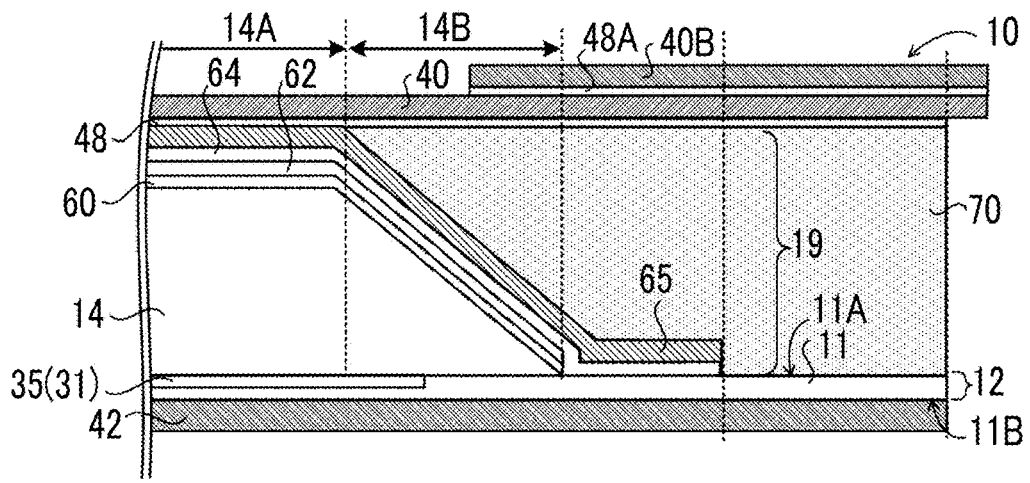
FIG. 38A is a cross-sectional view illustrating an example of a configuration of a radiation detector according to an embodiment of the disclosed technique.
Figure 38B:
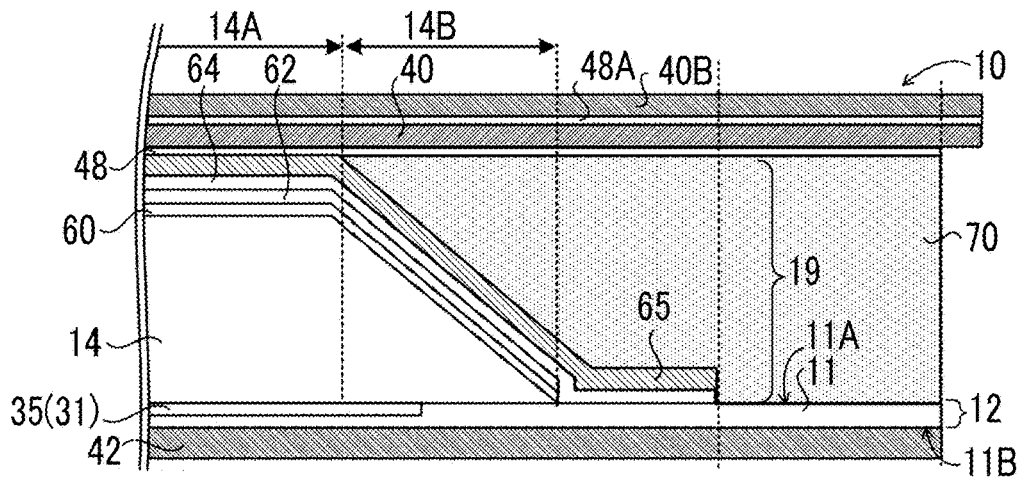
FIG. 38B is a cross-sectional view illustrating an example of a configuration of a radiation detector according to an embodiment of the disclosed technique.

FIGS. 38A and 38B illustrate a form in which still another first reinforcing substrate 40B is laminated on the surface of the first reinforcing substrate 40 in the region corresponding to the end part of the conversion layer 14. In the example illustrated in FIG. 38A, the filler 70 may be filled into the space formed between the conversion layer 14 (protective layer 65) and the first reinforcing substrate 40 and between the TFT substrate 12 and the first reinforcing substrate 40. Additionally, still another first reinforcing substrate 40B is laminated on the surface of the first reinforcing substrate 40 via the pressure sensitive adhesive layer 48A in the region corresponding to the end part of the conversion layer 14. More specifically, the first reinforcing substrate 40B is provided in a region straddling the end part (outer edge, edge) of the conversion layer 14. The first reinforcing substrate 40B may be made of the same material as the first reinforcing substrate 40.

FIG. 38B is an example of the radiation detector 10 having the form illustrated in FIG. 38A in which the first reinforcing substrate 40B extends from the end part of the conversion layer 14 to the central part 14A thereof. In addition, the first reinforcing substrate 40B illustrated in FIG. 38B is provided over the entire surface of the first reinforcing substrate 40. In a case where the material of the first reinforcing substrate 40B is a material such as carbon that absorbs less radiation, it is possible to suppress that the radiation R reaching the conversion layer 14 decreases because the radiation R is absorbed by the first reinforcing substrate 40B in any of the PSS type and the ISS type. In addition, in any case of FIGS. 38A and 38B, the bending modulus of elasticity of the first reinforcing substrate 40B is preferably larger than the bending modulus of elasticity of each of the first reinforcing substrate 40 and the second reinforcing substrate 42. A preferable specific example of the bending modulus of elasticity of the first reinforcing substrate 40B is 8,000 MPa or more.

In the radiation detector 10, the amount of deflection of the TFT substrate 12 is relatively large at the end part of the conversion layer 14. In the radiation detector 10 illustrated in FIGS. 38A and 38B, the effect of suppressing the deflection of the TFT substrate 12 at the end part of the conversion layer 14 can be promoted by forming a laminated structure with the first reinforcing substrates 40 and 40B in the region corresponding to the end part of the conversion layer 14.

As described above, in the manufacturing process of the radiation detector 10, the flexible TFT substrate 12 is bonded to the support body 400 such as a glass substrate, the conversion layer 14 is laminated on the TFT substrate 12, and then the support body 400 is peeled off from the TFT substrate 12. In this case, there is a concern that the flexible TFT substrate 12 may be deflected and accordingly the pixels 30 formed on the TFT substrate 12 may be damaged. Before the support body 200 is peeled off from the TFT substrate 12, the first reinforcing substrate 40 is laminated on the conversion layer 14 in the form exemplified in FIGS. 18 to 38B. Accordingly, it is possible to suppress the deflection of the TFT substrate 12 that occurs when the support body is peeled off from the TFT substrate 12 and it is possible to reduce the risk of damage to the pixels 30.

Figure 39:
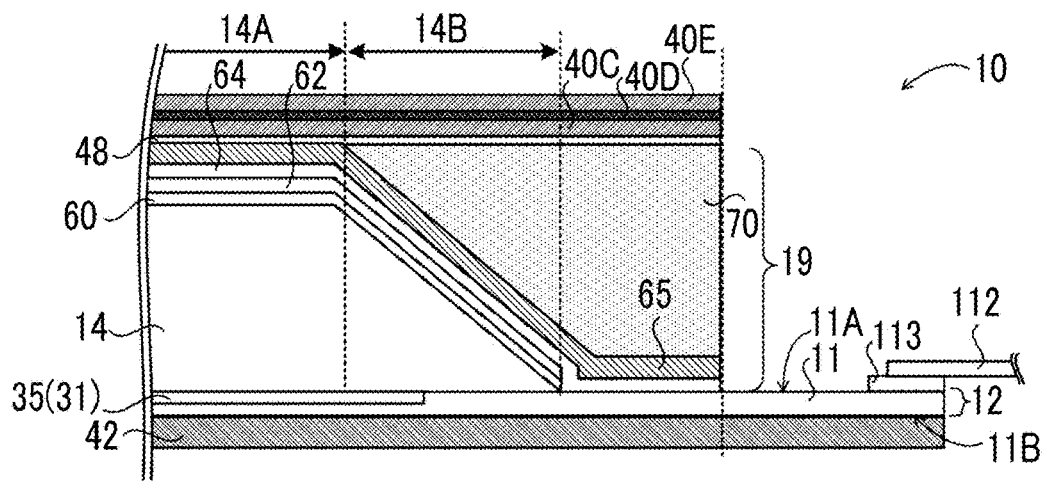
FIG. 39 is a cross-sectional view illustrating an example of a configuration of a radiation detector according to an embodiment of the disclosed technique.

Additionally, the first reinforcing substrate 40 is not limited to a single layer and may be constituted of multiple layers. For example, the example illustrated in FIG. 39 shows a form in which the radiation detector 10 has a three-layer multilayer film in which first reinforcing substrates 40, that is, a first-first reinforcing substrate 40C, a second-first reinforcing substrate 40D, and a third-first reinforcing substrate 40E are laminated in this order from the one closest to the conversion layer 14.

In a case where the first reinforcing substrate 40 has multiple layers, it is preferable that respective layers included in the first reinforcing substrate 40 have different functions. For example, in the example illustrated in FIG. 39, the first reinforcing substrates 40 may be made have an electromagnetic shielding function by using the first-first reinforcing substrate 40C and the third-first reinforcing substrate 40E as layers having a non-conductive antistatic function and using the second-first reinforcing substrate 40D as a conductive layer. Examples of the first-first reinforcing substrate 40C and the third-first reinforcing substrate 40E in this case include an antistatic film such as a film using antistatic paint "Colcoat" (product name: manufactured by Colcoat Co., Ltd.). Additionally, examples of the second-first reinforcing substrate 40D include a conductive sheet, a conductive mesh sheet such as Cu, and the like.

Figure 56:
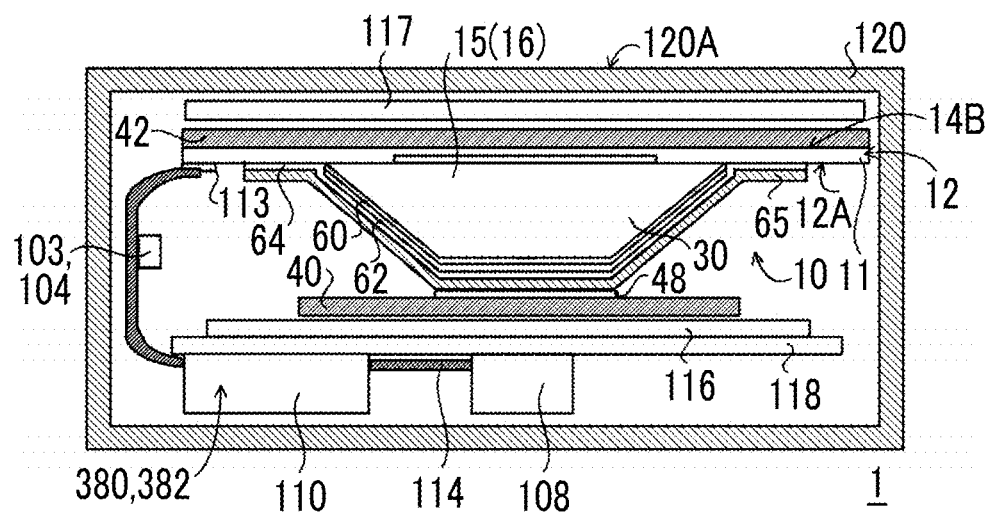
FIG. 56 is a cross-sectional view illustrating an example of a configuration of a radiographic imaging apparatus according to an embodiment of the disclosed technique.
Figure 57:
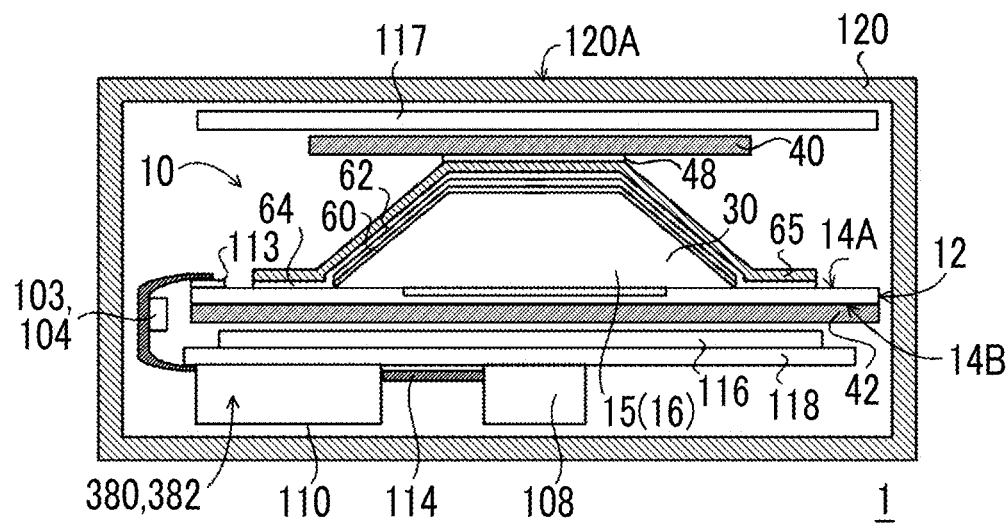
FIG. 57 is a cross-sectional view illustrating an example of a configuration of a radiographic imaging apparatus according to an embodiment of the disclosed technique.

For example, in a case where the reading type of the radiation detector 10 is the ISS type, there is a case where the control board 110, the power source unit 108, and the like may be provided on the conversion layer 14 side (refer to FIG. 56). However, in a case where the first reinforcing substrate 40 has the antistatic function in this way, the electromagnetic noise from the control board 110 and the power source unit 108 can be shielded.

Figure 40:
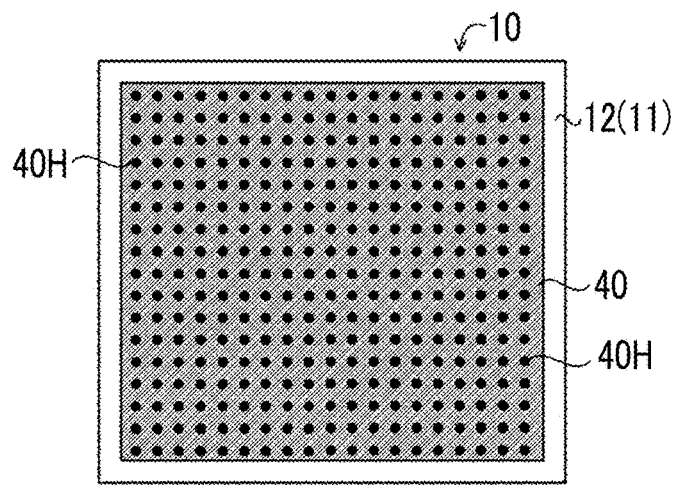
FIG. 40 is a plan view illustrating an example of the structure of a first reinforcing substrate according to the embodiment of the disclosed technique.

Additionally, FIG. 40 is a plan view illustrating an example of the structure of the first reinforcing substrate 40. The first reinforcing substrate 40 may have a plurality of through-holes 40H on a main surface thereof. The size and pitch of the through-holes 40H are determined so that a desired stiffness can be obtained in the first reinforcing substrate 40.

As the first reinforcing substrate 40 has the plurality of through-holes 40H, the air introduced into a joining surface between the first reinforcing substrate 40 and the conversion layer 14 can be discharged from the through-holes 40H. Accordingly, it is possible to suppress the generation of air bubbles on the joining surface between the first reinforcing substrate 40 and the conversion layer 14.

In a case where means for discharging the air introduced into the joining surface between the first reinforcing substrate 40 and the conversion layer 14 is not present, there is a concern that air bubbles may be generated on the joining surface. For example, when the air bubbles generated on the joining surface expand due to the heat generated during the operation of the radiographic imaging apparatus 1, the adhesiveness between the first reinforcing substrate 40 and the conversion layer 14 decreases. Accordingly, there is a concern that the deflection suppressing effect of the first reinforcing substrate 40 may not be sufficiently exhibited. As illustrated in FIG. 40, by using the first reinforcing substrate 40 having the plurality of through-holes 40H, the generation of air bubbles on the joining surface between the first reinforcing substrate 40 and the conversion layer 14 can be suppressed as described above. For that reason, it is possible to maintain the adhesiveness between the first reinforcing substrate 40 and the conversion layer 14, and it is possible to maintain the deflection suppressing effect of the first reinforcing substrate 40.

Figure 41:
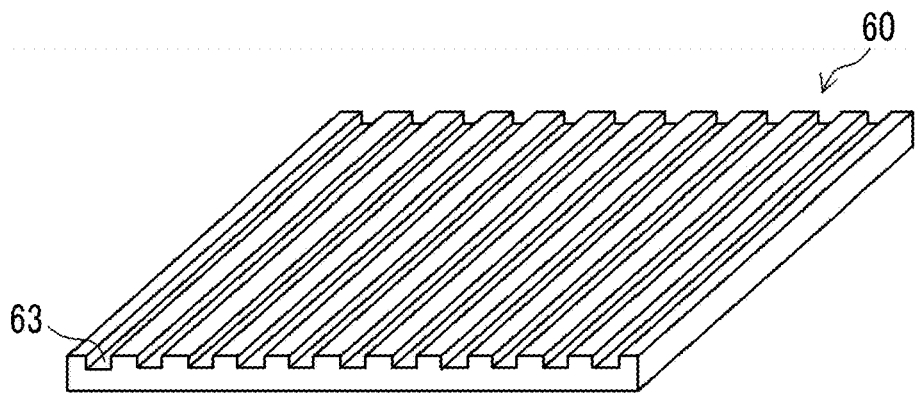
FIG. 41 is a perspective view illustrating an example of the structure of the first reinforcing substrate according to the embodiment of the disclosed technique.
Figure 42:
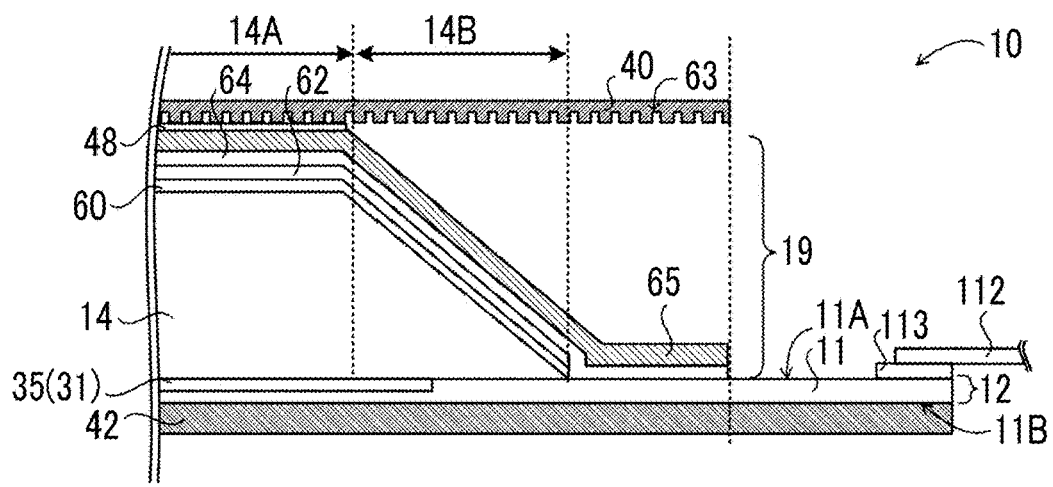
FIG. 42 is a cross-sectional view illustrating an example of a configuration of a radiation detector according to an embodiment of the disclosed technique.

FIG. 41 is a perspective view illustrating another example of the structure of the first reinforcing substrate 40. In the example illustrated in FIG. 41, the first reinforcing substrate 40 has an irregular structure on the joining surface with the conversion layer 14. As illustrated in FIG. 41, this irregular structure may be configured to include a plurality of grooves 63 disposed parallel to each other. In the first reinforcing substrate 40, for example, as illustrated in FIG. 42, a surface having the irregular structure formed by the plurality of grooves 63 is joined to the conversion layer 14 covered with the reflective layer 62. In this way, as the first reinforcing substrate 40 has the irregular structure on the joining surface with the conversion layer 14, the air introduced into a joining part between the first reinforcing substrate 40 and the conversion layer 14 can be discharged from the groove 63. Accordingly, similar to the form illustrated in FIG. 40, it is possible to suppress the generation of air bubbles on the joining surface between the first reinforcing substrate 40 and the conversion layer 14. Accordingly, it is possible to maintain the adhesiveness between the first reinforcing substrate 40 and the conversion layer 14, and it is possible to maintain the deflection suppressing effect of the first reinforcing substrate 40.

Figure 43:
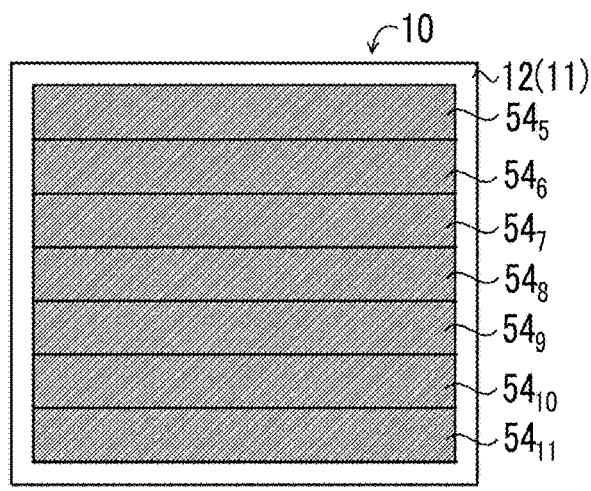
FIG. 43 is a plan view illustrating an example of the structure of the first reinforcing substrate according to the embodiment of the disclosed technique.
Figure 44:
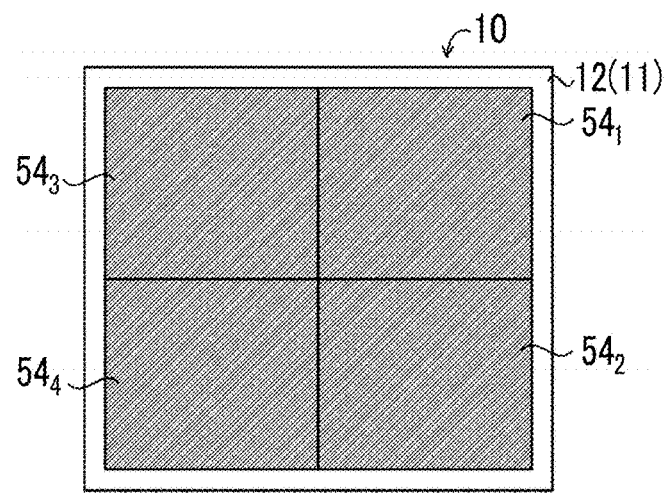
FIG. 44 is a plan view illustrating an example of the structure of the first reinforcing substrate according to the embodiment of the disclosed technique.

FIGS. 43 and 44 are plan views illustrating other examples of the structure of the first reinforcing substrate 40, respectively. As illustrated in FIGS. 43 and 44, the first reinforcing substrate 40 may be divided into a plurality of fragments 54. As illustrated in FIG. 43, the first reinforcing substrate 40 may be divided into the plurality of fragments 54 ($54_5$ to $54_{11}$) so as to be arranged in one direction. Additionally, as illustrated in FIG. 44, the first reinforcing substrate 40 may be divided such that the plurality of fragments 54 ($55_1$ to $54_4$) are arranged in the longitudinal direction and the transverse direction.

As the area of the first reinforcing substrate 40 is larger, air bubbles are more easily generated on the joining surface between the first reinforcing substrate 40 and the conversion layer 14. As illustrated in FIGS. 43 and 44, by dividing the first reinforcing substrate 40 into the plurality of fragments 54, it is possible to suppress the generation of air bubbles on the joining surface between the first reinforcing substrate 40 and the conversion layer 14. Accordingly, it is possible to maintain the adhesiveness between the first reinforcing substrate 40 and the conversion layer 14, and it is possible to maintain the deflection suppressing effect of the first reinforcing substrate 40.

Additionally, a reinforcing member 52 may be provided on the side of the second reinforcing substrate 42 opposite to the side in contact with the TFT substrate 12 (second surface 11B). FIGS. 45 to 50 are cross-sectional views illustrating examples of the installation form of the reinforcing member 52, respectively.

In the examples illustrated in FIGS. 45 to 49, the reinforcing member 52 is laminated on the surface of the second reinforcing substrate 42 opposite to the surface thereof on the TFT substrate 12 side via the adhesive layer 51. The reinforcing member 52 may be made of the same material as the first reinforcing substrate 40. In a case where the radiation detector 10 is used as the ISS type, the reinforcing member 52 is preferably provided only at the outer peripheral part of the TFT substrate 12 in order to make the area of a portion where the reinforcing member 52 and the pixel region 35 overlap each other as small as possible. That is, as illustrated in FIGS. 45 to 49, the reinforcing member 52 may have an annular shape having an opening 61 in a portion corresponding to the pixel region 35. In this way, by forming a laminated structure with the second reinforcing substrate 42 and the reinforcing member 52 at the outer peripheral part of the TFT substrate 12, the stiffness of the outer peripheral part of the TFT substrate 12 that is relatively easily deflected can be reinforced.

Figure 45:
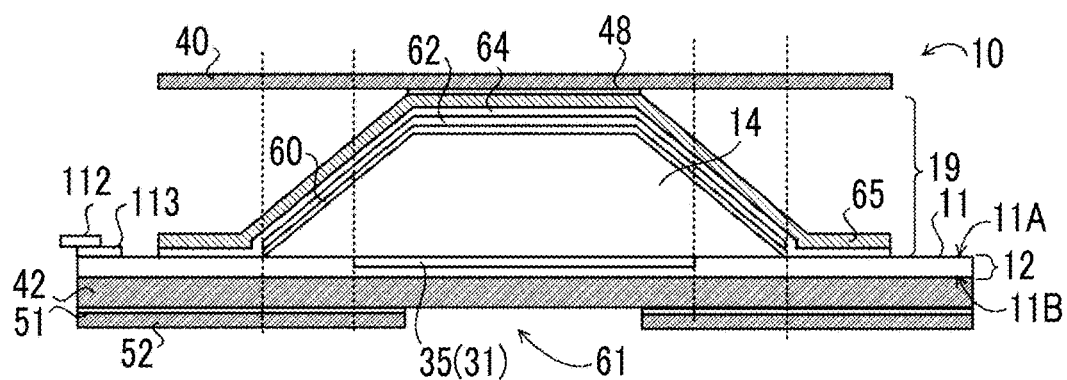
FIG. 45 is a cross-sectional view illustrating an example of a configuration of a radiation detector according to an embodiment of the disclosed technique.
Figure 46:
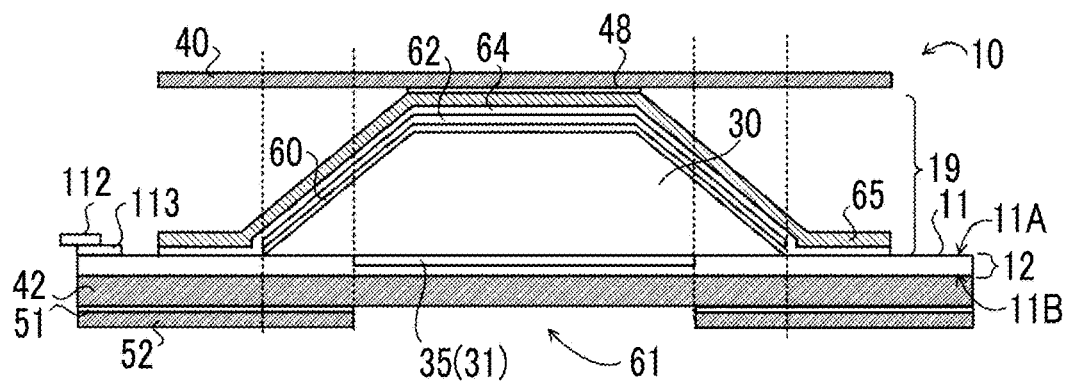
FIG. 46 is a cross-sectional view illustrating an example of a configuration of a radiation detector according to an embodiment of the disclosed technique.
Figure 47:
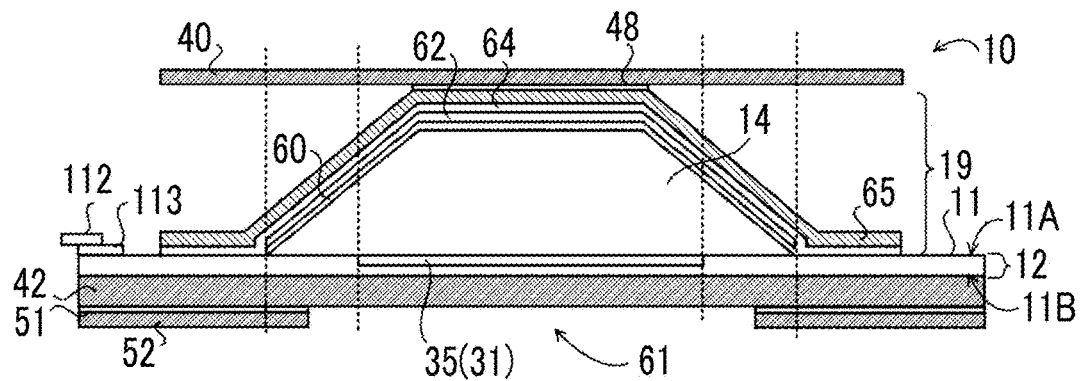
FIG. 47 is a cross-sectional view illustrating an example of a configuration of a radiation detector according to an embodiment of the disclosed technique.

In the examples illustrated in FIGS. 45 to 47, the reinforcing member 52 is provided in the region straddling the end part (outer edge, edge) of the conversion layer 14. In the radiation detector 10, the amount of deflection of the TFT substrate 12 is relatively large at the end part of the conversion layer 14. The effect of suppressing the deflection of the TFT substrate 12 at the end part of the conversion layer 14 can be promoted by forming a laminated structure with the second reinforcing substrate 42 and the reinforcing member 52 in the region corresponding to the end part of the conversion layer 14.

In a case where the radiation detector 10 is used as the ISS type, and as illustrated in FIG. 45, in a case where a part of the reinforcing member 52 overlaps the pixel region 35, there is a concern that an image may be affected depending on the material of the reinforcing member 52. Therefore, in a case where a part of the reinforcing member 52 overlaps the pixel region 35, it is preferable to use plastic as the material of the reinforcing member 52.

As illustrated in FIGS. 46 and 47, a form in which the reinforcing member 52 straddles the end part (outer edge, edge) of the conversion layer 14 and does not overlap the pixel region 35 (that is, a form in which the end part of the opening 61 of the reinforcing member 52 is disposed outside the pixel region 35) is most preferable. In the example illustrated in FIG. 46, the position of the end part of the opening 61 of the reinforcing member 52 and the position of the end part of the pixel region 35 substantially coincide with each other. In the example illustrated in FIG. 47, the end part of the opening 61 of the reinforcing member 52 is disposed between the end part of the pixel region 35 and the end part of the conversion layer 14.

Figure 48:
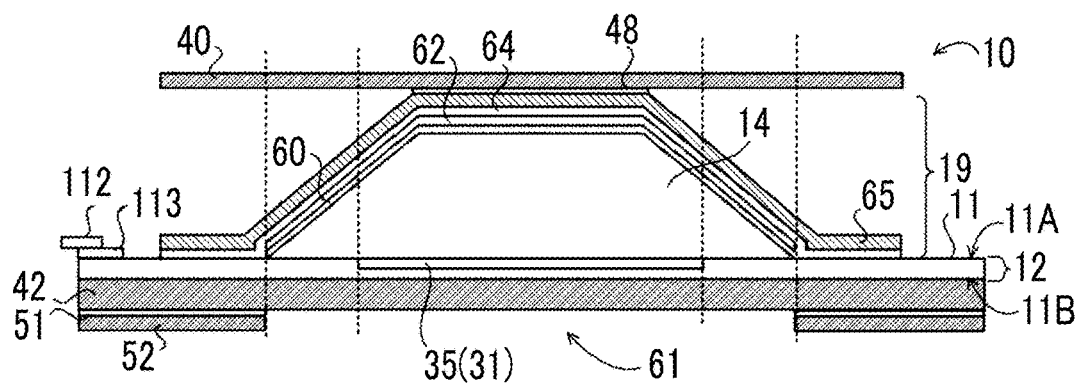
FIG. 48 is a cross-sectional view illustrating an example of a configuration of a radiation detector according to an embodiment of the disclosed technique.
Figure 49:
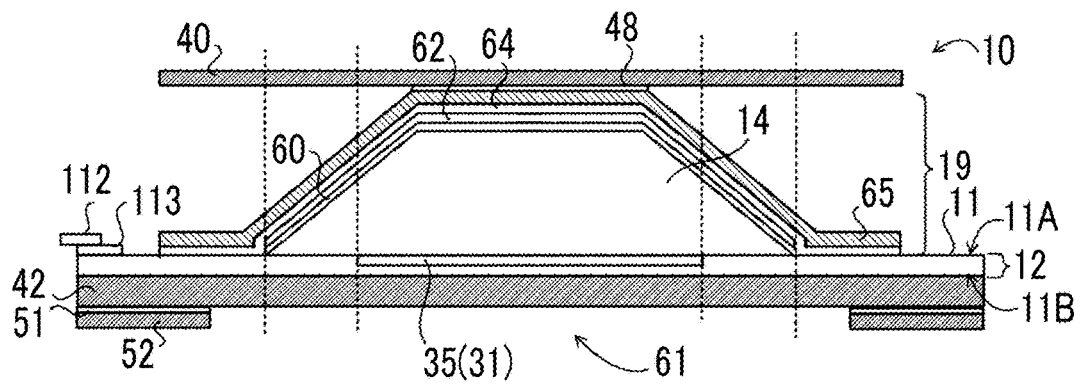
FIG. 49 is a cross-sectional view illustrating an example of a configuration of a radiation detector according to an embodiment of the disclosed technique.

Additionally, the position of the end part of the opening 61 of the reinforcing member 52 may substantially coincide with the position of the end part of the conversion layer 14 as illustrated in FIG. 48, and the conversion layer may be disposed outside the end part of the position of the end part of the conversion layer 14 as illustrated in FIG. 49. In this case, since the reinforcing member 52 does not have a structure that straddles the end part (outer edge, edge) of the conversion layer 14, there is a concern that the effect of suppressing the deflection of the TFT substrate 12 at the end part of the conversion layer 14 may decrease. However, a laminated structure of the second reinforcing substrate 42 and the reinforcing member 52 is formed at the outer peripheral part of the TFT substrate 12 where the connection part between the flexible cable 112 and the terminal 113 is present. Accordingly, the effect of suppressing the deflection of the TFT substrate 12 at the connection part between the flexible cable 112 and the terminal 113 is maintained.

Figure 50:
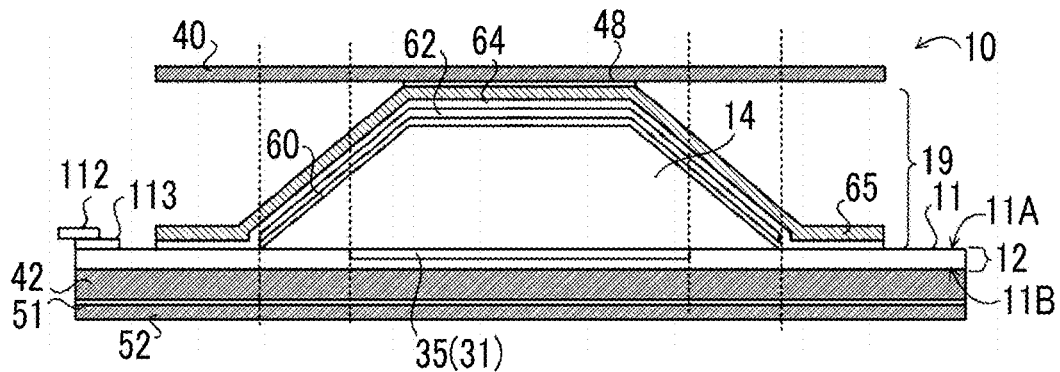
FIG. 50 is a cross-sectional view illustrating an example of a configuration of a radiation detector according to an embodiment of the disclosed technique.

In addition, in a case where the material of the reinforcing base material 52 is a material such as carbon that absorbs less radiation, it is possible to suppress that the radiation R reaching the conversion layer 14 decreases because the radiation R is absorbed by the first reinforcing substrate 40B in any of the PSS type and the ISS type. For that reason, as illustrated in FIG. 50, the reinforcing base material 52 may have a shape that does not have the opening 61. In other words, the reinforcing base material 52 may cover at least a part of the pixel region 35. In addition, the reinforcing base material 52 illustrated in FIG. 50 is provided over the entire surface of the second reinforcing substrate 42. The bending modulus of elasticity of the reinforcing base material 52 is preferably larger than the bending modulus of elasticity of each of the first reinforcing substrate 40 and the second reinforcing substrate 42. A preferable specific example of the bending modulus of elasticity of the reinforcing base material 52 is 8,000 MPa or more.

Moreover, an example of the radiographic imaging apparatus 1 in which the radiation detector 10 is housed in the housing 120 will be described with reference to FIGS. 51 to 57. FIGS. 51 to 57 are views illustrating other configuration examples of the radiographic imaging apparatus 1, respectively.

Figure 51:
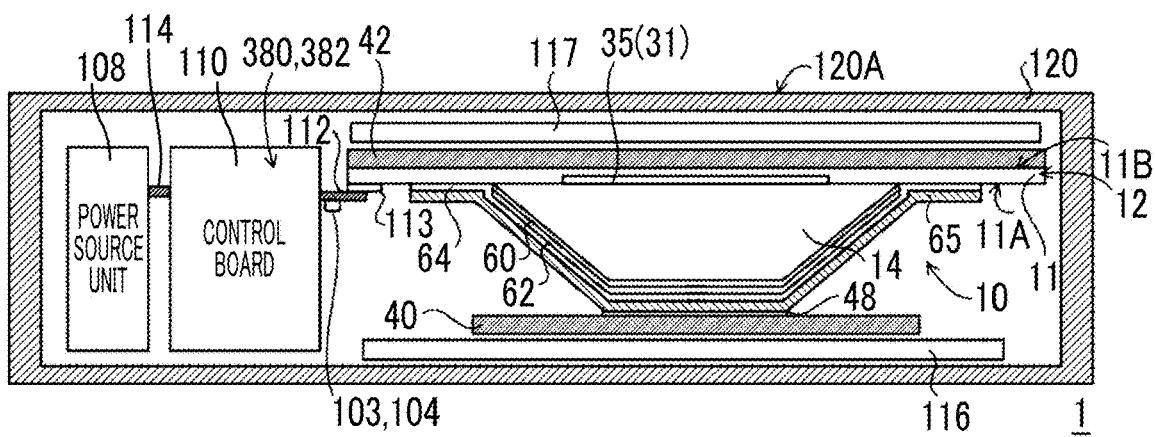
FIG. 51 is a cross-sectional view illustrating an example of a configuration of a radiographic imaging apparatus according to an embodiment of the disclosed technique.

In the example illustrated in FIG. 51, an example of the ISS type radiographic imaging apparatus 1 is illustrated similarly to the radiographic imaging apparatus 1 illustrated in FIG. 7. Additionally, in the example illustrated in FIG. 52, an example of the PSS type radiographic imaging apparatus 1 is illustrated. In the examples illustrated in FIGS. 51 and 52, a configuration in which the radiation detector 10, the control board 110, and the power source unit 108 are disposed side by side in the transverse direction in the figure is exemplified.

Figure 52:
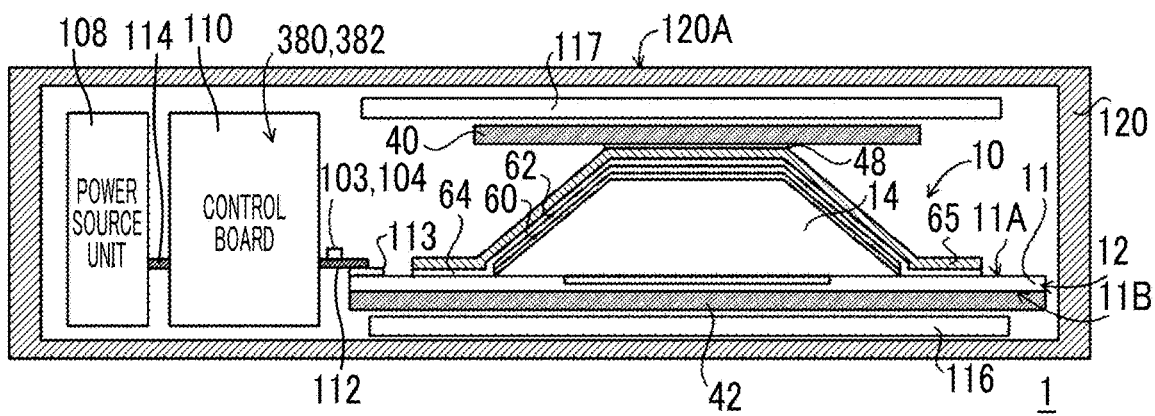
FIG. 52 is a cross-sectional view illustrating an example of a configuration of a radiographic imaging apparatus according to an embodiment of the disclosed technique.
Figure 53:
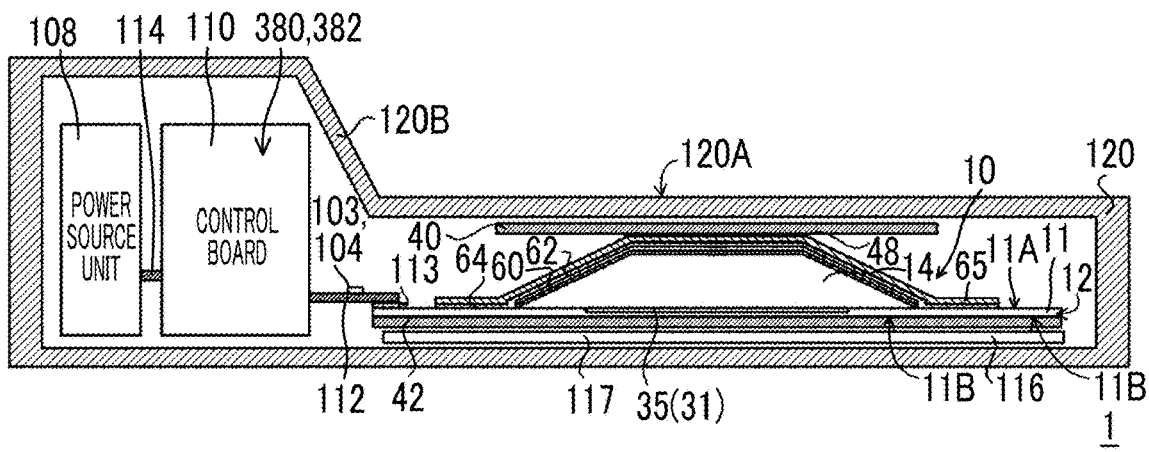
FIG. 53 is a cross-sectional view illustrating an example of a configuration of a radiographic imaging apparatus according to an embodiment of the disclosed technique.
Figure 54:
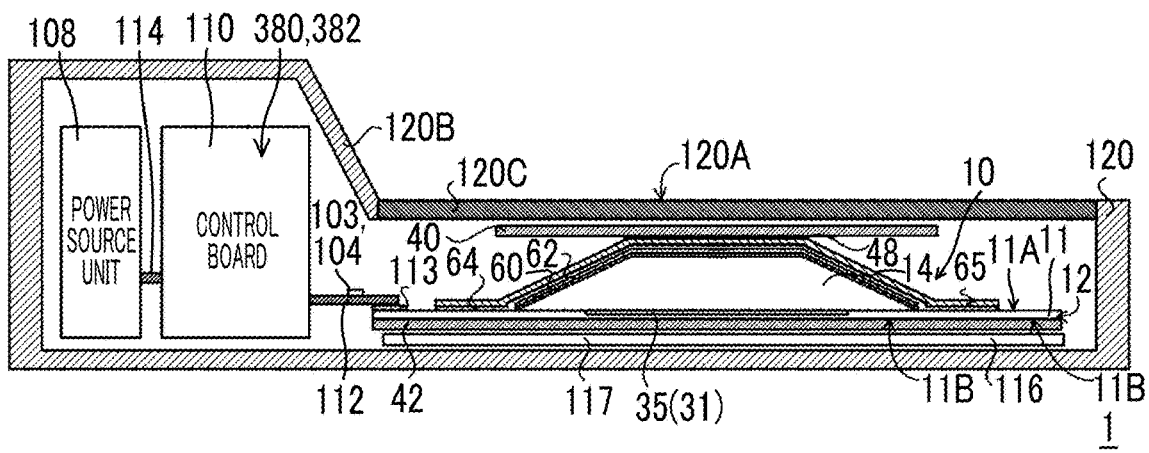
FIG. 54 is a cross-sectional view illustrating an example of a configuration of a radiographic imaging apparatus according to an embodiment of the disclosed technique.

Additionally, in the examples illustrated in FIGS. 51 and 52, the protective layer 117 is further provided between the radiation detector 10 and an inner wall of the imaging surface 120A of the housing 120. In other words, the protective layer 117 is further provided on the imaging surface 120A side on which the radiation R is incident. As the protective layer 117, moistureproof films, such as an ALPET (registered trademark) sheet obtained, a Parylene (registered trademark) film, and an insulating sheet (film), such as polyethylene terephthalate, can be applied. The protective layer 117 has a moistureproof function and an antistatic function with respect to the pixel region 35. For that reason, it is preferable that the protective layer 117 covers at least the entire surface of the pixel region 35 on the side on which radiation is incident, and it is preferable to cover the entire surface of the TFT substrate 12 on the side on which radiation R is incident.

In addition, although FIGS. 51 and 52 illustrate a form in which both the power source unit 108 and the control board 110 are provided on one side of the radiation detector 10, specifically, on one side of a rectangular pixel region 35, a position where the power source unit 108 and the control board 110 are provided is not limited to the form illustrated in FIGS. 51 and 52. For example, the power source unit 108 and the control board 110 may be provided so as to be respectively distributed onto two facing sides of the pixel region 35 or may be provided so as to be respectively distributed onto two adjacent sides.

Additionally, as in the examples illustrated in FIGS. 51 and 52, in a case where the radiation detector 10, the control board 110, and the power source unit 108 are disposed side by side in a direction intersecting the direction in which the TFT substrate 12 and the conversion layer 14 are laminated (lamination direction P), the thickness of the housing 120 may be different between the portion of the housing 120 in which each of the power source unit 108 and the control board 110 is provided and the portion of the housing 120 in which the radiation detector 10 is provided.

As illustrated in the example illustrated in FIG. 52, there are many cases where each of the power source unit 108 and the control board 110 is thicker than the radiation detector 10. In such a case, as in the example illustrated in FIG. 53, the thickness of the portion of the housing 120 in which the radiation detector 10 is provided may be smaller than the thickness of the portion of the housing 120 in which each of the power source unit 108 and the control board 110 is provided. In addition, in a case where the thickness of the portion of the housing 120 where the power source unit 108 and the control board 110 are provided is different from the thickness of the portion of the housing 120 where the radiation detector 10 is provided, when a level difference is caused at a boundary part is between the two portions is different, there is a concern that a subject who comes in contact with the boundary part 120B may feel uncomfortable. For that reason, in such a case, it is preferable that the form of the boundary part 120B has an inclination.

Accordingly, it is possible to construct an ultra-thin portable electronic cassette according to the thickness of the radiation detector 10.

Additionally, for example, in this case, the materials of the housing 120 may be different in the portion of the housing 120 in which each of the power source unit 108 and the control board 110 is provided and the portion of the housing 120 in which the radiation detector 10 is provided. Moreover, for example, the portion of the housing 120 in which each of the power source unit 108 and the control board 110 is provided and the portion of the housing 120 in which the radiation detector 10 is provided may be separated configured.

Additionally, as described above, the housing 120 is preferably made of a material having a low absorbance of radiation R, particularly X-rays and a high stiffness and is preferably made of a material having a sufficiently high modulus of elasticity. However, as in the example illustrated in FIG. 54, a portion 120C corresponding to the imaging surface 120A of the housing 120 may be made of a material having a low absorbance of the radiation R, a high stiffness, and a sufficiently high modulus of elasticity, and the other portions may be made of a material different from the portion 120C, for example, a material having a lower modulus of elasticity than the portion 120C.

Figure 55:
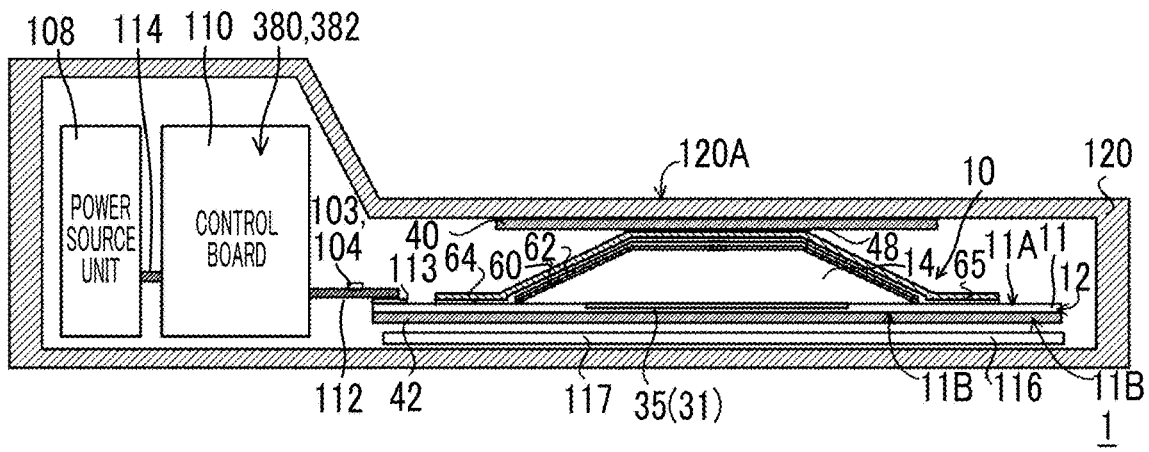
FIG. 55 is a cross-sectional view illustrating an example of the configuration of a radiographic imaging apparatus according to an embodiment of the disclosed technique.

Additionally, as in the example illustrated in FIG. 55, the radiation detector 10 and the inner wall surface of the housing 120 may be in contact with each other. In this case, the radiation detector 10 and the inner wall surface of the housing 120 may be adhered to each other via an adhesive layer, or may simply be in contact with each other without an adhesive layer. Since the radiation detector 10 and the inner wall surface of the housing 120 are in contact with each other in this way, the stiffness of the radiation detector 10 is further secured.

Additionally, in the example illustrated in FIG. 56, an example of the ISS type radiographic imaging apparatus 1 is illustrated similarly to the radiographic imaging apparatus 1 illustrated in FIG. 8. Additionally, in the example illustrated in FIG. 57, an example of the PSS type radiographic imaging apparatus 1 is illustrated. In the examples illustrated in FIGS. 56 and 57, the TFT substrate 12, the control board 110, and the power source unit 108 are provided with the sheet 116 and the base 118 interposed therebetween. According to this configuration, the size of the radiographic imaging apparatus 1 in a plan view can be reduced as compared to a case where the radiation detector 10, the control board 110, and the power source unit 108 are disposed side by side in the transverse direction in the figure (refer to FIGS. 51 to 55).

In addition, it goes without saying that the configurations, manufacturing methods, and the like of the radiation detectors 10 that are described in the above respective embodiments are merely examples, and can be changed in response to situations without departing from the scope of the present invention.

The disclosure of Japanese Patent Application No. 2018-219700 filed on Nov. 22, 2018 and the disclosure of Japanese Patent Application No. 2019-022127 filed on Feb. 8, 2019 are incorporated into the present specification in their entirety by reference.

All documents, patent applications, and technical standards described in the present specification are incorporated in the present specification by reference in their entireties to the same extent as in a case where the individual documents, patent applications, and technical standards are specifically and individually written to be incorporated by reference.

Explanation of References

What is claimed is:

1. A radiation detector comprising:
a substrate in which a plurality of pixels that accumulate electric charges generated in response to light converted from radiation are formed in a pixel region of a first surface of a flexible base material and a terminal region of the first surface is provided with a terminal for electrically connecting a cable;
a conversion layer that is provided outside the terminal region on the first surface of the base material to convert the radiation into light;
a first reinforcing substrate that is provided on a surface of the conversion layer opposite to a surface on a substrate side and has a higher stiffness than the base material; and
a second reinforcing substrate that is provided on a second surface of the base material opposite to the first surface to cover a surface larger than the first reinforcing substrate,
wherein the terminal region includes a first region covered with the first reinforcing substrate and a second region not covered with the first reinforcing substrate.

2. The radiation detector according to claim 1,
wherein the first region is smaller than the second region.

3. The radiation detector according to claim 1,
wherein a length from one end part on an inner side of the base material to the other end part on an outer edge side of the base material in the first region is ¼ or less of a length from one end part on the inner edge side of the base material to the other end part on the outer edge side of the base material in the terminal region.

4. The radiation detector according to claim 1,
wherein the second reinforcing substrate has a higher stiffness than the base material.

5. The radiation detector according to claim 1,
wherein at least one of the first reinforcing substrate or the second reinforcing substrate is a reinforcing substrate using a material having a bending modulus of elasticity of 1,000 MPa or more and 2,500 MPa or less.

6. The radiation detector according to claim 1,
wherein at least one of the first reinforcing substrate or the second reinforcing substrate contains a material having a yield point.

7. The radiation detector according to claim 6,
wherein the material having the yield point is at least one of polycarbonate or polyethylene terephthalate.

8. The radiation detector according to claim 1,
wherein a ratio of a coefficient of thermal expansion of the first reinforcing substrate to a coefficient of thermal expansion of the conversion layer is 0.5 or more and 2 or less.

9. The radiation detector according to claim 1,
wherein the first reinforcing substrate has a coefficient of thermal expansion of 30 ppm/K or more and 80 ppm/K or less.

10. The radiation detector according to claim 1,
wherein a size of the second surface of the base material is larger than a size of a surface of the second reinforcing substrate facing the second surface.

11. The radiation detector according to claim 1,
wherein the second reinforcing substrate has a plurality of layers laminated in a lamination direction to be laminated on the substrate, and a size of some of the plurality of layers is larger than a size of the second surface.

12. The radiation detector according to claim 1,
wherein a size of the second surface of the base material is smaller than a size of a surface of the second reinforcing substrate facing the second surface.

13. The radiation detector according to claim 1,
wherein at least a part of an end part of the base material is located outside an end part of the second reinforcing substrate.

14. The radiation detector according to claim 1, further comprising:
a buffer layer that is provided between the substrate and the conversion layer and buffers a difference between a coefficient of thermal expansion of the conversion layer and a coefficient of thermal expansion of the substrate.

15. The radiation detector according claim 1,
wherein the base material satisfies at least one of a heat shrinkage percentage of 0.5% or less at 400° C. or a modulus of elasticity of 1 GPa or more at 500° C. at a thickness of 25 µm.

16. A radiographic imaging apparatus comprising: the radiation detector according to claim 1; a driver that outputs a control signal for reading out the electric charges accumulated in the plurality of pixels; and a circuit that is electrically connected to the radiation detector by the cable to read out the electric charges from the plurality of pixels in response to the control signal.

17. The radiographic imaging apparatus according to claim 16, further comprising:
a housing that has an irradiation surface to be irradiated with radiation and houses the radiation detector in a state where the substrate among the substrate and the conversion layer in the radiation detector faces the irradiation surface.

18. A method of manufacturing a radiographic imaging apparatus, the method comprising:
providing a flexible base material on a support body and forming a substrate in which a plurality of pixels that accumulate electric charges generated in response to light converted from radiation are provided in a pixel region of a first surface of the base material;
forming a conversion layer that converts the radiation into light, outside a terminal region of the first surface of the base material;
providing a first reinforcing substrate having a higher stiffness than the base material on a surface of the conversion layer opposite to a surface facing a substrate side;
peeling off the substrate provided with the conversion layer and the first reinforcing substrate from the support body; and
providing a second reinforcing substrate covering a surface larger than the first reinforcing substrate on a second surface of the substrate peeled off from the support body opposite to the first surface of the base material,
wherein the terminal region includes a first region covered with the first reinforcing substrate and a second region not covered with the first reinforcing substrate.

19. A radiation detector comprising:
a substrate in which a plurality of pixels that accumulate electric charges generated in response to light converted from radiation are formed in a pixel region of a first surface of a flexible base material and a terminal region of the first surface is provided with a terminal for electrically connecting a cable;
a conversion layer that is provided outside the terminal region on the first surface of the base material to convert the radiation into light;
a first reinforcing substrate that is provided on a surface of the conversion layer opposite to a surface on a substrate side and has a higher stiffness than the base material; and
a second reinforcing substrate that is provided on a second surface of the base material opposite to the first surface to cover a surface larger than the first reinforcing substrate,
wherein the first reinforcing substrate is provided with a cutout part at a position corresponding to the terminal region.

20. A radiographic imaging apparatus comprising: the radiation detector according to claim 19; a driver that outputs a control signal for reading out the electric charges accumulated in the plurality of pixels; and a circuit that is electrically connected to the radiation detector by the cable to read out the electric charges from the plurality of pixels in response to the control signal.

21. A method of manufacturing a radiographic imaging apparatus, the method comprising:
providing a flexible base material on a support body and forming a substrate in which a plurality of pixels that accumulate electric charges generated in response to light converted from radiation are provided in a pixel region of a first surface of the base material;
forming a conversion layer that converts the radiation into light, outside a terminal region of the first surface of the base material;
providing a first reinforcing substrate having a higher stiffness than the base material on a surface of the conversion layer opposite to a surface facing a substrate side;
peeling off the substrate provided with the conversion layer and the first reinforcing substrate from the support body; and
providing a second reinforcing substrate covering a surface larger than the first reinforcing substrate on a second surface of the substrate peeled off from the support body opposite to the first surface of the base material,
wherein the first reinforcing substrate is provided with a cutout part at a position corresponding to the terminal region.

* * * * *